US010120020B2

(12) United States Patent
Salmon et al.

(10) Patent No.: US 10,120,020 B2
(45) Date of Patent: Nov. 6, 2018

(54) PROBE HEAD ASSEMBLIES AND PROBE SYSTEMS FOR TESTING INTEGRATED CIRCUIT DEVICES

(71) Applicant: Cascade Microtech, Inc., Beaverton, OR (US)

(72) Inventors: Jay Salmon, Portland, OR (US); Roy E. Swart, Hillsboro, OR (US); Brandon Liew, Beaverton, OR (US)

(73) Assignee: FormFactor Beaverton, Inc., Beaverton, OR (US)

( * ) Notice: Subject to any disclaimer, the term of this patent is extended or adjusted under 35 U.S.C. 154(b) by 160 days.

(21) Appl. No.: 15/184,374

(22) Filed: Jun. 16, 2016

(65) Prior Publication Data

US 2017/0363681 A1   Dec. 21, 2017

(51) Int. Cl.
*G01R 31/28* (2006.01)
*G01R 1/073* (2006.01)

(52) U.S. Cl.
CPC ..... *G01R 31/2887* (2013.01); *G01R 1/07378* (2013.01)

(58) Field of Classification Search
None
See application file for complete search history.

(56) References Cited

U.S. PATENT DOCUMENTS

| | | | |
|---|---|---|---|
| 3,963,986 A | 6/1976 | Morton et al. |
| 4,932,883 A | 6/1990 | Hsia et al. |
| 5,541,567 A | 7/1996 | Fogel et al. |
| 5,635,846 A | 6/1997 | Beaman et al. |
| 5,806,181 A | 9/1998 | Khandros et al. |
| 5,821,763 A | 10/1998 | Beaman et al. |
| 5,898,991 A | 5/1999 | Fogel et al. |
| 5,974,662 A | 11/1999 | Eldridge et al. |
| 6,050,829 A | 4/2000 | Eldridge et al. |
| 6,183,897 B1 | 2/2001 | Hartvigsen et al. |
| 6,206,273 B1 | 3/2001 | Beaman et al. |
| 6,246,247 B1 | 6/2001 | Eldridge et al. |
| 6,274,823 B1 | 8/2001 | Khandros et al. |
| 6,292,003 B1 | 9/2001 | Fredrickson et al. |
| 6,300,780 B1 | 10/2001 | Beaman et al. |

(Continued)

FOREIGN PATENT DOCUMENTS

EP   1198001 A2   4/2002

*Primary Examiner* — Paresh Patel
(74) *Attorney, Agent, or Firm* — Dascenzo Intellectual Property Law, P.C.

(57) ABSTRACT

Probe head assemblies and probe systems for testing integrated circuit devices are disclosed herein. In one embodiment, the probe head assemblies include a contacting structure and a space transformer assembly. In another embodiment, the probe head assemblies include a contacting structure, a suspension system, a flex cable interface, and a space transformer including a space transformer body and a flex cable assembly. In another embodiment, the probe head assemblies include a contacting structure, a space transformer, and a planarization layer. In another embodiment, the probe head assemblies include a contacting structure, a space transformer, a suspension system, a platen, a printed circuit board, a first plurality of signal conductors configured to convey a first plurality of signals external to the space transformer, and a second plurality of signal conductors configured to convey a second plurality of signals via the space transformer. The probe systems include the probe head assemblies.

20 Claims, 11 Drawing Sheets

(56) References Cited

U.S. PATENT DOCUMENTS

| | | |
|---|---|---|
| 6,334,247 B1 | 1/2002 | Beaman et al. |
| 6,420,887 B1 | 7/2002 | Kister et al. |
| 6,426,636 B1 | 7/2002 | Das et al. |
| 6,483,328 B1 | 11/2002 | Eldridge et al. |
| 6,523,255 B2 | 2/2003 | Shih et al. |
| 6,615,485 B2 | 9/2003 | Eldridge et al. |
| 6,624,648 B2 | 9/2003 | Eldridge et al. |
| 6,653,170 B1 | 11/2003 | Lin |
| 6,707,311 B2 | 3/2004 | Hohenwarter |
| 6,741,085 B1 | 5/2004 | Khandros et al. |
| 6,838,893 B2 | 1/2005 | Khandros, Jr. et al. |
| 6,937,037 B2 | 8/2005 | Eldridge et al. |
| 6,965,244 B2 | 11/2005 | Miller |
| 7,061,257 B2 | 6/2006 | Khandros et al. |
| 7,064,566 B2 | 6/2006 | Khandros et al. |
| 7,071,715 B2 | 7/2006 | Shinde et al. |
| 7,084,650 B2 | 8/2006 | Copper et al. |
| 7,086,149 B2 | 8/2006 | Eldridge et al. |
| 7,108,546 B2 | 9/2006 | Miller et al. |
| 7,180,318 B1 | 2/2007 | Mahoney et al. |
| 7,335,057 B2 | 2/2008 | Miller et al. |
| 7,347,702 B2 | 3/2008 | Eldridge et al. |
| 7,352,196 B2 | 4/2008 | Khandros et al. |
| 7,368,927 B2 | 5/2008 | Smith et al. |
| 7,456,640 B2 | 11/2008 | Breton et al. |
| 7,459,795 B2 | 12/2008 | Eldridge et al. |
| 7,473,102 B2 | 1/2009 | Colgan et al. |
| 7,474,113 B2 | 1/2009 | Jain |
| 7,514,944 B2 | 4/2009 | Smith et al. |
| 7,616,016 B2 | 11/2009 | Eldridge et al. |
| 7,692,436 B2 | 4/2010 | Garabedian et al. |
| 7,825,674 B2 | 11/2010 | Shinde et al. |
| 7,855,544 B1 | 12/2010 | Knauer |
| 7,884,006 B2 | 2/2011 | Eldridge et al. |
| 8,012,796 B2 | 9/2011 | Andry et al. |
| 8,232,818 B2 | 7/2012 | Desta et al. |
| 8,305,101 B2 | 11/2012 | Desta et al. |
| 8,310,259 B2 | 11/2012 | Hamel et al. |
| 8,373,428 B2 | 2/2013 | Eldridge et al. |
| 8,410,806 B2 | 4/2013 | Smith |
| 8,592,932 B2 | 11/2013 | Andry et al. |
| 8,901,950 B2 | 12/2014 | Desta et al. |
| 9,159,602 B2 | 10/2015 | Andry et al. |
| 9,159,616 B2 | 10/2015 | Hamel et al. |
| 9,316,685 B2 | 4/2016 | Ku et al. |
| 2002/0109514 A1 | 8/2002 | Brandorff et al. |
| 2007/0007980 A1 | 1/2007 | Miller et al. |
| 2007/0040565 A1 | 2/2007 | Jayabalan et al. |
| 2007/0057685 A1 | 3/2007 | Garabedian et al. |
| 2007/0075715 A1 | 4/2007 | Khandros et al. |
| 2007/0216432 A1 | 9/2007 | Kister |
| 2007/0229102 A1 | 10/2007 | Eldridge et al. |
| 2007/0232090 A1 | 10/2007 | Colgan et al. |
| 2007/0271781 A9 | 11/2007 | Beaman et al. |
| 2007/0296435 A1 | 12/2007 | Eldridge et al. |
| 2008/0047741 A1 | 2/2008 | Beaman et al. |
| 2008/0048690 A1 | 2/2008 | Beaman et al. |
| 2008/0048691 A1 | 2/2008 | Beaman et al. |
| 2008/0048697 A1 | 2/2008 | Beaman et al. |
| 2008/0100316 A1 | 5/2008 | Beaman et al. |
| 2008/0100317 A1 | 5/2008 | Beaman et al. |
| 2008/0100318 A1 | 5/2008 | Beaman et al. |
| 2008/0100324 A1 | 5/2008 | Beaman et al. |
| 2008/0106281 A1 | 5/2008 | Beaman et al. |
| 2008/0106282 A1 | 5/2008 | Beaman et al. |
| 2008/0106283 A1 | 5/2008 | Beaman et al. |
| 2008/0106284 A1 | 5/2008 | Beaman et al. |
| 2008/0106285 A1 | 5/2008 | Beaman et al. |
| 2008/0106291 A1 | 5/2008 | Beaman et al. |
| 2008/0106872 A1 | 5/2008 | Beaman et al. |
| 2008/0111568 A1 | 5/2008 | Beaman et al. |
| 2008/0111569 A1 | 5/2008 | Beaman et al. |
| 2008/0111570 A1 | 5/2008 | Beaman et al. |
| 2008/0112144 A1 | 5/2008 | Beaman et al. |
| 2008/0112145 A1 | 5/2008 | Beaman et al. |
| 2008/0112146 A1 | 5/2008 | Beaman et al. |
| 2008/0112147 A1 | 5/2008 | Beaman et al. |
| 2008/0112148 A1 | 5/2008 | Beaman et al. |
| 2008/0112149 A1 | 5/2008 | Beaman et al. |
| 2008/0116912 A1 | 5/2008 | Beaman et al. |
| 2008/0116913 A1 | 5/2008 | Beaman et al. |
| 2008/0116914 A1 | 5/2008 | Beaman et al. |
| 2008/0116915 A1 | 5/2008 | Beaman et al. |
| 2008/0116916 A1 | 5/2008 | Beaman et al. |
| 2008/0117611 A1 | 5/2008 | Beaman et al. |
| 2008/0117612 A1 | 5/2008 | Beaman et al. |
| 2008/0117613 A1 | 5/2008 | Beaman et al. |
| 2008/0121879 A1 | 5/2008 | Beaman et al. |
| 2008/0123310 A1 | 5/2008 | Beaman et al. |
| 2008/0129319 A1 | 6/2008 | Beaman et al. |
| 2008/0129320 A1 | 6/2008 | Beaman et al. |
| 2008/0132094 A1 | 6/2008 | Beaman et al. |
| 2008/0157795 A1 | 7/2008 | Smith et al. |
| 2008/0180121 A1 | 7/2008 | Khandros et al. |
| 2009/0128176 A1 | 5/2009 | Beaman et al. |
| 2009/0142707 A1 | 6/2009 | Eldridge et al. |
| 2009/0237099 A1 | 9/2009 | Garabedian et al. |
| 2009/0291573 A1 | 11/2009 | Eldridge et al. |
| 2009/0315579 A1 | 12/2009 | Beaman et al. |
| 2010/0045266 A1 | 2/2010 | Beaman et al. |
| 2010/0045317 A1 | 2/2010 | Beaman et al. |
| 2010/0045318 A1 | 2/2010 | Beaman et al. |
| 2010/0045320 A1 | 2/2010 | Beaman et al. |
| 2010/0045321 A1 | 2/2010 | Beaman et al. |
| 2010/0045324 A1 | 2/2010 | Beaman et al. |
| 2010/0052715 A1 | 3/2010 | Beaman et al. |
| 2010/0127725 A1 | 5/2010 | Smith |
| 2010/0176831 A1 | 7/2010 | Palcisko et al. |
| 2010/0219852 A1 | 9/2010 | Yamada et al. |
| 2010/0237887 A1 | 9/2010 | Desta et al. |
| 2010/0237888 A1 | 9/2010 | Desta et al. |
| 2010/0237889 A1 | 9/2010 | Desta et al. |
| 2010/0308854 A1 | 12/2010 | Garabedian et al. |
| 2012/0112779 A1 | 5/2012 | Smith et al. |
| 2012/0169367 A1 | 7/2012 | Kuo et al. |
| 2012/0249173 A1 | 10/2012 | Hamel et al. |
| 2012/0286817 A1 | 11/2012 | Duckworth et al. |
| 2013/0220513 A1 | 8/2013 | Smith |
| 2014/0176171 A1 | 6/2014 | Choi et al. |
| 2014/0232427 A1 | 8/2014 | Namburi et al. |
| 2016/0103153 A1 | 4/2016 | Duckworth et al. |

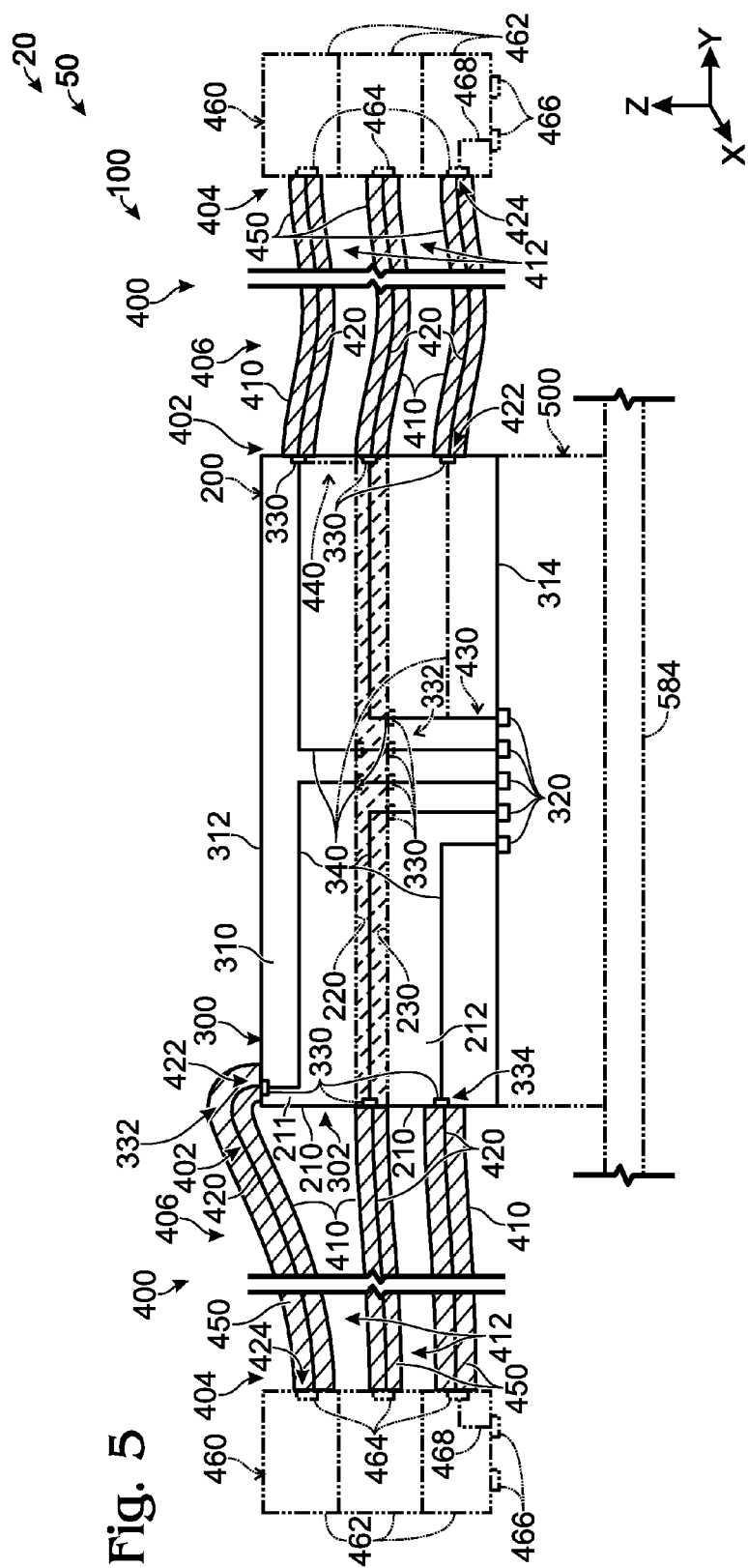

US 10,120,020 B2

PROBE HEAD ASSEMBLIES AND PROBE SYSTEMS FOR TESTING INTEGRATED CIRCUIT DEVICES

FIELD OF THE DISCLOSURE

The present disclosure relates to probe head assemblies and probe systems for testing integrated circuit devices.

BACKGROUND OF THE DISCLOSURE

Probe systems often are utilized to test the operation of a device under test (DUT). Probe systems generally include a signal generation and analysis assembly, which is configured to generate one or more test signals for the DUT and/or to receive one or more resultant signals from the DUT. Probe systems also include a plurality of signal circuits, and each of the signal circuits may convey a respective signal, such as a respective test signal or a respective resultant signal, between the DUT and the signal generation and analysis assembly.

The signal circuits include a variety of distinct components that utilize a staged, staggered, or stepped approach to convey signals between the signal generation and analysis assembly and the DUT and/or to progressively adapt the signal circuits from a more macroscopic scale, such as may be associated with electrical connections that are made between the signal circuits and the signal generation and analysis assembly, to a more microscopic scale, such as may be associated with electrical connections made between the signal circuits and the DUT.

As an example, a plurality of wires and/or cables may define a first region of the signal circuits and may be utilized to convey the signals between the signal generation and analysis assembly and a probe head assembly of the probe system. As another example, a printed circuit board may define a second region of the signal circuits and may be utilized to convey the signals between the plurality of wires and/or cables and a space transformer of the probe system. As yet another example, the space transformer may define a third region of the signal circuits and may be utilized to convey the signals between the printed circuit board and a contacting assembly of the probe system. The contacting assembly may include a plurality of probes, and the probes may be configured to electrically contact corresponding contact pads on the DUT to facilitate transfer of signals between the probe system and the DUT.

The space transformer may adapt, or transform, an average pitch, or spacing, of the signal circuits between a first average pitch, which may be associated with the printed circuit board, and a second average pitch, which may be associated with the contact pads of the DUT. Conventional space transformers are relatively complex electrical structures that may take many weeks, or even several months, to fabricate. In addition, conventional space transformers are fabricated utilizing a layer-by-layer, or serial, process in which a plurality of layers is built up, one on top of the other, to define the space transformer. Such a serial process results in the long fabrication times that are discussed above, and the individual layers cannot be separately tested prior to assembly of the conventional space transformer. As a result, a defect in any one of the layers, of which there may be a dozen or more, may cause the conventional space transformer to be nonfunctional, adding to the fabrication time and/or cost of the conventional space transformer. Furthermore, conventional space transformers must be custom-fabricated for specific DUTs. This may result in additional costs and/or delays, especially during development of new integrated circuit devices and/or when adapting a given probe system to a given integrated circuit device. Thus, there exists a need for improved probe systems for testing integrated circuit devices.

SUMMARY OF THE DISCLOSURE

Probe head assemblies and probe systems for testing integrated circuit devices are disclosed herein. In one embodiment, the probe head assemblies include a contacting structure and a space transformer assembly. In this embodiment, the space transformer assembly includes a first rigid space transformer layer, a second rigid space transformer layer, and an attachment layer that extends between the first rigid space transformer layer and the second rigid space transformer layer.

In another embodiment, the probe head assemblies include a contacting structure, a suspension system, a flex cable interface, and a space transformer including a space transformer body and a flex cable assembly. The flex cable assembly is operatively attached to both the flex cable interface and the space transformer body and has a flex cable compliance that permits relative motion between the flex cable interface and the space transformer body.

In another embodiment, the probe head assemblies include a contacting structure, a space transformer, and a planarization layer. The planarization layer is operatively attached to both the contacting structure and the space transformer.

In another embodiment, the probe head assemblies include a contacting structure, a space transformer, a suspension system, a platen, a printed circuit board, a first plurality of signal conductors and a second plurality of signal conductors. The first plurality of signal conductors is configured to convey a first plurality of signals external to the space transformer and between the contacting structure and the printed circuit board. The second plurality of signal conductors is configured to convey a second plurality of signals via the space transformer and between the contacting structure and the printed circuit board. The probe systems include the probe head assemblies.

BRIEF DESCRIPTION OF THE DRAWINGS

FIG. 5 is a schematic side view illustrating additional space transformers that may form a portion of probe head assemblies and/or that may be utilized in probe systems, according to the present disclosure.

DETAILED DESCRIPTION AND BEST MODE OF THE DISCLOSURE

Figure 1:
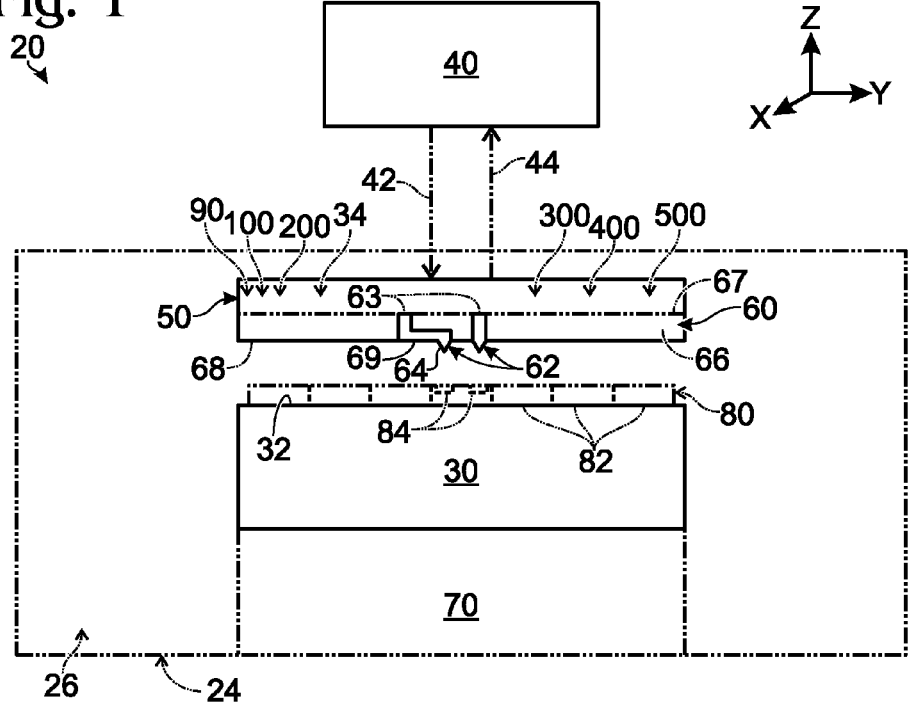
FIG. 1 is a schematic illustration of probe systems according to the present disclosure.

FIGS. 1-12 provide examples of probe systems 20, of probe head assemblies 50, and/or of components thereof, according to the present disclosure. Elements that serve a similar, or at least substantially similar, purpose are labeled with like numbers in each of FIGS. 1-12, and these elements may not be discussed in detail herein with reference to each of FIGS. 1-12. Similarly, all elements may not be labeled in each of FIGS. 1-12, but reference numerals associated therewith may be utilized herein for consistency. Elements, components, and/or features that are discussed herein with reference to one or more of FIGS. 1-12 may be included in and/or utilized with any of FIGS. 1-12 without departing from the scope of the present disclosure. In general, elements that are likely to be included in a particular embodiment are illustrated in solid lines, while elements that are optional are illustrated in dash-dot-dot lines. However, elements that are shown in solid lines may not be essential and, in some embodiments, may be omitted without departing from the scope of the present disclosure.

In the present disclosure, several components, structures, and/or features are described utilizing the adjectives "upper" and "lower." These components, structures, and/or features are so described for convenience, and the adjectives "upper" and "lower" do not require, and should not be interpreted to require, a specific relative orientation and/or a specific relative orientation with respect to vertical. As examples, an "upper surface" may be above, below, or horizontally opposed to a corresponding "lower surface" without departing from the scope of the present disclosure.

With this in mind, it is within the scope of the present disclosure that any component, structure, and/or feature that is described herein utilizing the adjective "upper" or "lower" additionally or alternatively may be described utilizing one or more alternative adjectives, examples of which include "first," "second," "primary," and/or "secondary." As an example, an "upper surface" also may be referred to herein as one of a "first surface" or a "second surface." Similarly, a "lower surface" also may be referred to herein as the other of the "first surface" and the "second surface." Additionally or alternatively, the adjectives "upper" and "lower" also may be reversed such that an "upper surface" also may be referred to herein as a "lower surface" and a "lower surface" also may be referred to herein as an "upper surface."

As used herein, the noun "assembly" refers to a collection of sub-structures assembled and/or combined to form a complete structure, or at least a portion of the complete structure (e.g., the assembly). Each of these sub-structures is, by itself, a finished, manufactured product that may be touched, manipulated, and/or tested for relevant properties that will impact the functionality of the assembly in which the sub-structures are utilized. In addition, each of these sub-structures retains a significant portion, or even all, of its original form, shape, and/or function when it is incorporated into the assembly. Stated another way, and as used herein, the noun "assembly" does not refer to a sub-structure that is formed solely by the manipulation of raw materials.

In this context, and as an example, a bicycle may be considered an assembly of a plurality of sub-structures, such as a crank, wheels, tires, a seat, and the like, with these sub-structures being operatively attached to one another to form the bicycle. Each of these sub-structures has a shape, form, and/or function that remains essentially unchanged upon incorporation into the bicycle. In addition, each of these sub-structures may be touched, manipulated, and/or tested for relevant properties (such as dimensions, mechanical strength, and the like) prior to being incorporated into the bicycle.

As another example, a metal bicycle frame also may be considered an assembly of a plurality of metal tubes, which may be welded, brazed, and/or otherwise operatively attached to one another to define the metal bicycle frame. Each of these metal tubes may be considered a sub-structure that has a shape, form, and/or function that remains essentially unchanged when incorporated into the metal bicycle frame. In addition, each of these metal tubes may be touched, manipulated, and/or tested for relevant properties (such as dimensions, mechanical strength, and the like) prior to being incorporated into the bicycle.

In contrast, the tire of the bicycle may not be considered an assembly of the rubber and/or fibers that comprise the tire, since the shape, form, and function of both the rubber and the fibers materially changes upon being incorporated into the tire. Instead, the tire may be considered a sub-structure that is formed from one or more raw, or precursor, materials. Similarly, the metal tubes that form the bicycle frame may not be considered to be assemblies of the metal that comprises the metal tubes since the shape, form, and function of this metal materially changes upon being incorporated into the metal tubes.

FIG. 1 is a schematic illustration of probe systems 20 according to the present disclosure. Probe systems 20 may be configured to test, or to electrically test, a device under test (DUT) 82 and include a chuck 30 that defines a support surface 32. Support surface 32 is configured and/or shaped to support a substrate 80 that includes at least one DUT 82 and that may include a plurality of distinct and/or spaced-apart DUTs 82. An example of substrate 80 includes a semiconductor wafer. Chuck 30 may include and/or be any suitable chuck that defines the support surface. As an example, chuck 30 may include a temperature-controlled chuck.

Probe systems 20 also include a signal generation and analysis system 40. Signal generation and analysis system 40 may be adapted, configured, designed, programmed, and/or constructed to generate at least one test signal 42 and/or to receive at least one resultant signal 44. Test signal 42 that may include any suitable signal that may be provided to DUT 82. Similarly, resultant signal 44 may include any suitable signal that may be received from the DUT.

As examples, test signal 42 may include one or more of an electric test signal, an electric current test signal, an electric voltage test signal, an analog test signal, a digital test signal, a direct current test signal, an alternating current test signal, a high frequency test signal, and/or a radio frequency test signal. As additional examples, resultant signal 44 may include one or more of a corresponding electric resultant signal, electric current resultant signal, electric voltage resultant signal, analog resultant signal, digital resultant signal, direct current resultant signal, alternating current resultant signal, high frequency resultant signal, and/or radio frequency resultant signal.

Probe systems 20 further include a probe head assembly 50. Probe head assembly 50 may be adapted, configured, designed, sized, and/or constructed to receive test signal 42 from signal generation and analysis system 40, to provide test signal 42 to DUT 82, to receive resultant signal 44 from DUT 82, and/or to provide resultant signal 44 to signal generation and analysis system 40. Stated another way, probe head assembly 50 may be configured to interface with DUT 82 and with signal generation and analysis system 40. Stated yet another way, probe head assembly 50 may be an intermediate structure that conveys test signal 42 and/or resultant signal 44 between signal generation and analysis system 40 and DUT 82.

To facilitate this signal transfer, probe head assembly 50 may be configured to electrically contact DUT 82 and/or to electrically interface with signal generation and analysis system 40. As an example, probe head assembly 50 may include a contacting structure 60. Contacting structure 60 may include a plurality of electrically conductive probes 62, and each of the electrically conductive probes may be oriented and/or positioned to electrically contact a corresponding contact pad 84 of DUT 82.

Contacting structure 60 may include any suitable structure. As an example, contacting structure 60 may include a dielectric support 66 that may define an upper support surface 67 and a lower support surface 68. Electrically conductive probes 62 may extend within dielectric support 66 and/or between upper support surface 67 and lower support surface 68, as illustrated. In addition, each electrically conductive probe 62 may include a probe tip 64. Probe tip 64 may project from lower support surface 68 and/or may be configured to form the electrical contact with contact pads 84. Electrically conductive probe 62 additionally or alternatively may include a probe contact 63. Probe contact 63 may be on, and/or may extend within, upper support surface 67 of the dielectric support.

Electrically conductive probes 62 may have any suitable shape. As an example, electrically conductive probes 62 may include, or be, rocking beam probes 69; however, this specific shape is not required.

More detailed examples of probe head assemblies 50, according to the present disclosure, and/or components thereof are illustrated in FIGS. 2-9 and discussed in more detail herein with reference thereto. It is within the scope of the present disclosure that any of the structures, components, and/or features of any of the probe head assemblies and/or components thereof of any of FIGS. 2-9 may be included in and/or utilized with probe system 20 of FIG. 1 without departing from the present disclosure. This may include inclusion and/or utilization of one or more structures, components, and/or features from a single probe head assembly, such as the probe head assembly that is illustrated in FIG. 3, 6, 7, or 9. Additionally or alternatively, this may include inclusion and/or utilization of one or more structures, components, and/or features from two or more of FIGS. 2-9.

As illustrated in dash-dot-dot lines in FIG. 1, probe system 20 further may include an enclosure 24. Enclosure 24 may define and/or surround an enclosed volume 26, and at least a portion of chuck 30, such as support surface 32 thereof, may extend within the enclosed volume. In addition, at least a portion of probe head assembly 50, such as electrically conductive probes 62 thereof, also may extend within the enclosed volume.

As also illustrated in dash-dot-dot lines in FIG. 1, probe system 20 may include a translation stage 70. Translation stage 70 may be configured to operatively translate chuck 30 and/or support surface 32 thereof relative to probe head assembly 50, such as to permit and/or facilitate alignment and/or contact between electrically conductive probes 62 and contact pads 84.

As an example, translation stage 70 may be configured to operatively translate support surface 32 in a first direction that is parallel, or at least substantially parallel, to support surface 32. An example of such a direction may be along one of the X-axis and the Y-axis of FIG. 1.

As another example, translation stage 70 additionally or alternatively may be configured to operatively translate support surface 32 in a second direction that is parallel, or at least substantially parallel, to support surface 32 and that is also perpendicular, or at least substantially perpendicular to the first direction. An example of such a direction may be along the other of the X-axis and the Y-axis.

As yet another example, translation stage 70 additionally or alternatively may be configured to operatively translate support surface 32 in a third direction that is perpendicular, or at least substantially perpendicular, to support surface 32, to the first direction, and/or to the second direction. An example of such a direction may be along the Z-axis of FIG. 1.

During operation of probe system 20, substrate 80, which includes one or more DUTs 82, may be placed upon support surface 32 of chuck 30. Subsequently, contact pads 84 of DUT 82 may be aligned with probe tips 64 of electrically conductive probes 62 of probe head assembly 50. This may include operative alignment in the plane of support surface 32 and/or in the X-Y plane of FIG. 1 and may be accomplished utilizing translation stage 70.

Then, probe tips 64 may be brought into physical and/or electrical contact with contact pads 84. This electrical and/or physical contact may be achieved by moving support surface 32 toward probe head assembly 50, or in the Z-direction of FIG. 1, such as via utilizing translation stage 70. Additionally or alternatively, this also may be accomplished by moving electrically conductive probes 62 toward support surface 32.

During this contacting process, it may be desirable to provide adequate contact between each probe tip 64 and the corresponding contact pad 84. Such adequate contact may ensure that each probe tip 64 contacts a corresponding contact pad 84 and/or may provide less than a threshold contact resistance between each probe tip and the corresponding contact pad. To this end, probe system 20 may be designed to provide at least a threshold amount of overdrive after one or more of the probe tips contacts the corresponding contact pad.

This overdrive, or additional motion of support surface 32 and probe head assembly 50 toward one another, may increase a contact force between the probe tips and the contact pads and may be facilitated by a compliance that may be designed into one or more components of the probe head assembly. As used herein, the term "compliance" may refer to an amount that a given structure is designed and/or configured to deform, upon application of a force thereto, without damage to the given structure.

As an example, contacting structure 60 may be configured such that electrically conductive probes 62 deflect therein responsive to the contact force between the probes and the contact pads. Stated another way, probes 62 may have and/or define an average probe compliance, or an average amount of deformation, or deflection, which generally may be measured in a direction that is perpendicular to support surface 32, such as in the third direction and/or in the Z-direction of FIG. 1.

In contacting structures 60 that include electrically conductive probes 62 that are supported by dielectric support 66, this average probe compliance may be insufficient to provide a desired amount of overdrive for probe system 20. As such, and as discussed in more detail herein, probe head assembly 50 further may include a suspension system 34. Suspension system 34 may have and/or provide a suspension system compliance, which also may be measured along the Z-axis of FIG. 1, and the combination of the average probe compliance and the suspension system compliance may provide for, or permit, the desired amount of overdrive for probe system 20.

Figure 4:
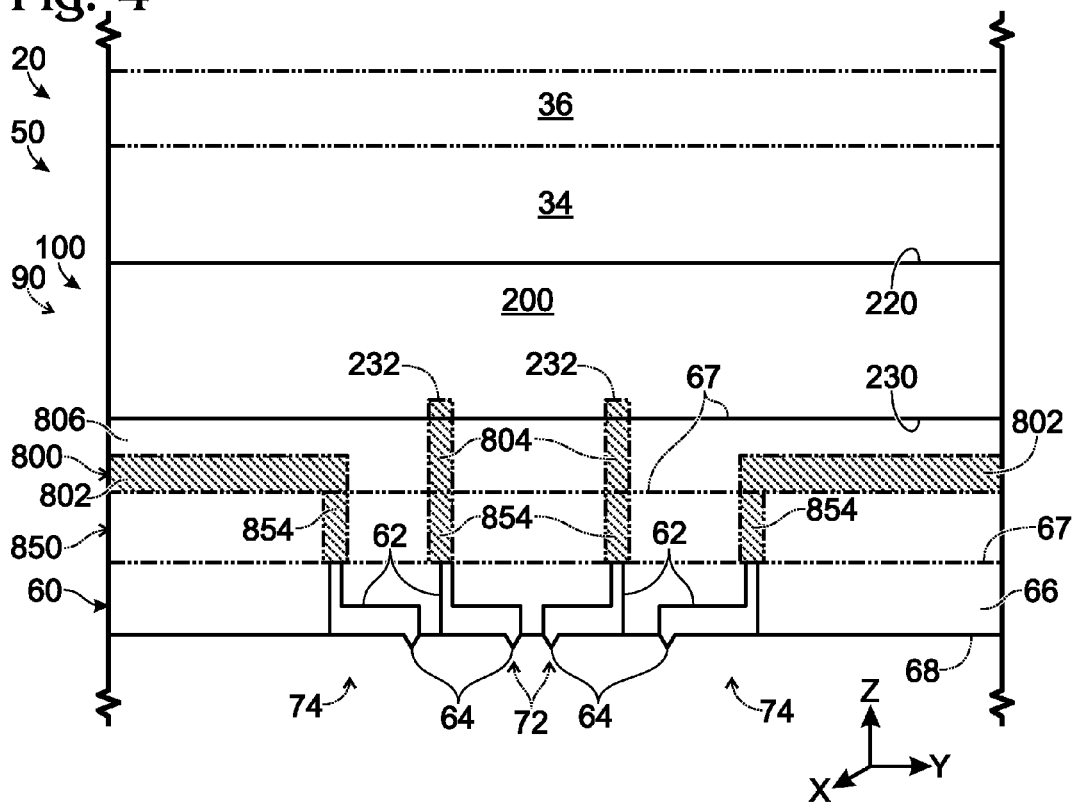
FIG. 4 is a schematic side view illustrating a portion of probe head assemblies including the space transformers of FIGS. 2-3.
Figure 2:
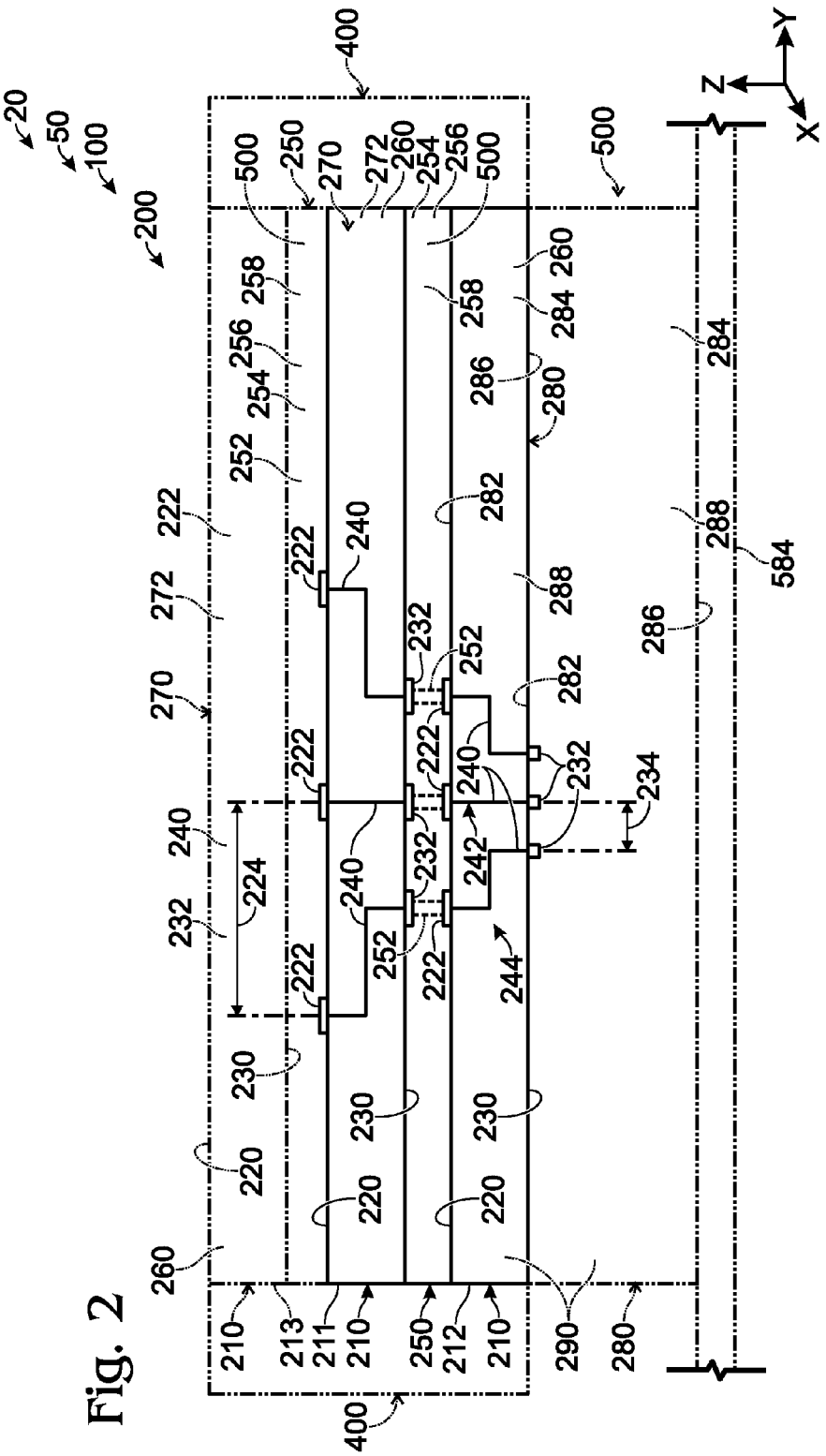
FIG. 2 is a schematic side view illustrating space transformers that may form a portion of probe head assemblies and/or that may be utilized in probe systems, according to the present disclosure.
Figure 3:
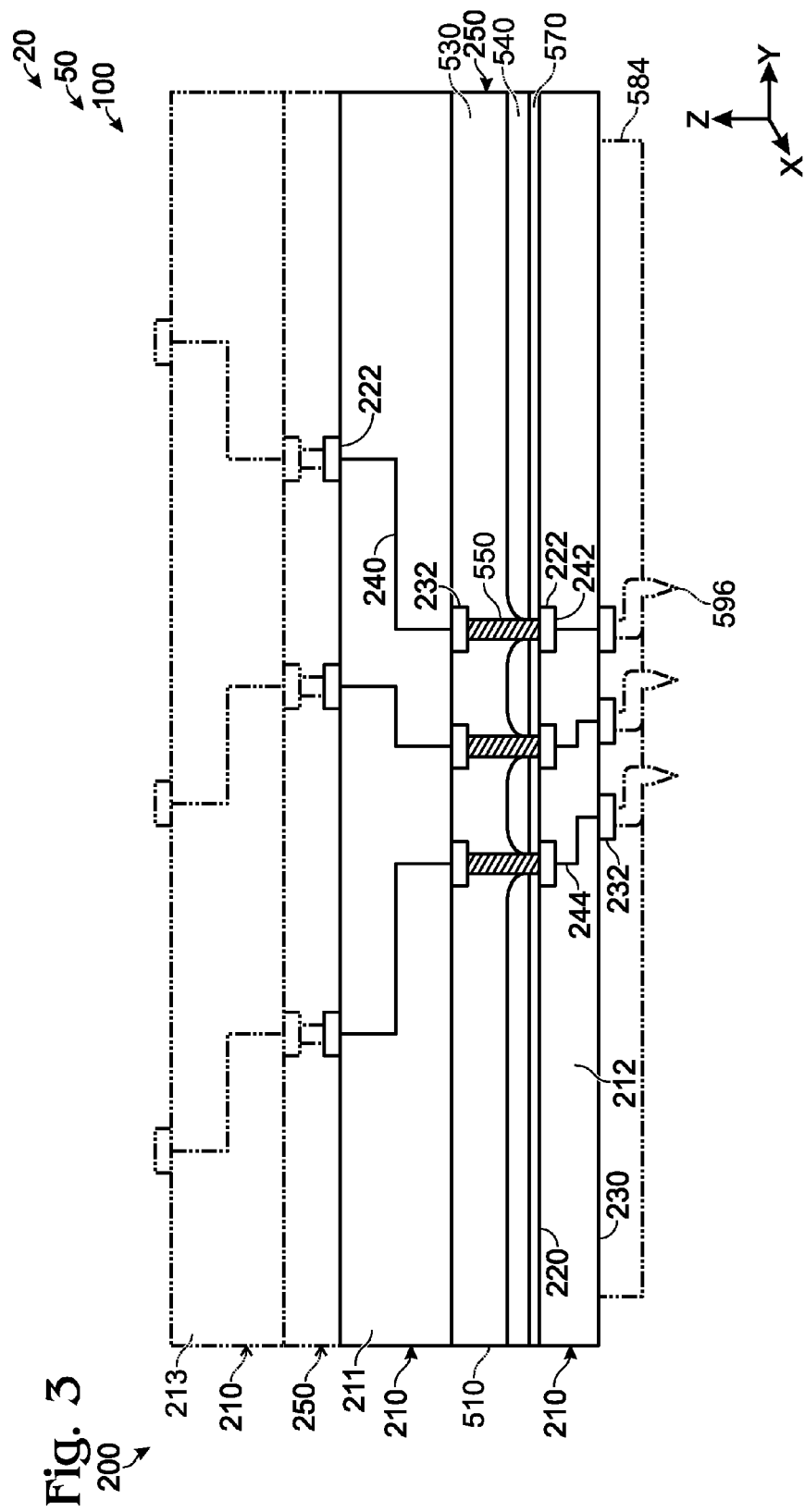
FIG. 3 is a schematic side view of another space transformer according to the present disclosure.

FIGS. 2-3 are schematic side views illustrating space transformers 100 that may form a portion of probe head assemblies 50 and/or that may be utilized in probe systems 20, according to the present disclosure. FIG. 4 is a schematic side view illustrating a portion of probe head assemblies 50 including space transformers 100 of FIGS. 2-3.

Space transformers 100 of FIGS. 2-4 also may be referred to herein as space transformer assemblies 200 and include a plurality of rigid space transformer layers 210 which are illustrated in detail in FIGS. 2-3. Each rigid space transformer layer 210 is operatively attached to at least one adjacent rigid space transformer layer 210 by a corresponding attachment layer 250, which also electrically interconnects each rigid space transformer layer to the at least one adjacent rigid space transformer layer. As discussed in more detail herein, rigid space transformer layers 210 may be sub-structures, or subassemblies, of space transformer assembly 200. Stated another way, rigid space transformer layers 210 may be finished, manufactured products, or components, that may be operatively attached to another, via one or more attachment layers 250, to generate and/or define the space transformer assembly. Stated yet another way, these rigid space transformer layers may be separately manufactured and subsequently combined, via attachment layers 250, to generate the space transformer assembly. Such a construction is in contrast to conventional space transformers, which are a layer-by-layer construction of various raw material components.

Space transformer assemblies 200 according to the present disclosure may provide several benefits over conventional space transformers. As an example, and since each rigid space transformer layer 210 is a separate and/or distinct sub-structure, subassembly, and/or finished, manufactured product, a plurality of such rigid space transformer layers may be manufactured in parallel and subsequently combined to generate space transformer assemblies 200. As another example, a plurality of rigid space transformer layers 210 may be fabricated, in advance, to define a library of rigid space transformer layers from which individual rigid space transformer layers 210 may be selected, based upon one or more selection criteria, and combined to generate space transformer assemblies 200. Such manufacturing processes may provide significant cost and/or time savings over conventional space transformer manufacturing techniques.

As yet another example, a material of construction and/or fabrication process for one rigid space transformer layer may differ from that of another rigid space transformer layer. This may permit construction of a space transformer assembly that includes some rigid space transformer layers that are configured, or even optimized, for one criterion, such as signal speed, with other rigid space transformer layers that are configured, or even optimized, for another criterion, such as current-carrying capacity.

With continued reference to FIGS. 2-3, rigid space transformer layers 210 may include a planar layer upper surface 220, a planar layer lower surface 230, a plurality of upper contact pads 222, and a plurality of lower contact pads 232. Planar layer lower surface 230 may be opposed, or at least substantially opposed, to planar layer upper surface 220. Upper contact pads 222 may be on, may be present on, may be positioned on, and/or may extend on planar layer upper surface 220. Similarly, lower contact pads 232 may be on, may be present on, may be positioned on, and/or may extend on planar layer lower surface 230.

Rigid space transformer layers 210 further may include a plurality of electrical conductors 240. Each electrical conductor 240 may extend between a respective upper contact pad 222 and a corresponding lower contact pad 232 and/or may be oriented to conduct a respective electric current between the respective upper contact pad and the corresponding lower contact pad. Stated another way, the plurality of electrical conductors of each rigid space transformer layer 210 may be oriented to conduct a plurality of electric currents between the plurality of upper contact pads and the plurality of lower contact pads of each rigid space transformer layer 210.

In the example of FIGS. 2-3, space transformer assembly 200 includes two rigid space transformer layers 210, which are illustrated in solid lines, and one optional and/or additional space transformer layer 210, which is illustrated in dash-dot-dot lines. In this embodiment, rigid space transformer layers 210 include an upper space transformer layer 211 and a lower space transformer layer 212 and also may include an additional space transformer layer 213.

It is within the scope of the present disclosure that upper space transformer layer 211 also may be referred to herein as a first rigid space transformer layer 211. Under these conditions, planar layer upper surface 220 of the first rigid space transformer layer also may be referred to herein as a planar first layer upper surface and planar layer lower surface 230 of the first rigid space transformer layer also may be referred to herein as a planar first layer lower surface. In addition, upper contact pads 222 of the first rigid space transformer layer also may be referred to herein as first upper contact pads, lower contact pads 232 of the first rigid space transformer layer also may be referred to herein as first lower contact pads, and electrical conductors 240 of the first rigid space transformer layer also may be referred to herein as first electrical conductors.

Similarly, lower space transformer layer 212 also may be referred to herein as a second rigid space transformer layer 212. Under these conditions, planar layer upper surface 220 of the second rigid space transformer layer also may be referred to herein as a planar second layer upper surface and planar layer lower surface 230 of the second rigid space transformer layer also may be referred to herein as a second planar layer lower surface. In addition, upper contact pads 222 of the second rigid space transformer layer also may be referred to herein as second upper contact pads, lower contact pads 232 of the second rigid space transformer layer also may be referred to herein as second lower contact pads, and electrical conductors 240 of the second rigid space transformer layer also may be referred to herein as second electrical conductors.

While FIGS. 2-3 illustrate 2, or 3, rigid space transformer layers 210, it is within the scope of the present disclosure that space transformer assembly 200 may include any suitable number of rigid space transformer layers. As examples, the space transformer assembly may include at least 2, at least 4, at least 6, at least 8, at least 10, at least 12, at least 14, at least 16, at least 18, at least 20, at least 25, and/or at least 30 rigid space transformer layers 210. Additionally or alternatively, the space transformer assembly may include at most 200, at most 175, at most 150, at most 125, at most 100, at most 90, at most 80, at most 70, at most 60, at most 50, at most 40, at most 30, and/or at most 20 rigid space transformer layers 210.

When space transformer assembly 200 includes more than 2 rigid space transformer layers 210, a rigid space transformer layer may extend between first rigid space transformer layer 211 and second rigid space transformer layer 212 and may be referred to herein as an intermediate rigid space transformer layer. Additionally or alternatively, a rigid space transformer layer that is operatively attached to the first planar layer upper surface of first rigid space transformer layer 211 also may be referred to herein as an upper rigid space transformer layer, while a rigid space transformer layer that is operatively attached to the second planar layer lower surface of second rigid space transformer layer 212 also may be referred to herein as a lower rigid space transformer layer.

The following discussion describes space transformer assembly 200 as including first rigid space transformer layer 211 and second rigid space transformer layer 212 that are oriented as illustrated in FIGS. 2-3. However, and as discussed, it is within the scope of the present disclosure that space transformer assemblies 200 may include any suitable number of rigid space transformer layers 200 with any suitable relative orientation therebetween.

Attachment layer 250 may include any suitable structure that may extend between adjacent rigid space transformer layers, such as between first rigid space transformer layer 211 and second rigid space transformer layer 212, that may operatively attach the adjacent rigid space transformer layers, and/or that may electrically interconnect corresponding contact pads of the adjacent rigid space transformer layers. As an example, the attachment layer may electrically interconnect each of the plurality of first lower contact pads of first rigid space transformer layer 211 with a corresponding one of the plurality of second upper contact pads of second rigid space transformer layer 212.

Attachment layer 250 may include, or be, an electrically conductive attachment layer. As another example, attachment layer 250 may include a plurality of discrete, separate, distinct, and/or spaced-apart electrical conductors 252, and a corresponding electrical conductor 252 may extend between corresponding contact pads of the adjacent rigid space transformer layers. Electrical conductors 252 may be positioned to extend only between the corresponding contact pads. Electrical conductors 252 may be formed from any suitable material, examples of which include a metal, a sintered metal, metal solder, an electrically conductive epoxy, a liquid metal, a thermal sonic bond, and/or a sintered copper paste.

Another example of attachment layer 250 may include an anisotropically conductive film 258. The anisotropically conductive film may be configured to conduct an electric current in one direction, such as in a direction that is perpendicular to planar layer upper surfaces 220 and/or to planar layer lower surfaces 230, and to resist conduction of the electric current in a direction that is parallel to the planar layer upper surface and/or to the planar layer lower surface.

As yet another example, attachment layer 250 may include a dielectric attachment material 254, which may extend between the adjacent rigid space transformer layers. The dielectric attachment material may electrically insulate, or isolate, portions of the adjacent rigid space transformer layers from one another and/or may operatively attach, or adhere, the adjacent rigid space transformer layers to one another.

As another example, attachment layer 250 may include, or be, a planarization layer 500. Examples of planarization layer 500 are discussed in more detail herein with reference to FIGS. 10-11. As illustrated in FIG. 2, planarization layer 500 may be operatively attached to planar layer lower surface 230 of rigid space transformer layers 210 and/or to planar layer upper surface 220 of rigid space transformer layers 210. Additionally or alternatively, planarization layer 500 may extend between adjacent rigid space transformer layers 210 and/or may extend between space transformer assembly 200 and a membrane structure 584, which is discussed in more detail herein and also may be referred to herein as a membrane layer 584. It is within the scope of the present disclosure that attachment layer 250 may extend directly between the adjacent rigid space transformer layers 210 (e.g., first rigid space transformer layer 211 and second rigid space transformer layer 212). Stated another way, a given attachment layer 250 may extend in direct contact, in direct physical contact, and/or in direct electrical contact with at least a portion, or even all, of planar layer upper surface 220 of a given rigid space transformer layer 210 (e.g., the second planar upper surface of second rigid space transformer layer 212) and also with at least a portion, or even all, of planar layer lower surface 230 of the adjacent rigid space transformer layer (e.g., the first planar lower surface of first rigid space transformer layer 211). This may include extending across an entirety of a space that is defined between the adjacent rigid space transformer layers or selectively extending between specific portion(s) of the space that is defined between the adjacent rigid space transformer layers. When the attachment layer selectively extends between specific portion(s) of the space that is defined between the adjacent rigid space transformer layers, an air gap 256 also may extend between at least a portion of the adjacent rigid space transformer layers, such as between a given planar layer upper surface 220 and a corresponding planar layer lower surface 230.

First rigid space transformer layer 211 and second rigid space transformer layer 212 may be adapted, configured, designed, and/or constructed to convey any suitable electric current, electric voltage, and/or electric signal therethrough. As an example, first rigid space transformer layer 211 and/or second rigid space transformer layer 212 may be configured to convey a corresponding power signal, such as a direct current power signal and/or an alternating current power signal, therethrough. The power signal may have a magnitude of at least 0.001 amps, at least 0.01 amps, at least 0.1 amps, at least 0.5 amps, at least 1 amp, at least 5 amps, at least 10 amps, at least 25 amps, at least 50 amps, at least 75 amps, and/or at least 100 amps.

As another example, first rigid space transformer layer 211 and/or second rigid space transformer layer 212 may be configured to convey a corresponding data signal, such as an alternating current data signal and/or a direct current data signal, therethrough. The data signal may include, or be, a high frequency data signal and/or a radio frequency, or RF, data signal. As examples, the data signal may have a frequency of at least 1 kilohertz, at least 10 kilohertz, at least 100 kilohertz, at least 1 megahertz, at least 10 megahertz, at least 100 megahertz, at least 1 gigahertz, at least 10 gigahertz, or at least 100 gigahertz.

As illustrated in FIGS. 2-3, the first layer upper surface of first rigid space transformer layer 211 may be parallel, or at least substantially parallel, to the first layer lower surface of the first rigid space transformer layer, to the second layer upper surface of second rigid space transformer layer 212, and/or to the second layer lower surface of second rigid space transformer layer 212. Similarly, the second layer upper surface of second rigid space transformer layer 212 may be parallel, or at least substantially parallel, to the first layer upper surface of first rigid space transformer layer 211, to the first layer lower surface of the first rigid space transformer layer, and/or to the second layer lower surface of second rigid space transformer layer 212.

Figure 10:
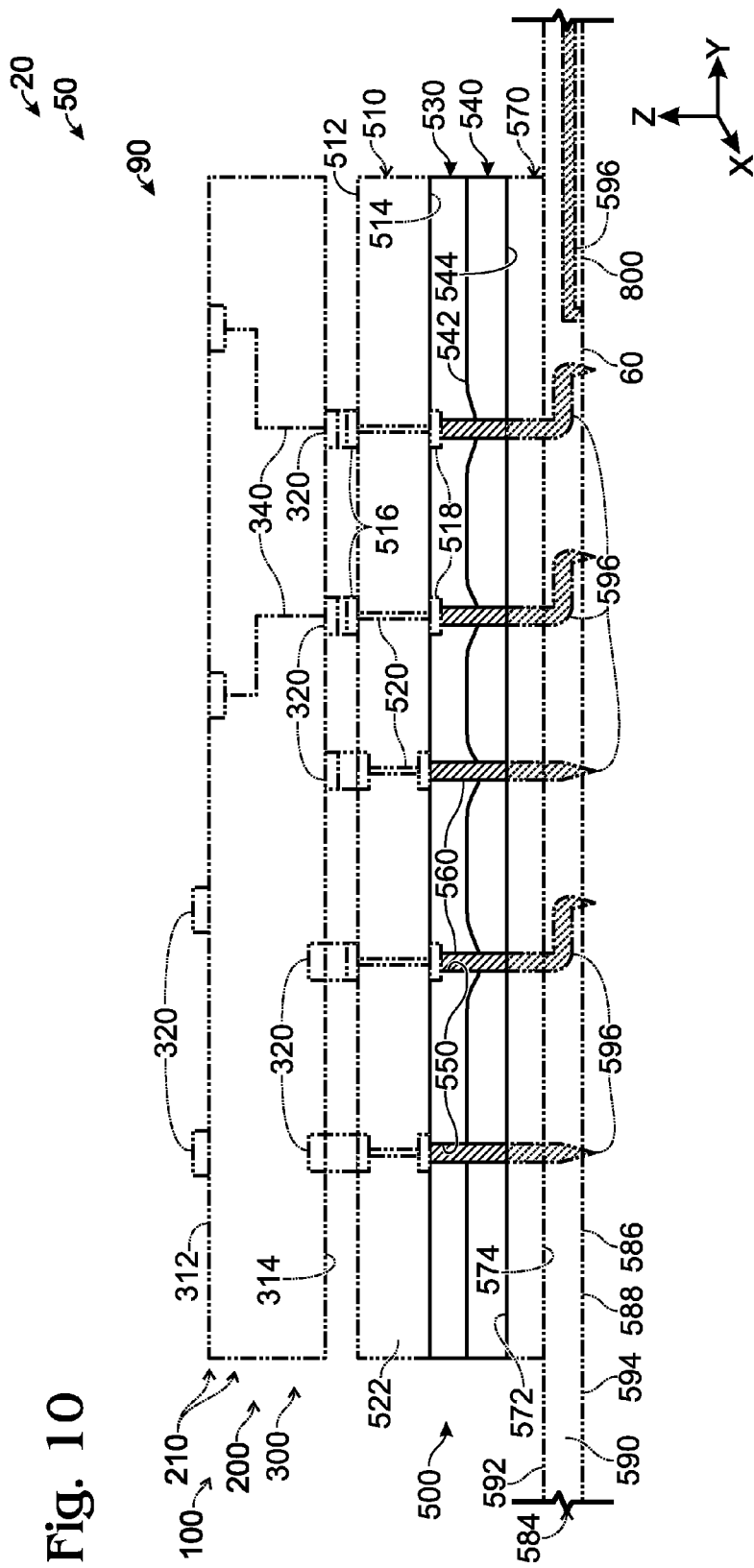
FIG. 10 is a schematic side view illustrating planarization layers that may form a portion of probe head assemblies and/or that may be utilized in probe systems, according to the present disclosure.

As also illustrated in FIGS. 2-3, the first upper contact pads of first rigid space transformer layer 211 may project from the first layer upper surface thereof. Additionally or alternatively, the first lower contact pads of first rigid space transformer layer 211 may project from the first layer lower surface thereof. Similarly, the second upper contact pads of second rigid space transformer layer 212 may project from the second layer upper surface thereof. Additionally or alternatively, the second lower contact pads of second rigid space transformer layer 212 may project from the second layer lower surface thereof. However, this is not required, and one or more contact pads may not project from the corresponding surfaces, as illustrated in FIG. 10 and discussed in more detail herein with reference thereto.

As further illustrated in FIGS. 2-3, a location, or a layout, of each of the first lower contact pads of first rigid space transformer layer 211 may correspond to, or be a mirror image of, a location, or a layout, of each of the second upper contact pads of second rigid space transformer layer 212. Stated another way, and when first rigid space transformer layer 211 and second rigid space transformer layer 212 are assembled into space transformer assembly 200, each of the plurality of first lower contact pads of first rigid space transformer layer 211 may be opposed to, directly opposed to, or facing toward, a corresponding one of the plurality of second upper contact pads of second rigid space transformer layer 212.

Upper contact pads 222, including the first upper contact pads and/or the second upper contact pads, may include any suitable material and/or materials of construction. As examples, upper contact pads 222 may include, or be, metallic upper contact pads. Similarly, lower contact pads 232, including the first lower contact pads and/or the second lower contact pads, also may include any suitable material and/or materials of construction. As examples, lower contact pads 232 may include, or be metallic lower contact pads.

Electrical conductors 240 may include any suitable structure and may extend between corresponding upper contact pads 222 and lower contact pads 232 of a given rigid space transformer layer 210 in any suitable manner. As examples, electrical conductors 240 may include, or be, an electrically conductive via that extends perpendicular, or at least substantially perpendicular, to planar layer upper surface 220 and/or planar layer lower surface 230, as indicated in FIGS. 2-3 at 242. Under these conditions, the electrical conduit also may be referred to herein as extending between corresponding via contact pads of the rigid space transformer layer. Additionally or alternatively, electrical conductors 240 also may include, or be, an electrically conductive trace that extends parallel, or at least substantially parallel, to planar layer upper surface 220 and/or to planar layer lower surface 230, as indicated in FIGS. 2-3 at 244. Under these conditions, the electrical conduit also may be referred to herein as extending between corresponding trace contact pads of the rigid space transformer layer.

Electrical conductors 240 may include and/or be formed from any suitable material and/or materials. As an example, electrical conductors 240 may include, or be, metallic electrical conductors.

Similarly, rigid space transformer layers 210 may include and/or be formed from any suitable structure, material, and/or materials. As examples, rigid space transformer layers 210, including first rigid space transformer layer 211 and/or second rigid space transformer layer 212 may include one or more of a printed circuit board and a high density interconnect layer. As another example, rigid space transformer layers 210, including first rigid space transformer layer 211 and/or second rigid space transformer layer 212 may include a respective dielectric body 260 that may define planar layer upper surface 220 and/or planar layer lower surface 230 thereof.

As discussed herein, space transformers 100, including space transformer assemblies 200 of FIGS. 2-3, may be configured to adapt, change, or transform, an average pitch, or spacing of electrical signals that may be conveyed therethrough. Thus, and as illustrated in FIG. 2, an average pitch, or spacing, 234 of the second lower contact pads of second rigid space transformer layer 212 may be less than a threshold fraction of an average pitch, or spacing, 224 of the first upper contact pads of first rigid space transformer layer 211. Stated another way, an average distance between each of the second lower contact pads and a closest other of the second lower contact pads may be less than the threshold fraction of an average distance between each of the first upper contact pads and a closest other of the first upper contact pads. FIGS. 2-3 illustrate space transformers 100 in which the average pitch, or spacing, decreases from top-to-bottom; however, this specific configuration is not required. As an example, the average pitch, or spacing, may decrease from bottom-to-top without departing from the scope of the present disclosure.

The threshold fraction of the average pitch, or of the average distance, may have any suitable value. As examples, the threshold fraction may be at least 1%, at least 5%, at least 10%, at least 20%, or at least 25% of the average pitch, or spacing, of the plurality of first upper contact pads. Additionally or alternatively, the threshold fraction may be at most 400%, at most 300%, at most 200%, at most 100%, at most 50%, at most 40%, at most 30%, at most 20%, at most 10%, at most 5%, at most 1%, or at most 0.1% of the average pitch, or spacing, of the plurality of first upper contact pads.

As illustrated in dash-dot-dot lines in FIG. 2, first rigid space transformer layer 211 and/or another rigid space transformer layer 210 that is operatively attached to first rigid space transformer layer 211 may include, or be, a modular capacitor bank 270. Modular capacitor bank 270, when present, may include a plurality of capacitors 272, such as a plurality of surface mount capacitors and/or a plurality of thin film capacitors. At least a portion, or subset, of capacitors 272, may extend from corresponding planar layer upper surface 220 of modular capacitor bank 270, such as when capacitors 272 include the surface mount capacitors. Each capacitor 272 may be in electrical communication with a corresponding pair of the plurality of electrical conductors 240 and/or may be configured to store electrical power and to provide the stored electrical power to one or more components of, or in electrical communication with, space transformer assembly 100.

As also illustrated in dash-dot-dot lines in FIG. 2, space transformer assembly 200 further may include a flexible membrane layer 280. Flexible membrane layer 280, when present, may be operatively attached to a rigid space transformer layer 210 of space transformer assembly 200. As an example, the flexible membrane layer may be operatively attached to the second layer lower surface of second rigid space transformer layer 212. Additionally or alternatively, flexible membrane layer 280 may replace, or take the place of, first rigid space transformer layer 211 and/or second rigid space transformer layer 212 within space transformer assemblies 200. Flexible membrane layer 280 also may be referred to herein as, or may be, a membrane space transformer 280 and/or a membrane-based space transformer 280.

Flexible membrane layer 280, when present, may include a membrane upper surface 282, a plurality of membrane upper contact pads 284 on the membrane upper surface, a membrane lower surface 286, a plurality of membrane lower contact pads 288 on the membrane lower surface, and a plurality of membrane electrical conductors 290. In the example of FIG. 2, membrane upper surface 282 faces toward the second layer lower surface of second rigid space transformer layer 212, and membrane lower surface 286 is opposed to membrane upper surface 282. In addition, membrane electrical conductors 290 are oriented, within flexible membrane layer 280, to conduct a plurality of electric currents between membrane upper contact pads 284 and membrane lower contact pads 288.

Flexible membrane layer 280, when present, may be utilized to change and/or adapt a relative orientation of the contact pads on space transformer assembly 200 to a target, or desired, relative orientation. Stated another way, flexible membrane layer 280 may be configured to permit customization of the layout of second layer lower contact pads of second rigid space transformer layer 212. As such, a relative orientation of membrane upper contact pads 284 may correspond to a relative orientation of the second layer lower contact pads of second rigid space transformer layer 212. In addition, a relative orientation of membrane lower contact pads 288 may be selected to have, or to adapt the space transformer assembly to have, the desired relative orientation.

Flexible membrane layer 280 may be operatively attached to a remainder of space transformer assembly 200 in any suitable manner. As an example, the flexible membrane layer may be adhered to a rigid space transformer layer 210, such as second space transformer layer 212, of the space transformer assembly. As another example, the flexible membrane layer may be operatively attached via and/or utilizing a sintered metal paste.

In general, rigid space transformer layers 210 may be stiffer, or more rigid, than membrane layer 280. The difference in the rigidity of rigid space transformer layers 210 when compared to the rigidity of membrane layer 280 may be quantified in any suitable manner. As an example, a stiffness of the membrane layer may be less than a threshold fraction of a stiffness of the rigid space transformer layer. Examples of the threshold fraction include threshold fractions of less than 80%, less than 70%, less than 60%, less than 50%, less than 40%, less than 30%, less than 20%, and/or less than 10% of the stiffness of the rigid space transformer layer.

FIG. 2 also illustrates, in dash-dot-dot lines, that space transformer assembly 200 further may include a flex cable assembly 400. Flex cable assembly 400 is illustrated in more detail in FIGS. 5-9 and discussed in more detail herein with reference thereto.

FIG. 3 is another example of a space transformer assembly 200 according to the present disclosure. Space transformer assembly 200 of FIG. 3 includes a plurality of rigid space transformer layers 210 and an attachment layer 250 extending between adjacent rigid space transformer layers 210. Rigid space transformer layers 210 and attachment layer(s) 250 may be at least substantially similar, or even identical, to the corresponding structures of FIG. 2. As an example, attachment layer(s) 250 may include, or be, planarization layer(s) 500 and may include a resilient dielectric layer 530, a planarized rigid dielectric layer 540, and an adhesive layer 570, as discussed in more detail herein. FIG. 3 illustrates that space transformer assembly 200 may have a membrane structure 584, such as a membrane contacting assembly and/or a membrane space transformer, attached, or directly attached, to a planar lower surface 230 thereof.

Turning now to FIG. 4, portions of probe head assemblies 50 are illustrated. As discussed, probe head assemblies 50 of FIG. 4, and/or any suitable component, structure, and/or feature thereof, may be included in and/or utilized with probe systems 20 of FIG. 1 without departing from the scope of the present disclosure.

Probe head assemblies 50 of FIG. 4 include a contacting structure 60 and a space transformer assembly 200. Space transformer assembly 200 may include any suitable component, structure, and/or feature of any space transformer assembly 200 that is illustrated in FIGS. 2-3 and/or discussed herein with reference to FIGS. 2-3. As such, the following discussion of probe head assembly 50 of FIG. 4 will be made in the context of space transformer assemblies 200 of FIGS. 2-3 and/or of the language that is utilized herein to describe space transformer assemblies 200 of FIGS. 2-3.

Contacting structure 60 includes a plurality of electrically conductive probes 62 configured to contact corresponding contact pads of a DUT. In addition, contacting structure 60 is operatively attached to a second planar layer lower surface 230 of space transformer assembly 200 such that each electrically conductive probe in at least a subset, as indicated at 72, of the plurality of electrically conductive probes is in electrical communication with a corresponding one of a plurality of second layer lower contact pads 232 of the space transformer assembly.

As illustrated in dash-dot-dot lines in FIG. 4, probe head assemblies 50 further may include a suspension system 34. Space transformer assembly 200 may be operatively attached to suspension system 34 such that the space transformer assembly extends between contacting structure 60 and suspension system 34 and/or such that space transformer assembly 200 operatively attaches contacting structure 60 to suspension system 34.

Suspension system 34 may have and/or define a suspension system compliance, and this suspension system compliance may permit motion of contacting structure 60 and space transformer assembly 200 along the Z-axis of FIG. 4 and/or in a direction that is perpendicular, or at least substantially perpendicular, to second planar layer lower surface 230 of space transformer assembly 200 (e.g., in the third direction and/or in the direction that is perpendicular to support surface 32 when probe head assembly 50 is included in probe system 20 of FIG. 1). In addition, and as discussed herein, electrically conductive probes 62 may have and/or define an average probe compliance, which may permit motion of probe tips 64 of the electrically conductive probes in the Z-direction. The combination of the suspension system compliance and the probe compliance may be utilized to provide, to provide for, and/or to permit a desired amount of overdrive when probe tips 64 are brought into contact with corresponding contact pads 84 of a DUT, as discussed herein with reference to FIG. 1.

The suspension system compliance may be greater than the average probe compliance. As an example, the suspension system compliance may be at least 125%, at least 150%, at least 200%, at least 300%, at least 400%, and/or at least 500% of the average probe compliance. Additionally or alternatively, the suspension system compliance may be at most 5000%, at most 4000%, at most 3000%, at most 2000%, at most 1000%, at most 800%, at most 600%, at most 400%, and/or at most 200% of the average probe compliance.

Suspension system 34 may include, or be, any suitable structure. As examples, the suspension may include one or more of a spring, a flexure, a compound flexure spring, and/or a resilient material.

As also illustrated in dash-dot-dot lines in FIG. 1, probe head assemblies 50 further may include a platen 36. Suspension system 34 may be operatively attached to platen 36. In addition, suspension system 34 may be configured to permit motion of contacting structure 60 and/or of space transformer assembly 200 relative to the platen. This relative motion may be along the Z-axis and/or may be facilitated by the suspension system compliance. In addition, suspension system 34 also may be configured to resist motion of contacting structure 60 and/or of space transformer assembly 200 in a direction that is parallel, or at least substantially parallel, to second planar layer lower surface 230 of space transformer assembly 200, such as along the X-axis, and/or along the Y-axis. Platen 36 may be, or may be referred to herein as, a rigid, or at least substantially rigid, platen 36.

As further illustrated in dash-dot-dot lines in FIG. 4, probe head assemblies 50 also may, but are not required to, include a signal-conveying membrane 800. Signal-conveying membrane 800 may include a dielectric membrane 806 and a plurality of signal-conveying traces 802. Signal-conveying traces 802 may be supported by dielectric membrane 806 and may be in electrical communication with a second subset, as indicated at 74, of the plurality of electrically conductive probes 62 of contacting structure 60.

As illustrated in FIG. 4, signal-conveying membrane 800 may extend between, or separate, at least a portion of space transformer assembly 200 from at least a portion of contacting structure 60. Stated another way, signal-conveying membrane may be operatively attached to both contacting structure 60 and space transformer assembly 200 and/or contacting structure 60 may be operatively attached to space transformer assembly 200 via the signal-conveying membrane.

Under these conditions, and as also illustrated in FIG. 4, signal-conveying membrane 800 further may include a plurality of pass-through conductors 804. Pass-through conductors 804 may be configured to electrically interconnect each conductive probe in the first subset of the plurality of electrical conductive probes, as indicated at 72, with a corresponding second layer lower contact pad 232 of space transformer assembly 200.

As also illustrated in dash-dot-dot lines in FIG. 4, probe head assembly 50 further may, but is not required to, include an interposer 850. Interposer 850 may spatially separate and/or extend between space transformer assembly 200 or signal-conveying membrane 800, when present, and contacting structure 60. In addition, interposer 850 may operatively attach contacting structure 60 to space transformer assembly 200 and/or to signal-conveying membrane 800. Furthermore, interposer 850 may electrically interconnect contacting structure 60 and space transformer assembly 200 and/or signal-conveying membrane 800, such as via and/or utilizing a plurality of interposer electrical conductors 854.

When probe head assemblies 50 that are illustrated in FIG. 4 are included in and/or utilized with probe systems 20 of FIG. 1, signal generation and analysis system 40 may be configured to provide one or more test signals to a corresponding probe 62 via space transformer assembly 200 and/or to receive one or more resultant signals from a corresponding probe 62 via the space transformer assembly. As such, signal generation and analysis system 40 may be electrically connected to, or in electrical communication with, space transformer assembly 200.

In addition, and when probe head assembly 50 includes signal-conveying membrane 800, signal generation and analysis system 40 may be configured to provide one or more test signals to a corresponding probe 62 via the signal-conveying membrane and/or to receive one or more resultant signals from a corresponding probe 62 via the signal-conveying membrane. As such, signal generation and analysis system 40 may be electrically connected to, or in electrical communication with, signal-conveying traces 802 of signal-conveying membrane 800.

Figure 6:
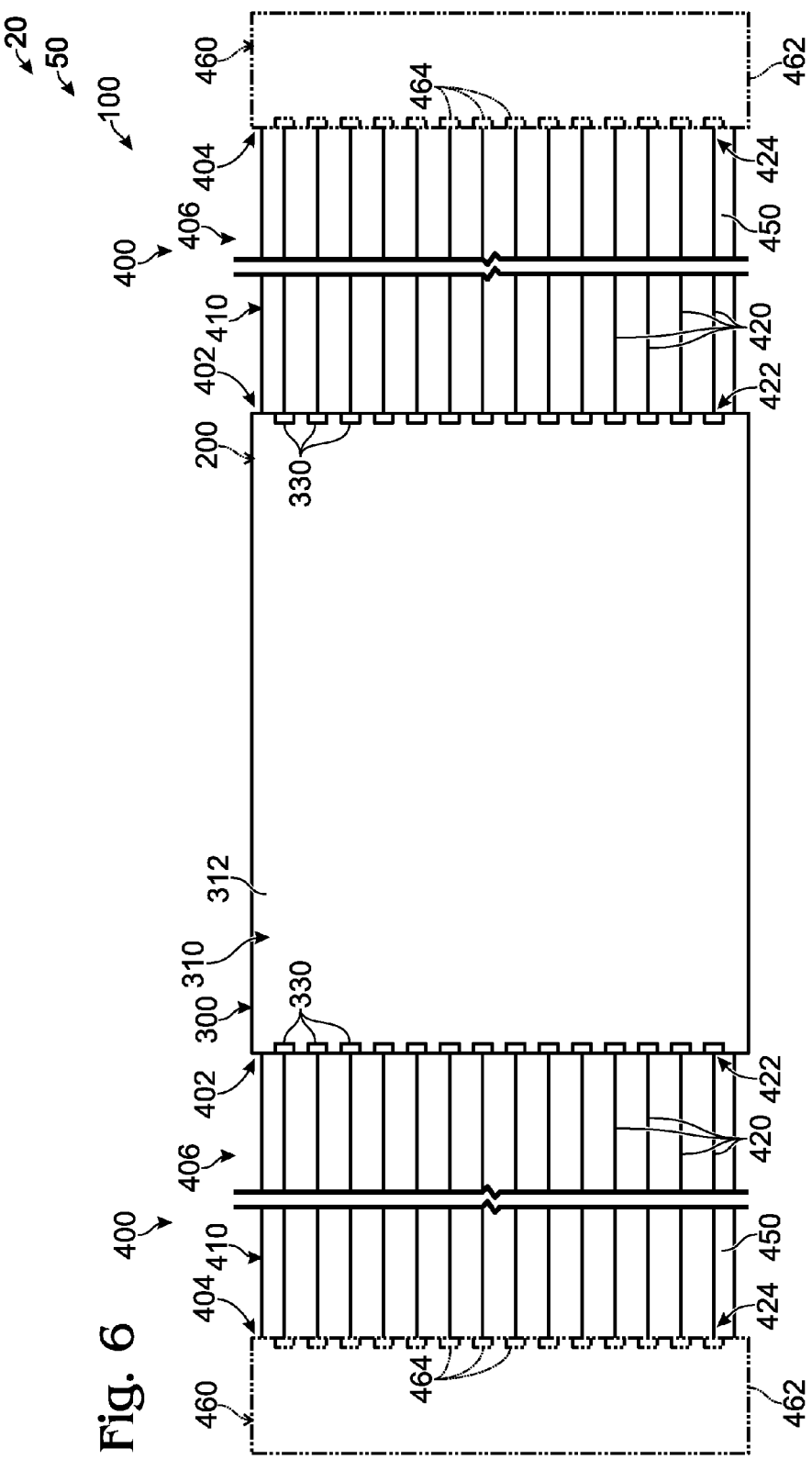
FIG. 6 is a schematic top view illustrating the space transformers of FIG. 5.
Figure 7:
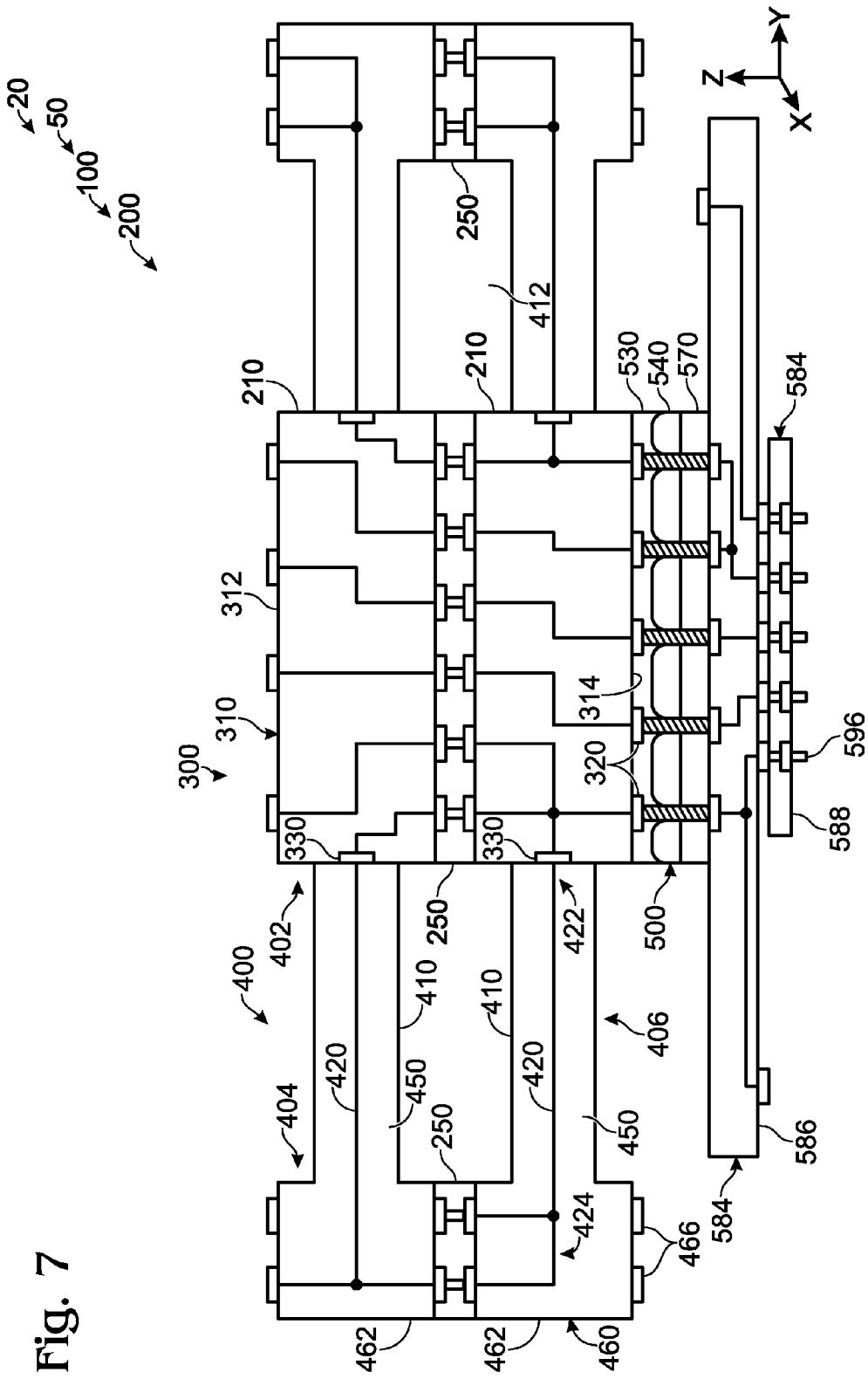
FIG. 7 illustrates an alternative space transformer according to the present disclosure.
Figure 8:
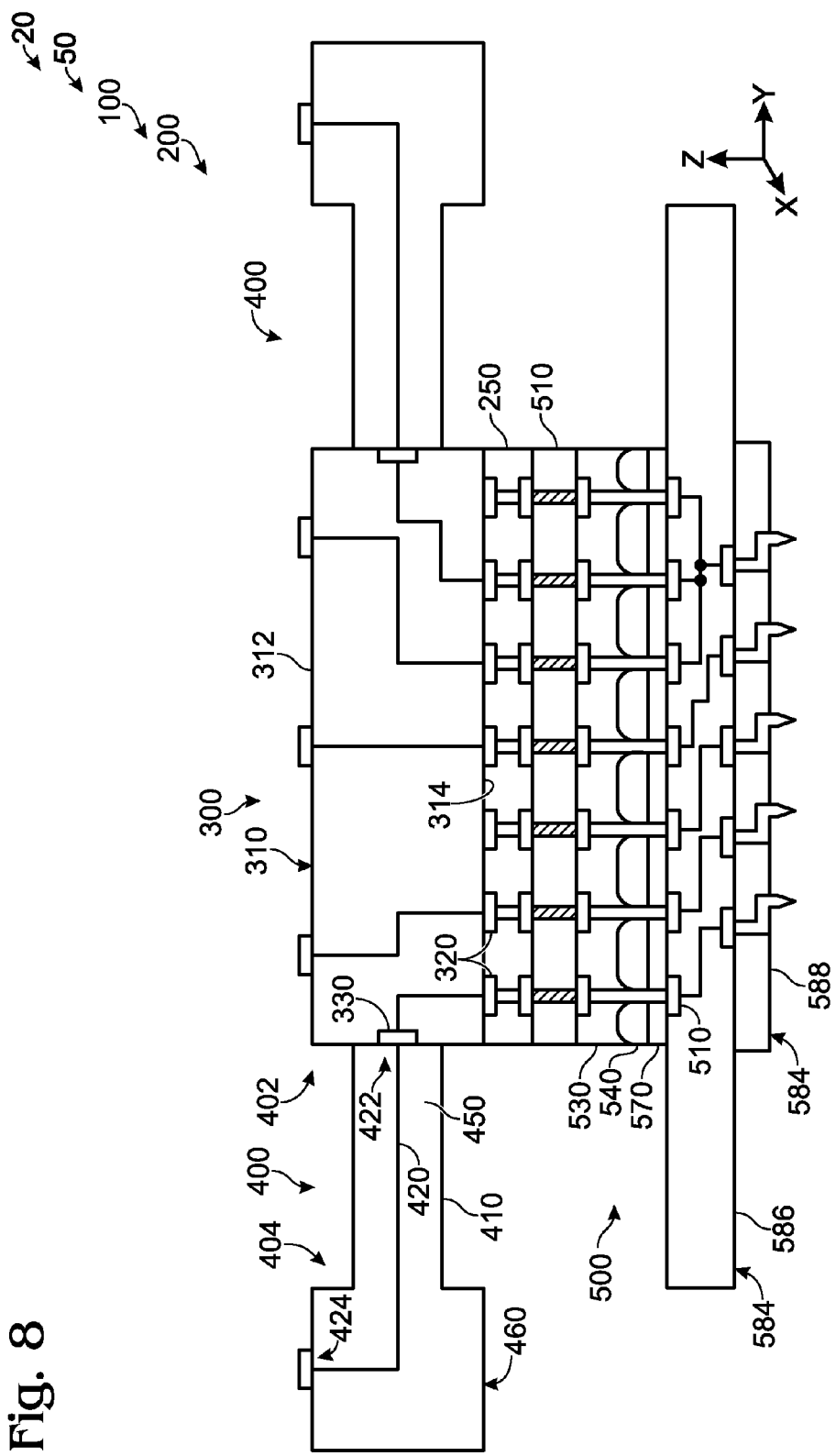
FIG. 8 illustrates another alternative space transformer according to the present disclosure.
Figure 9:
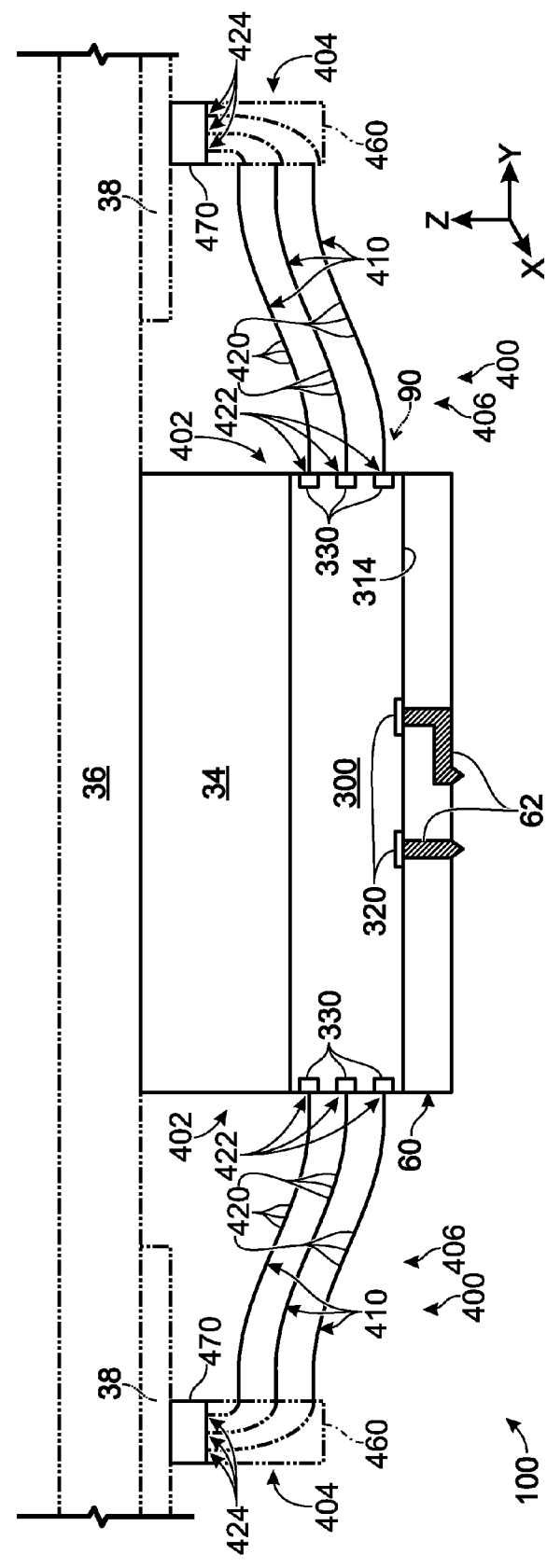
FIG. 9 is a schematic side view illustrating probe head assemblies including the space transformers of FIGS. 4-8.

FIG. 5 is a schematic side view illustrating additional space transformers 100 that may form a portion of probe head assemblies 50 and/or that may be utilized in probe systems 20, according to the present disclosure. FIG. 6 is a schematic top view illustrating space transformers 100 of FIG. 5, FIG. 7 illustrates an alternative space transformer according to the present disclosure, FIG. 8 illustrates another alternative space transformer according to the present disclosure, and FIG. 9 is a schematic side view illustrating probe head assemblies 50 including space transformers 100 of FIGS. 5-8.

Space transformers 100 of FIGS. 5-9 include a space transformer body 300 and are illustrated in detail in FIGS. 5-8. The space transformer body 300 includes a rigid dielectric body 310 that includes an upper surface 312 and an opposed planar lower surface 314. Space transformer body 300 also includes a plurality of electrically conductive contact pads 320, which are on planar lower surface 314, and a plurality of electrically conductive attachment points 330, which are supported by the rigid dielectric body.

Space transformer 100 of FIGS. 5-9 also includes at least one flex cable assembly 400. Flex cable assembly 400 may include a body-proximal cable end 402 and a body-distal cable end 404, and body-proximal cable end 402 may be proximal to space transformer body 300 relative to body-distal cable end 404.

Each flex cable assembly 400 includes a plurality of ribbon electrical conductors 420. Each ribbon electrical conductor includes a body-proximal conductor end 422, which is operatively attached to a corresponding one of the plurality of electrically conductive attachment points 330, and a body-distal conductor end 424, which may be distal from space transformer body 300 relative to the body-proximal end.

Ribbon electrical conductors 420 define a plurality of cable ribbons 410, with each cable ribbon 410 including a corresponding subset of the plurality of ribbon electrical conductors 420. The cable ribbons 410 of a given flex cable assembly 400 together define a layered stack 406 of cable ribbons 410. As illustrated in solid lines in FIG. 5, cable ribbons 410 may be operatively attached to an edge 302 of space transformer body 300. Under these conditions, electrically conductive attachment points 330 may be located on edge 302. Additionally or alternatively, and as illustrated in dashed lines in FIG. 5, cable ribbons 410 may extend between adjacent rigid space transformer layers 210 of space transformer body 300. Under these conditions, electrically conductive attachment points 330 may be located on a planar layer upper surface 220 and/or on a planar layer lower surface 230 of the rigid space transformer layer.

Space transformers 100, according to the present disclosure, that include flex cable assemblies 400 may be configured such that flex cable assembly 400 provides a threshold displacement, or at least the threshold displacement, of body-proximal cable end 402 relative to body-distal cable end 404 for a given force applied to space transformer body 300. Stated another way, flex cable assemblies 400 may be configured to flex to provide at least the threshold displacement upon application of the given applied force to the space transformer body. The body-distal end of the flex cable assembly may be fixed, or at least substantially fixed, in space, and the threshold displacement may be a measure of motion of the space transformer body relative to the body-distal end of the flex cable assembly.

The threshold displacement may have any suitable value. As examples, the threshold displacement may be at least 0.01 millimeter (mm), at least 0.1 mm, at least 1 mm, at least 2 mm, at least 4 mm, at least 5 mm, at least 10 mm, at least 15 mm, at least 20 mm, at least 25 mm, and/or at least 30 mm. Additionally or alternatively, the threshold displacement may be at most 50 mm, at most 40 mm, at most 30 mm, at most 25 mm, and/or at most 20 mm.

The threshold displacement also may be described as a fraction of a length of flex cable assembly 400. As examples, the threshold displacement may be at least 5%, at least 10%, at least 15%, at least 20%, and/or at least 25% of the length of the flex cable assembly. Additionally or alternatively, the threshold displacement may be at most 50%, at most 40%, at most 30%, at most 25%, at most 20%, or at most 15% of the length of the flex cable assembly.

Similarly, the given force may have any suitable value, or magnitude. As examples, the given force may be at least 1 Newton (N), at least 2 N, at least 3 N, at least 4 N, at least 5 N, at least 6 N, at least 8 N, and/or at least 10 N. Additionally or alternatively, the given force may be at most 1000 N, at most 900 N, at most 800 N, at most 700 N, at most 600 N, at most 500 N, at most 400 N, at most 300 N, at most 200 N, at most 100 N, at most 50 N, at most 20 N, at most 18 N, at most 16 N, at most 14 N, at most 12 N, at most 10 N, at most 8 N, at most 6 N, and/or at most 4 N.

It is also within the scope of the present disclosure that flex cable assemblies 400 disclosed herein do not, or are not required to, flex and/or permit displacement of the space transformer body relative to the body-distal end of the flex cable assembly. Stated another way, the threshold displacement may be 0 mm, or negligible. Under these conditions, flex cable assemblies 400 also may be referred to herein as a rigid, or at least substantially rigid, cable assembly 400.

Flex cable assemblies 400, according to the present disclosure may be configured to carry, transfer, and/or convey at least a threshold electric current magnitude between body-proximal cable end 402 and body-distal cable end 404 thereof. This threshold electric current magnitude may be conveyed by ribbon electrical conductors 420 of cable ribbons 410 and may be a sum, or total, of the current that may be conveyed by all, or a combination of, the ribbon electrical conductors. Examples of the threshold electric current magnitude include threshold electric current magnitudes of at least 1 milliAmp (mA), at least 50 mA, at least 100 mA, at least 500 mA, at least 1 Amp (A), at least 25 A, at least 50 A, at least 100 A, at least 200 A, at least 300 A, at least 400 A, at least 500 A, at least 600 A, at least 700 A, at least 800 A, at least 900 A, at least 1000 A, and/or at least 1500 A. Additionally or alternatively, the threshold electric current magnitude may be at most 2500 A, at most 2000 A, at most 1800 A, at most 1600 A, at most 1400 A, at most 1200 A, at most 1000 A, and/or at most 800 A.

It is within the scope of the present disclosure that space transformers 100 of FIGS. 5-9 including flex cable assemblies 400 may be configured such that two, or more, ribbon electrical conductors 420 are electrically shorted together within space transformer body 300. This may include electrically shorting the two ribbon electrical conductors such that the two ribbon electrical conductors are in electrical communication with a single electrically conductive contact pad 320.

As an example, and as illustrated in FIG. 5 at 440, the body-proximal end of the two, or more, ribbon electrical conductors 420 may be operatively attached to a single electrically conductive attachment point 330. As another example, and as illustrated in FIG. 5 at 430, a body electrical conductor 340 may electrically interconnect two electrically conductive attachment points 330 with a given, or a single, electrically conductive contact pad 320.

When space transformer 100 includes two, or more, ribbon electrical conductors that are electrically shorted together within space transformer body 300, the two, or more, ribbon electrical conductors may extend within any suitable cable ribbon 410. As an example, the two, or more, ribbon electrical conductors may extend within the same cable ribbon 410. As another example, the two, or more, ribbon electrical conductors may extend within different cable ribbons 410. As yet another example, the two, or more, ribbon electrical conductors may extend within different flex cable assemblies 400.

Flex cable assemblies 400 may include any suitable structure that may include cable ribbons 410 and ribbon electrical conductors 420. In addition, and as discussed, cable ribbons 410 may form a layered stack 406 of cable ribbons and may be spaced-apart from one another. Such a configuration may provide greater flexibility in flex cable assemblies 400, according to the present disclosure, when compared to a space transformer that does not include the flex cable assembly of FIGS. 5-9. As examples, layered stack 406 may permit the above-described threshold displacement between space transformer body 300 and body-distal cable end 404 for the above-described applied force on the space transformer body.

As an example, a respective air gap 412 may extend between each cable ribbon 410 and an adjacent cable ribbon 410. Air gap 412 may extend along at least a threshold portion of the length of the flex cable assembly, and the length of the flex cable assembly may be measured between body-proximal cable end 402 and body-distal cable end 404. The threshold portion of the length of the flex cable assembly may include at least 50%, at least 60%, at least 70%, at least 80%, at least 90%, at least 95%, or at least 99% of the length of the flex cable assembly.

Stated another way, at least an intermediate portion of each cable ribbon 410 in a given flex cable assembly 400 may be separate from, distinct from, and/or spaced-apart from an intermediate portion of each other cable ribbon 410 in the given flex cable assembly 400. The intermediate portion may extend between the body-proximal end and the body-distal end of the flex cable assembly. However, this is not required, and it is within the scope of the present disclosure that flex cable assemblies 400 disclosed herein may not include air gap 412, such as when adjacent cable ribbons 410 contact, or are operatively attached to, one another.

As illustrated in FIGS. 6-9, each cable ribbon 410 further may include a respective ribbon insulator 450. Ribbon insulators 450 may surround ribbon electrical conductors 420 of a given cable ribbon 410, may operatively attach the ribbon electrical conductors of the given cable ribbon to one another (as illustrated in FIG. 6), and/or may electrically isolate each ribbon electrical conductor of the flex cable assembly from each other ribbon electrical conductor of the flex cable assembly. This may include electrically isolating each ribbon electrical conductor from other ribbon electrical conductors that extend within the same cable ribbon 410, as illustrated in FIG. 6, and/or from ribbon electrical conductors that extend within other cable ribbons 410, as illustrated in FIG. 5.

Ribbon insulators 450 may be formed from and/or may include any suitable material and/or materials. As examples, ribbon insulators 450 may include one or more of a dielectric material, a flexible material, and a polymeric material.

As illustrated in dash-dot-dot lines in FIGS. 5-6 and 9 and in solid lines in FIGS. 7-8, flex cable assemblies 400 further may include a rigid interface structure 460. Rigid interface structure 460 may be operatively attached to body electrical conductors 420, may be operatively attached to body-distal conductor end 424 of the body electrical conductors, and/or may define body-distal cable end 404 of flex cable assembly 400. As an example, the plurality of rigid interface structure layers may be operatively attached to one another.

It is within the scope of the present disclosure that rigid interface structure 460 may include a plurality of rigid interface structure layers 462. As perhaps best illustrated in FIGS. 5 and 7, rigid interface structure layers 462 may be stacked and/or operatively attached to one another to define rigid interface structure 460, such as via utilizing one or more attachment layers 250.

Returning more generally to FIGS. 5-8, when the rigid interface structure includes rigid interface structure layers 462, a given rigid interface structure layer may be operatively attached to a corresponding one of the plurality of cable ribbons. As an example, a given rigid interface structure layer 462 may include a plurality of electrically conductive interface structure attachment points 464. Each electrically conductive interface structure attachment point 464 may form a corresponding electrical connection with body-distal conductor end 424 of a corresponding ribbon electrical conductor 420.

Rigid interface structure layers 462, when present, may include any suitable structure. As examples, one or more rigid interface structure layers 462 of rigid interface structure 460 may include and/or be formed from a printed circuit board and/or a high density interconnect layer.

As illustrated in FIGS. 5 and 7, rigid interface structures 460 further may include a plurality of interface structure contact pads 466. Each rigid interface structure contact pad 466 may be in electrical communication with a corresponding ribbon electrical conductor 420 via a corresponding electrically conductive interface structure attachment point 464 and/or via a corresponding interface structure electrical conductor 468, which may extend between the interface structure contact pad and the corresponding electrically conductive interface structure attachment point.

Space transformer body 300 may include, or be, any suitable structure that includes rigid dielectric body 310, electrically conductive contact pads 320, electrically conductive attachment points 330, and body electrical conductors 340. As an example, space transformer body 300 may include, or be, a conventional space transformer, examples of which are discussed herein. As another example, space transformer body 300 may include, or be, space transformer assembly 200 that is disclosed herein with reference to FIGS. 2-4.

When space transformer body 300 includes space transformer assembly 200, a first subset of the plurality of electrically conductive attachment points 330 may be defined by a first rigid space transformer layer 211 and a second subset of the plurality of electrically conductive attachment points 330 may be defined by a second rigid space transformer layer 212, as illustrated in FIG. 5.

Rigid dielectric body 310 may include, or be formed from, any suitable material and/or materials. As an example, the rigid dielectric body may be formed from an electrically insulating material, a plastic, a fiberglass, and/or a ceramic. As another example, the rigid dielectric body may be formed from a plurality of stacked space transformer layers, such as rigid space transformer layers 210 of FIGS. 2-4.

Electrically conductive contact pads 320 may include, or be formed from, any suitable material and/or materials. As an example, electrically conductive contact pads 320 may include a metal and/or may be metallic contact pads. As illustrated in FIG. 5, electrically conductive contact pads 320 may extend, or project, from lower surface 314 of space transformer body 300. However, this is not required, and one or more of the electrically conductive contact pads may be flush with, coplanar with, and/or recessed below lower surface 314 without departing from the scope of the present disclosure.

Electrically conductive attachment points 330 may include, or be formed from, any suitable material and/or materials. As an example, electrically conductive attachment points 330 may include a metal and/or may be metallic attachment points.

In addition, electrically conductive attachment points may be formed, defined, and/or oriented on any suitable portion of space transformer body 300. As an example, one or more electrically conductive attachment points may extend on, or from, upper surface 312 of space transformer body 300, as indicated in FIG. 5 at 332. As another example, one or more electrically conductive attachment points may extend on, or from, edge 302 of space transformer body 300, as indicated in FIG. 5 at 334, and it is within the scope of the present disclosure that all of the electrically conductive attachment points may extend on, or from, an edge 302 and/or that none of the electrically conductive attachment points may be on upper surface 312. Edge 302 may extend between upper surface 312 and lower surface 314, as illustrated.

Body electrical conductors 340 may include, or be formed from, any suitable material and/or materials. As an example, body electrical conductors 340 may include a metal and/or may be metallic electrical conductors. It is within the scope of the present disclosure that at least a portion of at least a first subset of the plurality of body electrical conductors 340 may extend within rigid dielectric body 310 and in a direction that is parallel, or at least substantially parallel, to lower surface 314. Additionally or alternatively, at least a portion of at least a second subset of the plurality of body electrical conductors may extend within rigid dielectric body 310 and in a direction that is perpendicular, or at least substantially perpendicular, to the lower surface.

Figure 11:
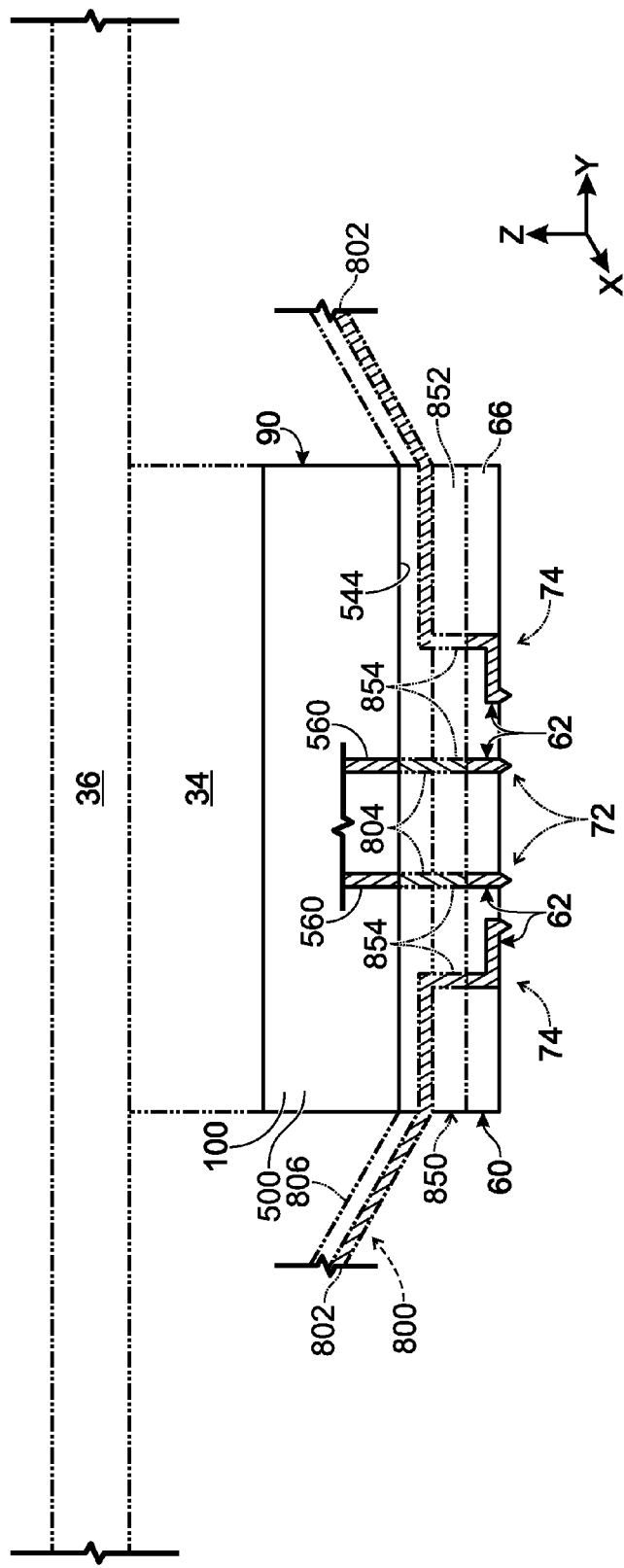
FIG. 11 is a schematic side view illustrating probe head assemblies including the planarization layers of FIG. 10.

Similar to layered space transformer assembly 200 of FIGS. 2-4, space transformers 100 including flex cable assemblies 400 that are illustrated in FIGS. 5-9 further may include and/or incorporate one or more additional structures, functions, and/or features disclosed herein. As an example, and as discussed, space transformer body 300 may include, or be, space transformer assembly 200 of FIGS. 2-4. As another example, and as illustrated in dash-dot-dot lines in FIG. 5, the space transformer of FIGS. 5-9 further may include a planarization layer 500, examples of which are illustrated in FIGS. 10-11 and discussed herein with reference thereto.

Turning to FIG. 7, space transformer 100 includes a space transformer body 300 that is defined by a space transformer assembly 200. The space transformer of FIG. 7 also includes a plurality of flex cable assemblies 400. In the space transformer of FIG. 7, individual rigid space transformer layers 210 of space transformer assembly 200 may be operatively attached to one another via attachment layers 250. In addition, a planarization layer 500 may operatively attach a membrane structure 584, in the form of a membrane space transformer 586, to lower surface 314 of space transformer body 300. Another membrane structure 584, in the form of a membrane contacting assembly 588, may be operatively attached to membrane space transformer 586. In this configuration, a plurality of signals may be conveyed to and/or from membrane contacting assembly 588 via both membrane space transformer 586 and space transformer body 300.

Turing to FIG. 8, space transformer 100 includes space transformer body 300 and flex cable assemblies 400. An attachment layer 250 operatively attaches a planarization layer 500 to a lower surface 314 of the space transformer body. A first membrane structure 584, in the form of a membrane space transformer 586, is operatively attached to the planarization layer. A second membrane structure 584, in the form of a membrane contacting assembly 588, is operatively attached to the membrane space transformer. Similar to the configuration of FIG. 7, a plurality of signals may be conveyed to and/or from membrane contacting assembly 588 via both membrane space transformer 586 and space transformer body 300.

Turning now to FIG. 9, probe head assemblies 50 are illustrated. As discussed, probe head assemblies 50 of FIG. 9, and/or any suitable component, structure, and/or feature thereof, may be included in and/or utilized with probe systems 20 of FIG. 1 without departing from the scope of the present disclosure.

Probe head assemblies 50 of FIG. 9 include a contacting structure 60 that includes a plurality of electrically conductive probes 62. Electrically conductive probes 62 may have and/or define an average probe compliance, and examples of contacting structures 60, of components thereof, and/or of the average probe compliance are disclosed herein.

The probe head assemblies also include a space transformer 100. Space transformer 100 of FIG. 9 may include any structures, component, and/or feature of any of the space transformers that are illustrated in FIGS. 5-8 and discussed herein with reference thereto. Space transformer 100 includes a space transformer body 300 that defines a planar lower surface 314. Contacting structure 60 is operatively attached to planar lower surface 314 such that each electrically conductive probe 62 is in electrical communication with a corresponding electrically conductive contact pad 320.

The probe head assemblies further include a suspension system 34. Space transformer 100 and/or space transformer body 300 thereof is operatively attached to suspension system 34, and suspension system 34 has a suspension system compliance, as discussed herein.

As discussed herein with reference to FIGS. 5-8, space transformer 100 also includes one or more flex cable assemblies 400, and probe head assembly 50 of FIG. 9 includes at least one flex cable interface 470. Flex cable interface 470 is operatively attached and/or electrically connected to body-distal conductor end 424 of ribbon electrical conductors 420 of flex cable assembly 400.

Suspension system 34 is configured to permit motion of planar lower surface 314 of space transformer body 300 relative to flex cable interface 470. This, in turn, may permit motion of contacting assembly 60 relative to the flex cable interface. To facilitate this relative motion between planar lower surface 314 and flex cable interface 470, flex cable assembly 400 includes, has, and/or exhibits a flex cable compliance that is at least as large as the suspension system compliance of suspension system 34. Stated another way, the flex cable compliance of flex cable assembly 400 permits the relative motion between planar lower surface 314 and flex cable interface 470 without damage to flex cable assembly 400 and/or any other component of probe head assembly 50. The flex cable compliance may be produced and/or generated in any suitable manner. As an example, and as discussed, flex cable assembly 400 may be configured to flex and/or bend to produce and/or generate the flex cable compliance.

The suspension system compliance may have any suitable value and/or any suitable magnitude relative to the average probe compliance, and examples of the suspension system compliance are discussed herein with reference to FIGS. 2-4. Similarly, examples of suspension system 34 also are discussed in more detail herein with reference to FIGS. 2-4. Examples of the flex cable compliance include flex cable compliance values that are at least 25%, at least 50%, at least 75%, at least 100%, at least 125%, at least 150%, at least 200%, at least 300%, at least 400%, and/or at least 500% of the suspension system compliance. Additionally or alternatively, the flex cable compliance may be at most 1000%, at most 800%, at most 600%, at most 400%, and/or at most 200% of the suspension system compliance.

Flex cable interface 470 may be operatively attached and/or electrically connected to the flex cable assembly and/or to ribbon electrical conductors 420 thereof in any suitable manner. As an example, flex cable assembly 400 may include a rigid interface structure 460, and the flex cable interface may be operatively attached and/or electrically connected to the rigid interface structure.

As illustrated in dash-dot-dot lines in FIG. 9, probe head assemblies 50 further may include a platen 36. Suspension system 34 and/or flex cable interface 470 may be operatively attached to platen 36 such that the suspension system permits and/or facilitates motion of contacting structure 60 and/or space transformer body 300 relative to the platen, such as via the suspension system compliance. This relative motion may be in a direction that is perpendicular, or at least substantially perpendicular, to planar lower surface 314 of the space transformer body, such as along the Z-axis of FIG. 9. As also illustrated in dash-dot-dot lines in FIG. 9, a printed circuit board 38 may extend between flex cable interface 470 and platen 36 and/or may operatively attach the flex cable interface to the platen.

When probe head assemblies that are illustrated in FIG. 9 are included in and/or utilized with probe systems 20 of FIG. 1, signal generation and analysis system 40 may be configured to provide one or more test signals to one or more ribbon electrical conductors 420 of flex cable assembly 400. Signal generation and analysis system 40 additionally or alternatively may be configured to receive one or more resultant signals from one or more ribbon electrical conductors 420 of the flex cable assembly. These signals may be provided and/or received via flex cable interface 470 and/or printed circuit board 38, when present.

FIG. 10 is a schematic side view illustrating planarization layers 500 that may form a portion of probe head assemblies 50 and/or that may be utilized in probe systems 20, according to the present disclosure. FIG. 11 is a schematic side view illustrating probe head assemblies 50 including planarization layers 500 of FIG. 10.

Planarization layer 500 may be operatively attached to a space transformer 100, such as to space transformer assembly 200 of FIGS. 2-4 and/or to space transformer body 300 of FIGS. 5-9, and may be utilized to planarize a surface of the space transformer and/or to permit the space transformer to be operatively attached to a membrane structure 584. Planarization layer 500 may include an interposer 510 and includes a resilient dielectric layer 530 and a planarized rigid dielectric layer 540. Planarization layer 500 further includes and/or defines a plurality of holes 550 and includes an electrically conductive paste 560 that extends within the plurality of holes. Membrane structure 584 may include a membrane contacting structure 588 and/or a membrane space transformer 586.

Interposer 510, when present, includes an upper interposer surface 512 and an opposed lower interposer surface 514. Interposer 510 also includes a plurality of upper interposer contact pads 516 on upper interposer surface 512 and a plurality of lower interposer contact pads 518 on lower interposer surface 514. Interposer 510 further includes a plurality of interposer electrical conductors 520 extending between the plurality of upper interposer contact pads and the plurality of lower interposer contact pads. Interposer 510 also may include an interposer substrate 522, which may define upper interposer surface 512, may define lower interposer surface 514, may support upper interposer contact pads 516, may support lower interposer contact pads 518, and/or may support interposer electrical conductors 520.

Interposer 510 may include any suitable structure. As an example, interposer 510 may include, or be, a printed circuit board, or PCB. When interposer 510 includes the PCB, interposer substrate 522 may include, or be, a polymeric substrate. As another example, interposer substrate 522 may include, or be, a silicon substrate. When the interposer substrate is the silicon substrate, the plurality of interposer electrical conductors, the plurality of upper interposer contact pads, and/or the plurality of lower interposer contact pads also may be referred to herein as, may be, and/or may be formed by a plurality of through silicon vias. As yet another example, interposer substrate 522 may include, or be, a ceramic substrate.

As illustrated in FIG. 10, each of the plurality of upper interposer contact pads 516 may be opposed to, or directly opposed to, a corresponding one of the plurality of lower interposer contact pads 518. As such, each of the plurality of interposer electrical conductors may extend perpendicular, or at least substantially perpendicular, to upper interposer surface 512 and/or to lower interposer surface 514.

As also illustrated in FIG. 10, upper interposer surface 512 may be parallel, or at least substantially parallel, to lower interposer surface 514. In addition, upper interposer surface 512 may be a planar, or at least substantially planar, upper interposer surface. Similarly, lower interposer surface 514 may be a planar, or at least substantially planar, lower interposer surface.

Upper interposer contact pads 516 may project, or extend, from the upper interposer surface. Similarly, lower interposer contact pads 518 may project, or extend, from the lower interposer surface. However, this is not required, and upper interposer contact pads 516 and/or lower interposer contact pads 518 may be flush with and/or may be recessed within the corresponding surface of the interposer without departing from the scope of the present disclosure.

As illustrated in FIG. 10, resilient dielectric layer 530 may extend conformally over and/or across a surface of a plurality of contact pads, such as lower interposer surface 514 and/or lower interposer contact pads 518, when present. Additionally or alternatively, resilient dielectric layer 530 may extend conformally over and/or across lower surface 314 of space transformer body 300 and electrically conductive contact pads 320 that may be present thereon. In addition, resilient dielectric layer 530 may include and/or be formed from any suitable material and/or materials. As examples, resilient dielectric layer 530 may include one or more of a resilient material, a resilient dielectric adhesive, and/or a polymeric material.

In general, resilient dielectric layer 530 is resilient during formation and/or fabrication of planarization layer 500, as such a configuration may facilitate planarization of planarized rigid dielectric layer 540, which is discussed in more detail herein with reference to methods 700 of FIG. 11. However, resilient dielectric layer 530 may not be, or is not required to be, resilient subsequent to planarization of the planarized rigid dielectric layer and/or during use of the planarization layer. With this in mind, resilient dielectric layer 530 also may be referred to herein as a first dielectric layer 530. Under these conditions, rigid dielectric layer 540 also may be referred to herein as a second dielectric layer 540.

Planarized rigid dielectric layer 540 may include an upper surface 542 and a planarized lower surface 544. Upper surface 542 may extend across and/or may be conformal with resilient dielectric layer 530. As such, upper surface 542 may be nonplanar. In contrast, planarized lower surface 544 may be planar, or at least substantially planar. As an example, planarized upper surface 544 may be planarized during fabrication of planarization layer 500. As another example, planarized lower surface 544 may deviate from being planar by a threshold height variation. Examples of the threshold height variation include threshold height variations of at most 40 micrometers, at most 30 micrometers, at most 20 micrometers, at most 15 micrometers, at most 10 micrometers, at most 8 micrometers, at most 6 micrometers, and/or at most 4 micrometers. This threshold height variation may be quite small relative to the height variation of the rigid dielectric layer prior to planarization thereof, which may be on the order of several hundred micrometers.

As discussed, planarization layer 400 may include both resilient dielectric layer 530 and rigid dielectric layer 540. In general, rigid dielectric layer 540 may be stiffer, or more rigid, than resilient dielectric layer 530, and this difference in the rigidity of planarized rigid dielectric layer 540 when compared to resilient dielectric layer 530 may play an important role in the planarization of, or may permit planarization of, planarized lower surface 544. The difference in the rigidity of planarized rigid dielectric layer 540 when compared to the rigidity of resilient dielectric layer 530 may be quantified in any suitable manner. As an example, a stiffness of the resilient dielectric layer may be less than a threshold fraction of a stiffness of the planarized rigid dielectric layer. Examples of the threshold fraction include threshold fractions of less than 80%, less than 70%, less than 60%, less than 50%, less than 40%, less than 30%, less than 20%, and/or less than 10% of the stiffness of the planarized rigid dielectric layer.

Holes 550 may extend from planarized lower surface 544 of planarized rigid dielectric layer 540. In addition, holes 550 may extend through planarized rigid dielectric layer 540 and/or through resilient dielectric layer 530. Each hole 550 further may extend into contact with a respective one of the plurality of lower interposer contact pads 518 of interposer 510, when present, and/or into contact with a respective electrically conductive contact pad 320 of space transformer body 300. Stated another way, each hole 550 may be at least partially defined, or terminated, by the respective one of the plurality of lower interposer contact pads and/or by the respective one of the electrically conductive contact pads.

Electrically conductive paste 560 may extend within each of the plurality of holes 550. As an example, electrically conductive paste 560 may extend within each hole 550 from planarized lower surface 544 of planarized rigid dielectric layer 540 and to, or into contact with, the respective one of the plurality of lower interposer contact pads 518 of interposer 510, when present, and/or into contact with a respective electrically conductive contact pad 320 of space transformer body 300. As illustrated in FIG. 10, electrically conductive paste 560 may extend only within, or may be confined only to, holes 550.

Electrically conductive paste 560 may include any suitable material and/or materials. As examples, electrically conductive paste 560 may include, or be, an electrically conductive metal paste, an electrically conductive metal alloy paste, an electrically conductive copper paste, and/or an electrically conductive copper alloy paste.

Planarization layer 500 may be included in, or may form a portion of, a planarized space transforming structure 90. Planarized space transforming structure 90 further may include space transformer 100, and the space transformer may include an upper space transformer surface 312, which also may be referred to herein as an upper surface 312, and an opposed planar lower space transformer surface 314, which also may be referred to herein as a lower surface 314.

Space transformer 100 also includes a plurality of electrically conductive contact pads 320, which also may be referred to herein as space transformer contact pads 320. A portion of the plurality of electrically conductive contact pads may be present on planar lower space transformer surface 314 and also may be referred to herein as a plurality of lower space transformer contact pads. In addition, a portion of the plurality of electrically conductive contact pads may be present on upper surface 312 and also may be referred to herein as upper space transformer contact pads. As discussed in more detail herein with reference to space transformer assembly 200 of FIGS. 2-4, an average pitch, or spacing, of the plurality of lower space transformer contact pads may be less than an average pitch, or spacing, of the plurality of upper space transformer contact pads.

Space transformer 100 further may include a plurality of body electrical conductors 340, which also may be referred to herein as space transformer electrical conductors 340. Each space transformer electrical conductor may extend between a given one of the plurality of upper space transformer contact pads and a corresponding one of the plurality of lower space transformer contact pads.

Planarization layer 500 may be operatively attached to lower space transformer surface 314. This operative attachment may include operative attachment such that each of the plurality of upper interposer contact pads 516, when present, is in electrical communication with a corresponding one of the plurality of space transformer contact pads 320, as illustrated.

Space transformer contact pads 320 may project from lower surface 314, and planarization layer 500 may be utilized to generate a planar surface (e.g., planarized lower surface 544 of planarized rigid dielectric layer 540), which subsequently may be attached to one or more additional structures, as discussed in more detail herein.

As also illustrated in FIG. 10, planarized space transforming structure 90 further may include an adhesive layer 570. Adhesive layer 570 may extend across planarized lower surface 544 of planarized rigid dielectric layer 540.

When planarized space transforming structure 90 includes adhesive layer 570, holes 550 may extend through the adhesive layer. As an example, adhesive layer 570 may include an upper adhesive layer surface 572 and an opposed lower adhesive layer surface 574. Upper adhesive layer surface 572 may be in contact with, or adhered to, planarized lower surface 544 of planarized rigid dielectric layer 540, and holes 550 may extend between upper adhesive layer surface 572 and lower adhesive layer surface 574. In addition, electrically conductive paste 560 may extend, within each of the plurality of holes 550, from lower adhesive layer surface 574 and to the respective one of the plurality of lower interposer contact pads 518. In some embodiments, electrically conductive paste 560 further may project from holes 550 and/or past lower adhesive layer surface 574; however, this is not required of all embodiments.

Adhesive layer 570 may include any suitable material and/or materials of construction. As examples, adhesive layer 570 may include one or more of a dielectric adhesive layer, an electrically insulating adhesive layer, and a polymeric adhesive layer.

FIG. 10 also illustrates that planarized space transforming structure 90 further may include membrane structure 584. Membrane structure 584 may include a dielectric membrane 590 that defines an upper membrane surface 592 and an opposed lower membrane surface 594. Membrane structure 584 further may include a plurality of membrane conductors 596. Membrane conductors 596 may extend between upper membrane surface 592 and lower membrane surface 594 and/or may extend along the membrane layer. Additionally or alternatively, membrane conductors 596 may extend along the membrane structure.

Membrane structure 584 may be adhered to planarized lower surface 544 of planarized rigid dielectric layer 540 by adhesive layer 570. In addition, electrically conductive paste 560 may define, or may be referred to herein as a plurality of planarization layer conductors 560. Each planarization layer conductor may extend between a given lower interposer contact pad 518 and a corresponding one of the plurality of membrane conductors 596, thereby electrically interconnecting the given lower interposer contact pad and the corresponding one of the plurality of membrane conductors. Examples of membrane structure 584 include a contacting structure 60 and/or a signal-conveying membrane 800, which are discussed in more detail herein.

When planarized space transforming structure 90 includes adhesive layer 570 and membrane structure 584, electrically conductive paste 560, or the plurality of planarization layer conductors that may be defined thereby, instead may be a sintered electrically conductive paste, a sintered metal, and/or a sintered metal alloy. As an example, the electrically conductive paste may be sintered to produce and/or generate the sintered electrically conductive paste, the sintered metal, and/or the sintered metal alloy.

As discussed, planarization layer 500 may be operatively attached to any suitable space transformer 100, including those that are disclosed herein, to form and/or define planarized space transforming structure 90. In addition, planarized space transforming structure 90 may be included in any of the probe head assemblies 50 that are disclosed herein to planarize the probe head assembly. Similarly, such a probe head assembly may be included in any suitable probe system, such as probe system 20 of FIG. 1.

Turning now to FIG. 11, probe head assemblies 50 are illustrated. Probe head assemblies 50 of FIG. 11 include a contacting structure 60 and a planarized space transforming structure 90. Contacting structure 60 includes a plurality of electrically conductive probes 62 and is operatively attached to a planarized lower surface 544 of the planarized space transforming structure. In addition, the contacting structure is oriented relative to the planarized space transforming structure such that at least a subset, as indicated at 72, of the plurality of electrically conductive probes 62 is in electrical communication with a corresponding planarization layer conductor 560 of the planarized space transforming structure.

As illustrated in dash-dot-dot lines in FIG. 11, probe head assemblies 50 further may include a suspension system 34. Planarized space transforming structure 90 may be operatively attached to suspension system 34. As discussed herein, the suspension system may have a suspension system compliance that may be greater than an average probe compliance of electrically conductive probes 62. Examples of suspension systems 34 and/or of comparisons between the average probe compliance and the suspension system compliance are disclosed herein.

As also illustrated in dash-dot-dot lines in FIG. 11, probe head assemblies 50 may include a platen 36. Suspension system 34 may be operatively attached to platen 36 and may be configured to permit motion between contacting structure 60 and platen 36 and/or between planarized space transforming structure 90 and platen 36. This relative motion may be facilitated by the suspension system compliance and may be in a direction that is perpendicular, or at least substantially perpendicular, to planarized lower surface 544 of planarized space transforming structure 90, such as along the Z-axis of FIG. 11.

As further illustrated in dash-dot-dot lines in FIG. 11, probe head assemblies 50 also may include a signal-conveying membrane 800. Signal-conveying membrane 800 may include a dielectric membrane 806, a plurality of signal-conveying traces 802, and/or a plurality of pass-through conductors 804. Signal-conveying traces 802 may be in electrical communication with corresponding ones of a subset, as indicated at 74, of the plurality of electrically conductive probes 62.

Signal-conveying membrane 800 may separate, or extend between, at least a portion of planarized space transforming structure 90 from at least a portion of contacting structure 60. As such, pass-through conductors 804 may permit electrical communication between corresponding electrically conductive probes 62 of subset 72 and planarization layer conductors 560.

Signal-conveying membrane 800 may be operatively attached to planarized lower surface 544 in any suitable manner. As an example, the signal-conveying membrane may be adhered to the planarized lower surface, such as via and/or utilizing adhesive layer 570 of FIG. 10.

As also illustrated in dash-dot-dot lines in FIG. 11, probe head assembly 50 further may include an interposer 850. Interposer 850 may extend between, spatially separate, operatively attach, and/or electrically interconnect signal-conveying membrane 800 and contacting structure 60. As an example, interposer 850 may include a plurality of interposer electrical conductors 854, which also may be referred to herein as second interposer electrical conductors 854. Interposer electrical conductors 854 may extend between and/or electrically interconnect electrically conductive probes 62 and signal-conveying traces 802 and/or pass-through conductors 804. As another example, interposer 850 may include an interposer substrate 852, which also may be referred to herein as a second interposer substrate 852. Interposer substrate 852 may be formed from a dielectric material and/or may electrically insulate at least a portion of contacting structure 60 from at least a portion of signal-conveying membrane 800 and/or planarized space transforming structure 90.

When probe head assembly 50 includes interposer 510 of FIG. 10, interposer 510 also may be referred to herein as a first interposer 510, and interposer 850 also may be referred to herein as a second interposer 850. Similarly, interposer electrical conductors 520 also may be referred to herein as first interposer electrical conductors 520, and interposer electrical conductors 854 also may be referred to herein as second interposer electrical conductors 854. In addition, interposer substrate 522 also may be referred to herein as a first interposer substrate 522, and interposer substrate 852 also may be referred to herein as a second interposer substrate 852.

Figure 12:
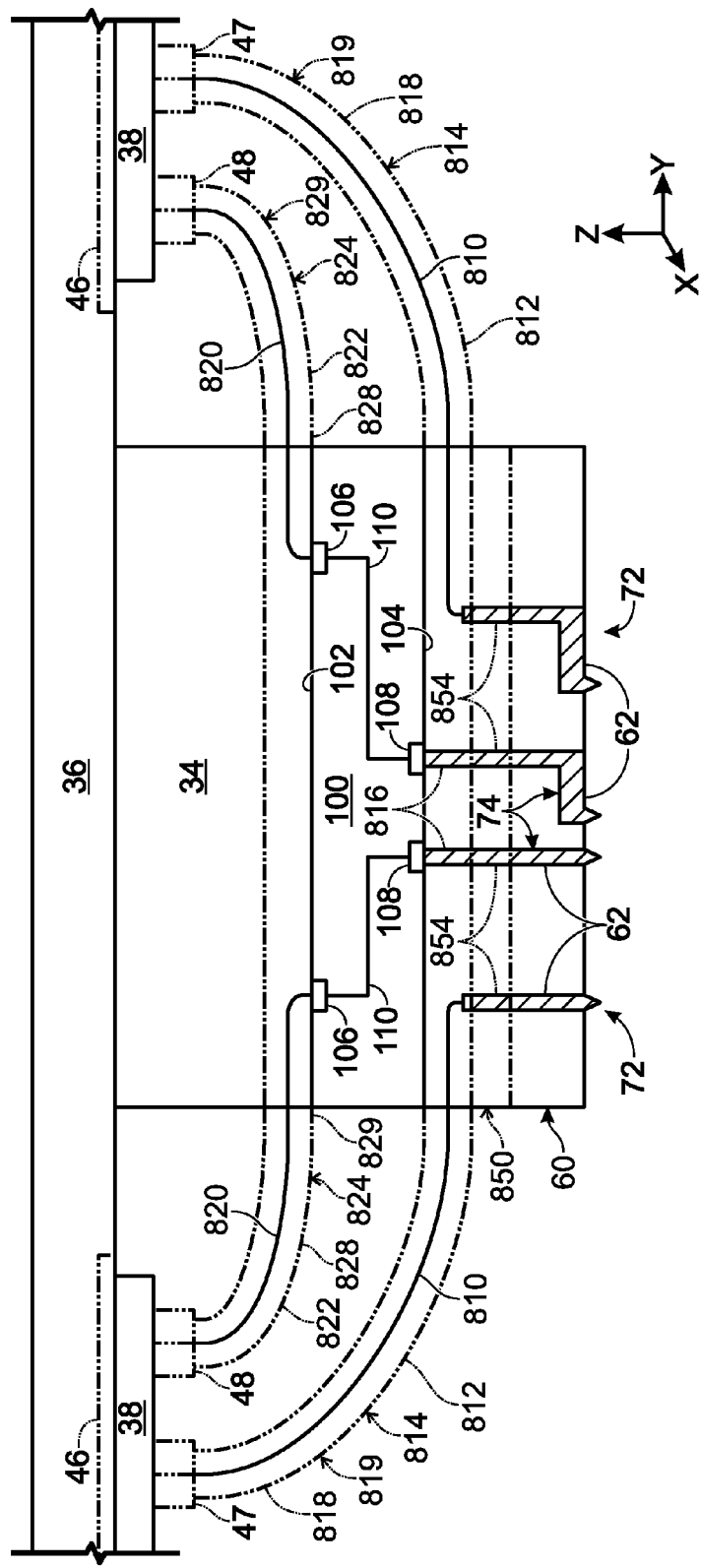
FIG. 12 is a schematic side view illustrating probe head assemblies that may form a portion of probe systems, according to the present disclosure.

FIG. 12 is a schematic side view illustrating probe head assemblies 50 that may form a portion of probe systems 20, according to the present disclosure. Probe head assemblies 50 include a contacting structure 60 that includes a plurality of electrically conductive probes 62. The electrically conductive probes have and/or define an average probe compliance. The probe head assemblies also include a space transformer 100, which includes an upper surface 102 and an opposed lower surface 104, and contacting structure 60 is operatively attached to lower surface 104.

Probe head assemblies 50 further include a suspension system 34. The suspension system has a suspension system compliance that may be greater than the average probe compliance. The probe head assemblies also include a platen 36, and the suspension system is operatively attached to the platen such that the suspension system compliance permits relative motion between the space transformer and the platen. This relative motion may be in a direction that is perpendicular to lower surface 104 of space transformer 100, such as along the Z-axis of FIG. 12. Probe head assemblies 50 also include a printed circuit board 38. Printed circuit board 38 is operatively attached to platen 36 such that the suspension system compliance permits relative motion between the space transformer and the printed circuit board.

Probe head assemblies 50 further include a first plurality of signal conductors 810 and a second plurality of signal conductors 820. The first plurality of signal conductors is configured to convey a first plurality of signals between a first subset, as indicated at 72, of the plurality of electrically conductive probes and the printed circuit board. The second plurality of signal conductors is configured to convey a second plurality of signals between a second subset, as indicated at 74, of the plurality of electrically conductive probes and the printed circuit board. The first plurality of signals is conveyed external to and/or around space transformer 100. In contrast, the second plurality of signals is conveyed through and/or via the space transformer.

Stated another way, probe head assemblies 50 are configured such that the second plurality of signals passes through and/or is conducted by the space transformer as the second plurality of signals is conveyed, via the second plurality of signal conductors, between the second subset of the plurality of probes and the printed circuit board. In contrast, probe head assemblies 50 also are configured such that the first plurality of signals does not pass through and/or is not conducted by the space transformer as the first plurality of signals is conveyed, via the first plurality of signal conductors, between the first subset of the plurality of probes and the printed circuit board.

Space transformer 100 may include any suitable structure that may define upper surface 102 and lower surface 104, that may be operatively attached to suspension system 34, and/or that may convey the second plurality of signals therethrough. As an example, space transformer 100 may include a plurality of upper contact pads 106 on upper surface 102, a plurality of lower contact pads 108 on lower surface 104, and a plurality of space transformer electrical conductors 110. Each space transformer electrical conductor 110 may extend between and electrically interconnect a given one of the plurality of upper contact pads with a corresponding one of the plurality of lower contact pads.

Each signal conductor in the second plurality of signal conductors 820 may be operatively attached to, and in electrical communication with, a corresponding one of the plurality of upper contact pads 106. In addition, each electrically conductive probe 62 in second subset 74 of the plurality of electrically conductive probes may be in electrical communication with a corresponding one of the plurality of lower contact pads 108. An average pitch, or spacing, of the plurality of lower contact pads may be less than an average pitch, or spacing, of the plurality of upper contact pads, as discussed herein with reference to first upper contact pads 222 and second lower contact pads 232 of FIG. 2.

Suspension system 34 may include any suitable structure that may be operatively attached to space transformer 100 and to platen 36, that may operatively connect the space transformer to the platen, and/or that may have and/or define the suspension system compliance. Examples of suspension systems 34, of the suspension system compliance, and/or of relationships between the suspension system compliance and the average probe compliance are disclosed herein.

Platen 36 may include any suitable structure that may be operatively attached to suspension system 34, that may be operatively attached to printed circuit board 38, that may support the suspension system, and/or that may support the printed circuit board. Examples of platen 36 are disclosed herein.

Printed circuit board 38 may include any suitable structure that may be operatively attached to platen 36, that may be electrically connected to first plurality of signal conductors 810, and/or that may be electrically connected to second plurality of signal conductors 820. As an example, printed circuit board 38 may include a first electrical interface 47, which may be operatively attached to and/or in electrical communication with first plurality of signal conductors 810. As another example, printed circuit board 38 additionally or alternatively may include a second electrical interface 48, which may be operatively attached to and/or in electrical communication with second plurality of signal conductors 820.

In addition, printed circuit board 38 may be electrically isolated from platen 36. As an example, an isolation structure 46 may extend between the printed circuit board and the platen and/or may electrically isolate the printed circuit board from the platen. An example of the isolation structure includes an electrically insulating material.

The first plurality of signal conductors may include and/or form a portion of any suitable structure that may, or may be configured to, convey the first plurality of signals between the printed circuit board and the first subset of the plurality of electrically conductive probes. To this end, the first plurality of signal conductors may be electrically connected to, directly electrically connected to, and/or in electrical communication with both the first subset of the plurality of electrically conductive probes and the printed circuit board.

As an example, the probe head assembly may include a first dielectric membrane 812, and the first plurality of signal conductors may extend within and/or may be supported by the first dielectric membrane. Under these conditions, the first plurality of signal conductors 810 and the first dielectric membrane 812 together may define a first signal-conveying membrane 814. As another example, the probe head assembly may include a first ribbon insulator 818, and the first plurality of signal conductors may extend within and/or may be supported by the first ribbon insulator. Under these conditions, the first plurality of signal conductors 810 and the first ribbon insulator 818 together may define a first cable ribbon 819.

First signal-conveying membrane 814, or first cable ribbon 819, may extend between and/or may spatially separate at least a portion of space transformer 100 from at least a portion of contacting structure 60. Under these conditions, the first signal-conveying membrane and/or the first cable ribbon further may include a plurality of pass-through conductors 816. Each pass-through conductor 816 may extend between and electrically interconnect a given lower contact pad 108 and a corresponding electrically conductive probe 60.

It is within the scope of the present disclosure that probe head assembly 50 may include a plurality of first ribbon insulators 818. Under these conditions, a corresponding subset of the first plurality of signal conductors may extend within each of the first ribbon insulators to define a plurality of first cable ribbons. Such a plurality of first cable ribbons may be arranged to define a first layered stack of cable ribbons, and the first layered stack of cable ribbons may be similar to, may be at least substantially similar to, and/or may include any suitable feature of, layered stack 406 of FIGS. 5-9.

Similarly, the second plurality of signal conductors may include and/or form a portion of any suitable structure that may, or may be configured to, convey the second plurality of signals between the printed circuit board and the second subset of the plurality of electrically conductive probes. To this end, the second plurality of signal conductors may be electrically connected to, directly electrically connected to, and/or in electrical communication with both the second subset of the plurality of electrically conductive probes and the printed circuit board.

As an example, the probe head assembly may include a second dielectric membrane 822, and the second plurality of signal conductors may extend within and/or may be supported by the second dielectric membrane. Under these conditions, the second plurality of signal conductors 820 and the second dielectric membrane 822 together may define a second signal-conveying membrane 824. As another example, the probe head assembly may include a second ribbon insulator 828, and the second plurality of signal conductors may extend within and/or may be supported by the second ribbon insulator. Under these conditions, the second plurality of signal conductors 820 and the second ribbon insulator 828 together may define a second cable ribbon 829. Second signal-conveying membrane 824, or second cable ribbon 829, may extend across at least a portion of upper surface 102 of space transformer 100.

It is within the scope of the present disclosure that probe head assembly 50 may include a plurality of second ribbon insulators 828. Under these conditions, a corresponding subset of the second plurality of signal conductors 820 may extend within each of the second ribbon insulators to define a plurality of second cable ribbons. Such a plurality of second cable ribbons may be arranged to define a second layered stack of cable ribbons, and the second layered stack of cable ribbons may be similar to, may be at least substantially similar to, and/or may include any suitable feature of, layered stack 406 of FIGS. 5-9.

As discussed, the first plurality of signal conductors 810 may be configured to convey the first plurality of signals and the second plurality of signal conductors 820 may be configured to convey the second plurality of signals. It is within the scope of the present disclosure that at least one characteristic of the first plurality of signal conductors may be selected based upon at least one characteristic of the first plurality of signals. Similarly, at least one characteristic of the second plurality of signal conductors may be selected based upon at least one characteristic of the second plurality of signals.

As a more specific example, an electric current magnitude of the first plurality of signals may, on average, be different than an electric current magnitude of the second plurality of signals. With this in mind, an average electrical conductivity of the first plurality of signal conductors may differ from an average electrical conductivity of the second plurality of signal conductors.

As another more specific example, the electric current magnitude of the first plurality of signals may be less than, or less than a threshold current fraction of, the average electric current magnitude of the second plurality of signals. Examples of the threshold current fraction include threshold current fractions of less than 50%, less than 40%, less than 30%, less than 20%, less than 10%, less than 5%, or less than 1% of the average electric current magnitude of the second plurality of signal conductors.

Under these conditions, the average electrical conductivity of the first plurality of signal conductors may be less than, or may be a threshold conductivity fraction of, the average electrical conductivity of the second plurality of signal conductors. Examples of the threshold conductivity fraction include threshold conductivity fractions of less than 50%, less than 40%, less than 30%, less than 20%, less than 10%, less than 5%, or less than 1% of the average electrical conductivity of the second plurality of signal conductors.

Examples of the first plurality of signals include data signals, low current signals, high frequency signals, radio frequency (RF) signals, digital signals, and/or alternating current signals. Examples of the second plurality of signals include high current signals, power signals, and/or direct current signals.

As illustrated in dash-dot-dot lines in FIG. 12, probe head assemblies 50 also may include an interposer 850. Interposer 850 may spatially separate space transformer 100 and/or signal-conveying membrane 800 from contacting structure 60. Interposer 850 may include a plurality of interposer electrical conductors 854. Interposer electrical conductors 854 may electrically interconnect the first plurality of signal conductors with the first subset of the plurality of electrically conductive probes and/or may electrically interconnect the second subset of the plurality of signal conductors with the second plurality of electrically conductive probes.

The present disclosure illustrates and describes probe head assemblies and probe systems that may be utilized to test a device under test. Additional examples of space transformers, space transformer assemblies, and/or planarization layers that may be included in and/or utilized with the probe head assemblies and/or probe systems according to the present disclosure are disclosed in U.S. patent application Ser. No. 15/152,177, which was filed on May 11, 2016, the complete disclosure of which is hereby incorporated by reference.

As used herein, the term "and/or" placed between a first entity and a second entity means one of (1) the first entity, (2) the second entity, and (3) the first entity and the second entity. Multiple entities listed with "and/or" should be construed in the same manner, i.e., "one or more" of the entities so conjoined. Other entities may optionally be present other than the entities specifically identified by the "and/or" clause, whether related or unrelated to those entities specifically identified. Thus, as a non-limiting example, a reference to "A and/or B," when used in conjunction with open-ended language such as "comprising" may refer, in one embodiment, to A only (optionally including entities other than B); in another embodiment, to B only (optionally including entities other than A); in yet another embodiment, to both A and B (optionally including other entities). These entities may refer to elements, actions, structures, steps, operations, values, and the like.

As used herein, the phrase "at least one," in reference to a list of one or more entities should be understood to mean at least one entity selected from any one or more of the entity in the list of entities, but not necessarily including at least one of each and every entity specifically listed within the list of entities and not excluding any combinations of entities in the list of entities. This definition also allows that entities may optionally be present other than the entities specifically identified within the list of entities to which the phrase "at least one" refers, whether related or unrelated to those entities specifically identified. Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including entities other than B); in another embodiment, to at least one, optionally including more than one, B, with no A present (and optionally including entities other than A); in yet another embodiment, to at least one, optionally including more than one, A, and at least one, optionally including more than one, B (and optionally including other entities). In other words, the phrases "at least one," "one or more," and "and/or" are open-ended expressions that are both conjunctive and disjunctive in operation. For example, each of the expressions "at least one of A, B and C," "at least one of A, B, or C," "one or more of A, B, and C," "one or more of A, B, or C" and "A, B, and/or C" may mean A alone, B alone, C alone, A and B together, A and C together, B and C together, A, B and C together, and optionally any of the above in combination with at least one other entity.

In the event that any patents, patent applications, or other references are incorporated by reference herein and (1) define a term in a manner that is inconsistent with and/or (2) are otherwise inconsistent with, either the non-incorporated portion of the present disclosure or any of the other incorporated references, the non-incorporated portion of the present disclosure shall control, and the term or incorporated disclosure therein shall only control with respect to the reference in which the term is defined and/or the incorporated disclosure was present originally.

As used herein the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It is also within the scope of the present disclosure that elements, components, and/or other recited subject matter that is recited as being adapted to perform a particular function may additionally or alternatively be described as being configured to perform that function, and vice versa.

As used herein, the phrase, "for example," the phrase, "as an example," and/or simply the term "example," when used with reference to one or more components, features, details, structures, and/or embodiments according to the present disclosure, are intended to convey that the described components, features, details, structures, and/or embodiments is an illustrative, non-exclusive example of components, features, details, structures, and/or embodiments according to the present disclosure. Thus, the described components, features, details, structures, and/or embodiments is not intended to be limiting, required, or exclusive/exhaustive; and other components, features, details, structures, and/or embodiments, including structurally and/or functionally similar and/or equivalent components, features, details, structures, and/or embodiments, are also within the scope of the present disclosure.

Illustrative, non-exclusive examples of space transformers, planarization layers for space transformers, and probe systems according to the present disclosure are presented in the following enumerated paragraphs.

A1. A space transformer assembly, comprising:
a first rigid space transformer layer, optionally including one or more of:
(i) a planar first layer upper surface;
(ii) a planar first layer lower surface that is opposed to the first layer upper surface;
(iii) a plurality of first upper contact pads on the first layer upper surface;
(iv) a plurality of first lower contact pads on the first layer lower surface; and
(v) a plurality of first electrical conductors oriented to conduct a plurality of electric currents between the plurality of first upper contact pads and the plurality of first lower contact pads;
a second rigid space transformer layer, optionally including one or more of:
(i) a planar second layer upper surface that faces toward the first layer lower surface;
(ii) a planar second layer lower surface that is opposed to the second layer upper surface;
(iii) a plurality of second upper contact pads on the second layer upper surface;
(iv) a plurality of second lower contact pads on the second layer lower surface; and
(v) a plurality of second electrical conductors oriented to conduct the plurality of electric currents between the plurality of second upper contact pads and the plurality of second lower contact pads; and
an attachment layer that extends between the first rigid space transformer layer and the second rigid space transformer layer, operatively attaches the first rigid space transformer layer to the second rigid space transformer layer, and optionally electrically interconnects each of the plurality of first lower contact pads to a corresponding one of the plurality of second upper contact pads.

A2. The assembly of paragraph A1, wherein the first rigid space transformer layer is a first subassembly of the space transformer assembly.

A3. The assembly of any of paragraphs A1-A2, wherein the second rigid space transformer layer is a second subassembly of the space transformer assembly.

A4. The assembly of any of paragraphs A1-A3, wherein the first rigid space transformer layer and the second rigid space transformer layer are assembled, via the attachment layer, to define the space transformer assembly.

A5. The assembly of any of paragraphs A1-A4, wherein the first rigid space transformer layer and the second rigid space transformer layer both are finished, manufactured products that are operatively attached to one another, via the attachment layer, to define the space transformer assembly.

A6. The assembly of any of paragraphs A1-A5, wherein at least one of:
(i) the plurality of first upper contact pads projects from the first layer upper surface;
(ii) the plurality of first lower contact pads projects from the first layer lower surface;
(iii) the plurality of second upper contact pads projects from the second layer upper surface; and
(iv) the plurality of second lower contact pads projects from the second layer lower surface.

A7. The assembly of any of paragraphs, A1-A6, wherein the space transformer assembly further includes an air gap that separates at least a portion of the first layer lower surface from at least a portion of the second layer upper surface.

A8. The assembly of any of paragraphs A1-A7, wherein an average pitch, or spacing, of the plurality of second lower contact pads is less than a threshold fraction of an average pitch, or spacing, of the plurality of first upper contact pads.

A9. The assembly of any of paragraphs A1-A8, wherein an average distance between each of the plurality of second lower contact pads and a closest other of the plurality of second lower contact pads is less than a/the threshold fraction of an average distance between each of the plurality of first upper contact pads and a closest other of the plurality of first upper contact pads.

A10. The assembly of any of paragraphs A1-A9, wherein an average pitch, or spacing, of the plurality of first upper contact pads is less than a/the threshold fraction of an average pitch, or spacing, of the plurality of second lower contact pads.

A11. The assembly of any of paragraphs A1-A10, wherein an average distance between each of the plurality of first upper contact pads and a closest other of the plurality of first upper contact pads is less than a/the threshold fraction of an average distance between each of the plurality of second lower contact pads and a closest other of the plurality of second lower contact pads.

A12. The assembly of any of paragraphs A8-A11, wherein the threshold fraction is at least one of:
(i) at least 1%, at least 5%, at least 10%, at least 20%, or at least 25% of the average pitch, or spacing, of the plurality of first upper contact pads; and
(ii) at most 400%, at most 300%, at most 200%, at most 100%, at most 50%, at most 40%, at most 30%, at most 20%, at most 10%, at most 5%, at most 1%, or at most 0.1% of the average pitch, or spacing, of the plurality of first upper contact pads.

A13. The assembly of any of paragraphs A1-A12, wherein a location of each of the plurality of first lower contact pads corresponds to a location of each of the plurality of second upper contact pads.

A14. The assembly of any of paragraphs A1-A13, wherein a layout of the plurality of first lower contact pads is a mirror image of a layout of the plurality of second upper contact pads.

A15. The assembly of any of paragraphs A1-A14, wherein the attachment layer extends between and electrically interconnects each of the plurality of first lower contact pads to a corresponding one of the plurality of second upper contact pads.

A16. The assembly of any of paragraphs A1-A15, wherein each of the plurality of first lower contact pads is opposed to a/the corresponding one of the plurality of second upper contact pads.

A17. The assembly of any of paragraphs A1-A16, wherein the plurality of first electrical conductors of the first rigid space transformer layer includes at least one of:
  (i) at least one first electrically conductive via that extends perpendicular, or at least substantially perpendicular, to the first layer upper surface and between a via contact pad of the plurality of first upper contact pads and a corresponding via contact pad of the plurality of first lower contact pads; and
  (ii) at least one first electrically conductive trace that extends parallel, or at least substantially parallel, to the first layer upper surface and between a trace contact pad of the plurality of first upper contact pads and a corresponding trace contact pad of the plurality of first lower contact pads.

A18. The assembly of any of paragraphs A1-A17, wherein the plurality of second electrical conductors of the second rigid space transformer layer includes at least one of:
  (i) at least one second electrically conductive via that extends perpendicular, or at least substantially perpendicular, to the second layer upper surface and between a via contact pad of the plurality of second upper contact pads and a corresponding via contact pad of the plurality of second lower contact pads; and
  (ii) at least one second electrically conductive trace that extends parallel, or at least substantially parallel, to the second layer upper surface and between a trace contact pad of the plurality of second upper contact pads and a corresponding trace contact pad of the plurality of second lower contact pads.

A19. The assembly of any of paragraphs A1-A18, wherein the first layer upper surface is parallel, or at least substantially parallel, to at least one, optionally both, and further optionally all three, of:
  (i) the first layer lower surface;
  the second layer upper surface; and
  (iii) the second layer lower surface.

A20. The assembly of any of paragraphs A1-A19, wherein the second layer upper surface is parallel, or at least substantially parallel, to at least one, optionally both, and further optionally all three, of:
  (i) the first layer upper surface;
  (ii) the first layer lower surface; and
  (iii) the second layer lower surface.

A21. The assembly of any of paragraphs A1-A20, wherein at least one of the first rigid space transformer layer and the second rigid space transformer layer is configured to convey a power signal therethrough, optionally wherein the power signal includes at least one of a direct current power signal and an alternating current power signal.

A22. The assembly of paragraph A21, wherein the power signal has a magnitude of at least 0.001 amps, at least 0.01 amps, at least 0.1 amps, at least 0.5 amps, at least 1 amp, at least 5 amps, at least 10 amps, at least 25 amps, at least 50 amps, at least 75 amps, or at least 100 amps.

A23. The assembly of any of paragraphs A1-A22, wherein at least one of the first rigid space transformer layer and the second rigid space transformer layer is configured to convey a data signal therethrough, optionally wherein the data signal includes at least one of a direct current data signal and an alternating current data signal.

A24. The assembly of paragraph A23, wherein the alternating current data signal is a high frequency alternating current data signal, and optionally a radio frequency, or RF, data signal.

A25. The assembly of paragraph A24, wherein the high frequency alternating current data signal has a frequency of at least 1 kilohertz, at least 10 kilohertz, at least 100 kilohertz, at least 1 megahertz, at least 10 megahertz, at least 100 megahertz, at least 1 gigahertz, at least 10 gigahertz, or at least 100 gigahertz.

A26. The assembly of any of paragraphs A1-A25, wherein at least one of the first rigid space transformer layer and the second rigid space transformer layer is configured to convey a/the direct current power signal therethrough, and further wherein the other of the first rigid space transformer layer and the second rigid space transformer layer is configured to convey a/the alternating current data signal therethrough.

A27. The assembly of any of paragraphs A1-A26, wherein the space transformer assembly includes a plurality of rigid space transformer layers including at least one of:
  (i) at least 2, at least 4, at least 6, at least 8, at least 10, at least 12, at least 14, at least 16, at least 18, at least 20, at least 25, or at least 30 rigid space transformer layers; and
  (ii) at most 200, at most 175, at most 150, at most 125, at most 100, at most 90, at most 80, at most 70, at most 60, at most 50, at most 40, at most 30, or at most 20 rigid space transformer layers.

A28. The assembly of any of paragraphs A1-A27, wherein a corresponding attachment layer:
  (i) extends between each of the plurality of rigid space transformer layers and at least one other of the plurality of rigid space transformer layers;
  (ii) operatively attaches each of the plurality of rigid space transformer layers to at the least one other of the plurality of rigid space transformer layers; and
  (iii) electrically interconnects each of the plurality of rigid space transformer layers to the at least one other of the plurality of rigid space transformer layers.

A29. The assembly of any of paragraphs A1-A28, wherein the space transformer assembly further includes at least one intermediate rigid space transformer layer that extends between the first rigid space transformer layer and the second rigid space transformer layer.

A30. The assembly of any of paragraphs A1-A29, wherein the space transformer assembly further includes at least one upper rigid space transformer layer that is operatively attached to the planar first layer upper surface.

A31. The assembly of any of paragraphs A1-A30, wherein the space transformer assembly further includes at least one lower rigid space transformer layer that is operatively attached to the planar second layer lower surface.

A32. The assembly of any of paragraphs A1-A31, wherein the first rigid space transformer layer includes, and optionally is, a modular capacitor bank.

A33. The assembly of paragraph A32, wherein the modular capacitor bank includes a plurality of capacitors.

A34. The assembly of paragraph A33, wherein the plurality of capacitors includes at least one of:
(i) a plurality of surface mount capacitors; and
(ii) a plurality of thin film capacitors.

A35. The assembly of any of paragraphs A33-A34, wherein at least a portion of the plurality of capacitors extends from the planar first layer upper surface.

A36. The assembly of any of paragraphs A33-A35, wherein each of the plurality of capacitors is in electrical communication with a corresponding pair of the plurality of first electrical conductors.

A37. The assembly of any of paragraphs A1-A36, wherein the space transformer assembly further includes a flexible membrane layer that is operatively attached to the planar second layer lower surface of the second rigid space transformer layer.

A38. The assembly of paragraph A37, wherein the membrane layer includes:
(i) a membrane upper surface that faces toward the second layer lower surface;
(ii) a membrane lower surface that is opposed to the membrane upper surface;
(iii) a plurality of membrane upper contact pads on the membrane upper surface;
(iv) a plurality of membrane lower contact pads on the membrane lower surface; and
(v) a plurality of membrane electrical conductors oriented to conduct a plurality of electric currents between the plurality of membrane upper contact pads and the plurality of membrane lower contact pads;
wherein a relative orientation of the plurality of membrane upper contact pads corresponds to a relative orientation of the plurality of second lower contact pads, and further wherein a relative orientation of the plurality of membrane lower contact pads is selected to adapt the plurality of second lower contact pads to a desired relative orientation.

A39. The assembly of any of paragraphs A1-A36, wherein the second rigid space transformer layer is instead a flexible membrane layer.

A40. The assembly of paragraph A39, wherein the membrane layer is configured to permit customization of a contact pad layout on the second layer lower surface.

A41. The assembly of any of paragraphs A1-A40, wherein at least one of the first rigid space transformer layer and the second rigid space transformer layer includes a printed circuit board.

A42. The assembly of any of paragraphs A1-A41, wherein at least one of the first rigid space transformer layer and the second rigid space transformer layer includes a high density interconnect layer.

A43. The assembly of any of paragraphs A1-A42, wherein the plurality of first upper contact pads includes a plurality of metallic first upper contact pads.

A44. The assembly of any of paragraphs A1-A43, wherein the plurality of first lower contact pads includes a plurality of metallic first lower contact pads.

A45. The assembly of any of paragraphs A1-A44, wherein plurality of first electrical conductors includes a plurality of metallic first electrical conductors.

A46. The assembly of any of paragraphs A1-A45, wherein the first rigid space transformer layer further includes a first dielectric body that defines the first layer upper surface and the first layer lower surface and that supports the plurality of first upper contact pads, the plurality of first lower contact pads, and the plurality of first electrical conductors.

A47. The assembly of any of paragraphs A1-A46, wherein the plurality of second upper contact pads includes a plurality of metallic second upper contact pads.

A48. The assembly of any of paragraphs A1-A47, wherein the plurality of second lower contact pads includes a plurality of metallic second lower contact pads.

A49. The assembly of any of paragraphs A1-A48, wherein the plurality of second electrical conductors includes a plurality of metallic second electrical conductors.

A50. The assembly of any of paragraphs A1-A49, wherein the second rigid space transformer layer further includes a second dielectric body that defines the second layer upper surface and the second layer lower surface and that supports the plurality of second upper contact pads, the plurality of second lower contact pads, and the plurality of second electrical conductors.

A51. The assembly of any of paragraphs A1-A50, wherein the attachment layer is an electrically conductive attachment layer.

A52. The assembly of any of paragraphs A1-A51, wherein the attachment layer includes a plurality of discrete electrical conductors extending between each of the plurality of first lower contact pads and the corresponding one of the plurality of second upper contact pads, optionally wherein the plurality of discrete electrical conductors includes at least one of a sintered metal and a sintered copper paste.

A53. The assembly of any of paragraphs A1-A52, wherein the attachment layer includes an anisotropically conductive film configured to conduct an electric current in a direction that is perpendicular to the first layer lower surface and to resist conduction of the electric current in a direction that is parallel to the first layer lower surface.

A54. The assembly of any of paragraphs A1-A53, wherein the attachment layer extends directly between the first rigid space transformer layer and the second rigid space transformer layer.

A55. The assembly of any of paragraphs A1-A54, wherein the attachment layer extends in direct physical contact with at least a portion of the first rigid space transformer layer and at least a portion of the second rigid space transformer layer.

A56. The assembly of any of paragraphs A1-A55, wherein the attachment layer extends across an entirety of a space that is defined between the first layer lower surface and the second layer upper surface.

A57. The assembly of any of paragraphs A1-A56, wherein the attachment layer is selectively located to extend only between each of the plurality of first lower contact pads and corresponding ones of the plurality of second upper contact pads.

A58. A probe head assembly for electrically testing a device under test (DUT), the probe head assembly comprising:
a contacting structure including a plurality of electrically conductive probes, wherein each of the plurality of electrically conductive probes is configured to electrically contact a corresponding contact pad of the DUT; and
the space transformer assembly of any of paragraphs A1-A57, wherein the contacting structure is operatively attached to the planar second layer lower surface of the space transformer assembly such that each electrically conductive probe in at least a subset of the plurality of electrically conductive probes is in electrical communication with a corresponding one of the plurality of second lower contact pads.

A59. The probe head assembly of paragraph A58, wherein the probe head assembly further includes a suspension system, wherein the space transformer assembly is operatively attached to the suspension system, wherein the plurality of electrically conductive probes defines an average probe compliance, and further wherein the suspension system has a suspension system compliance that is greater than the average probe compliance.

A60. The probe head assembly of paragraph A59, wherein the suspension system compliance is at least one of:
  (i) at least 125%, at least 150%, at least 200%, at least 300%, at least 400%, or at least 500% of the average probe compliance; and
  (ii) at most 5000%, at most 4000%, at most 3000%, at most 2000%, at most 1000%, at most 800%, at most 600%, at most 400%, or at most 200% of the average probe compliance.

A61. The probe head assembly of any of paragraphs A59-A60, wherein the suspension system includes at least one of a spring, a flexure, a resilient material, and a compound flexure spring.

A62. The probe head assembly of any of paragraphs A59-A61, wherein the probe head assembly further includes a platen, wherein the suspension system is operatively attached to the platen, and further wherein the suspension system is configured to permit motion of the contacting structure and the space transformer assembly, relative to the platen and via the suspension system compliance, in a direction that is perpendicular, or at least substantially perpendicular, to the planar second layer lower surface of the space transformer assembly.

A63. The probe head assembly of paragraph A62, wherein the suspension system further is configured to resist motion of the contacting structure and the space transformer assembly, relative to the platen and via the suspension system compliance, in a direction that is parallel, or at least substantially parallel, to the planar second layer lower surface of the space transformer assembly.

A64. The probe head assembly of any of paragraphs A58-A63, wherein the probe head assembly further includes a signal-conveying membrane including a dielectric membrane and a plurality of signal-conveying traces, wherein the subset of the plurality of electrically conductive probes is a first subset of the plurality of electrically conductive probes, and further wherein each of the plurality of signal-conveying traces is in electrical communication with a corresponding one of a second subset of the plurality of electrically conductive probes.

A65. The probe head assembly of paragraph A64, wherein the signal-conveying membrane separates at least a portion of the space transformer assembly from at least a portion of the contacting structure.

A66. The probe head assembly of paragraph A65, wherein the signal-conveying membrane further includes a plurality of pass-through conductors configured to electrically interconnect each electrically conductive probe in the first subset of the plurality of electrically conductive probes with the corresponding one of the plurality of second lower contact pads.

A67. The probe head assembly of any of paragraphs A64-A66, wherein the probe head assembly further includes an interposer that spatially separates, and electrically interconnects, the signal-conveying membrane and the contacting structure.

B1. A space transformer, comprising:
a space transformer body, including:
  (i) a rigid dielectric body including a upper surface and an opposed planar lower surface;
  (ii) a plurality of electrically conductive contact pads on the planar lower surface;
  (iii) a plurality of electrically conductive attachment points supported by the rigid dielectric body; and
  (iv) a plurality of body electrical conductors supported by the rigid dielectric body, wherein each of the plurality of body electrical conductors extends between a selected one of the plurality of electrically conductive attachment points and a corresponding one of the plurality of electrically conductive contact pads; and
a flex cable assembly including a plurality of ribbon electrical conductors defining a plurality of cable ribbons, wherein each of the plurality of cable ribbons includes a corresponding subset of the plurality of ribbon electrical conductors, wherein the plurality of cable ribbons defines a layered stack of cable ribbons, and further wherein each of the plurality of ribbon electrical conductors includes a body-proximal conductor end, which is operatively attached to a corresponding one of the plurality of electrically conductive attachment points, and a body-distal conductor end.

B2. The space transformer of paragraph B1, wherein the flex cable assembly includes a body-proximal cable end and a body-distal cable end, wherein the body-proximal cable end is proximal the space transformer body relative to the body-distal cable end.

B3. The space transformer of paragraph B2, wherein the flex cable assembly is configured to provide a threshold displacement, or at least the threshold displacement, of the body-proximal cable end relative to the body-distal cable end, via flex of the flex cable assembly, for a given force applied to the space transformer body.

B4. The space transformer of paragraph B3, wherein the threshold displacement is at least one of:
  (i) at least 0.01 millimeter (mm), at least 0.1 mm, at least 1 mm, at least 2 mm, at least 4 mm, at least 5 mm, at least 10 mm, at least 15 mm, at least 20 mm, at least 25 mm, or at least 30 mm; and
  (ii) at most 50 mm, at most 40 mm, at most 30 mm, at most 25 mm, or at most 20 mm.

B5. The space transformer of any of paragraphs B3-B4, wherein the force is at least one of:
  (i) at least 1 Newton (N), at least 2 N, at least 3 N, at least 4 N, at least 5 N, at least 6 N, at least 8 N, or at least 10 N; and
  (ii) at most 1000 N, at most 900 N, at most 800 N, at most 700 N, at most 600 N, at most 500 N, at most 400 N, at most 300 N, at most 200 N, at most 100 N, at most 50 N, at most 20 N, at most 18 N, at most 16 N, at most 14 N, at most 12 N, at most 10 N, at most 8 N, at most 6 N, or at most 4 N.

B6. The space transformer of any of paragraphs B2-B5, wherein the plurality of ribbon electrical conductors of the flex cable assembly together are configured to convey at least a threshold electric current magnitude between the body-proximal cable end and the body-distal cable end.

B7. The space transformer of paragraph B6, wherein the threshold electric current magnitude is at least one of:
  (i) at least 1 milliAmp (mA), at least 50 mA, at least 100 mA, at least 500 mA, at least 1 Amp (A), at least 25 A, at least 50 A, at least 100 A, at least 200 A, at least 300 A, at least 400 A, at least 500 A, at least 600 A, at least 700 A, at least 800 A, at least 900 A, at least 1000 A, or at least 1500 A; and (ii) at most 2500 A, at most 2000 A, at most 1800 A, at most 1600 A, at most 1400 A, at most 1200 A, at most 1000 A, or at most 800 A.

B8. The space transformer of any of paragraphs B1-B7, wherein at least two ribbon electrical conductors of the plurality of ribbon electrical conductors are electrically shorted together, within the space transformer body, such that the at least two ribbon electrical conductors are in electrical communication with a single electrically conductive contact pad of the plurality of electrically conductive contact pads.

B9. The space transformer of any of paragraphs B1-B8, wherein the body-proximal conductor ends of at least two ribbon electrical conductors of the plurality of ribbon electrical conductors are operatively attached to a single electrically conductive attachment point.

B10. The space transformer of any of paragraphs B8-B9, wherein the at least two ribbon electrical conductors extend within the same cable ribbon of the plurality of cable ribbons.

B11. The space transformer of any of paragraphs B8-B10, wherein the at least two ribbon electrical conductors extend within different cable ribbons of the plurality of cable ribbons.

B12. The space transformer of any of paragraphs B1-B11, wherein at least one body electrical conductor of the plurality of body electrical conductors electrically interconnects a given electrically conductive contact pad of the plurality of electrically conductive contact pads with at least two electrically conductive attachment points of the plurality of electrically conductive attachment points.

B13. The space transformer of any of paragraphs B1-B12, wherein a respective air gap extends between each of the plurality of cable ribbons and an adjacent cable ribbon of the plurality of cable ribbons.

B14. The space transformer of paragraph B13, wherein the air gap extends along at least a threshold fraction of a length of the flex cable assembly as measured between a/the body-proximal cable end and a/the body-distal cable end.

B15. The space transformer of paragraph B14, wherein the threshold fraction of the length of the flex cable assembly includes at least 50%, at least 60%, at least 70%, at least 80%, at least 90%, at least 95%, or at least 99% of the length of the flex cable assembly.

B16. The space transformer of any of paragraphs B1-B15, wherein an intermediate portion of each of the plurality of cable ribbons is distinct from an intermediate portion of each other of the plurality of cable ribbons, optionally wherein the intermediate portion extends between a/the body-proximal cable end and a/the body-distal cable end.

B17. The space transformer of any of paragraphs B1-B16, wherein each of the plurality of cable ribbons further includes a respective ribbon insulator that surrounds the corresponding subset of the plurality of ribbon electrical conductors.

B18. The space transformer of paragraph B17, wherein the respective ribbon insulator electrically isolates each ribbon electrical conductor in the corresponding subset of the plurality of ribbon electrical conductors from each other ribbon electrical conductor in the corresponding subset of the plurality of ribbon electrical conductors.

B19. The space transformer of any of paragraphs B17-B18, wherein the respective ribbon insulator electrically isolates the corresponding subset of the plurality of ribbon electrical conductors from a remainder of the plurality of ribbon electrical conductors.

B20. The space transformer of any of paragraphs B17-B19, wherein the ribbon insulator is formed from at least one of a dielectric material, a flexible material, and a polymeric material.

B21. The space transformer of any of paragraphs B1-B20, wherein the flex cable assembly further includes a rigid interface structure that is operatively attached to the plurality of body electrical conductors, optionally wherein the rigid interface structure defines a/the body-distal cable end of the flex cable assembly.

B22. The space transformer of paragraph B21, wherein the rigid interface structure includes a plurality of rigid interface structure layers.

B23. The space transformer of paragraph B22, wherein at least a subset of the plurality of rigid interface structure layers is operatively attached to a corresponding one of the plurality of cable ribbons.

B24. The space transformer of any of paragraphs B22-B23, wherein at least a subset of the plurality of rigid interface structure layers includes a plurality of electrically conductive interface structure attachment points that forms a corresponding plurality of electrical connections with the body-distal conductor end of the corresponding subset of the plurality of ribbon electrical conductors of a given cable ribbon of the plurality of cable ribbons.

B25. The space transformer of any of paragraphs B22-B24, wherein at least a subset of the plurality of rigid interface structure layers includes an interface structure printed circuit board.

B26. The space transformer of any of paragraphs B22-B25, wherein the plurality of rigid interface structure layers is stacked to define the rigid interface structure.

B27. The space transformer of any of paragraphs B22-B26, wherein the plurality of rigid interface layers is operatively attached to one another to define the rigid interface structure.

B28. The space transformer of any of paragraphs B21-B27, wherein the rigid interface structure further includes a plurality of interface structure contact pads, wherein each of the plurality of interface structure contact pads is electrically connected to a corresponding one of the plurality ribbon electrical conductors.

B29. The space transformer of any of paragraphs B1-B28, wherein the space transformer body includes the space transformer assembly of any of paragraphs A1-A57.

B30. The space transformer of paragraph B29, wherein a first subset of the plurality of electrically conductive attachment points is defined by the first rigid space transformer layer.

B31. The space transformer of any of paragraphs B29-B30, wherein a second subset of the plurality of electrically conductive attachment points is defined by the second rigid space transformer layer.

B32. The space transformer of any of paragraphs B1-B31, wherein the rigid dielectric body is formed from an electrically insulating material.

B33. The space transformer of any of paragraphs B1-B32, wherein the rigid dielectric body is formed from a plurality of stacked space transformer layers.

B34. The space transformer of any of paragraphs B1-B33, wherein the plurality of electrically conductive contact pads includes a plurality of metallic contact pads.

B35. The space transformer of any of paragraphs B1-B34, wherein the plurality of electrically conductive contact pads extends from the planar lower surface.

B36. The space transformer of any of paragraphs B1-B35, wherein at least a portion of the plurality of electrically conductive attachment points extends on, or from, the upper surface of the rigid dielectric body.

B37. The space transformer of any of paragraphs B1-B36, wherein the space transformer body further includes at least one edge that extends between the upper surface and the planar lower surface, wherein at least a portion of the plurality of electrically conductive attachment points extends on, or from, the at least one edge.

B38. The space transformer of any of paragraphs B1-B37, wherein the plurality of electrically conductive attachment points includes a plurality of metallic attachment points.

B39. The space transformer of any of paragraphs B1-B38, wherein the plurality of body electrical conductors includes a plurality of metallic body electrical conductors.

B40. The space transformer of any of paragraphs B1-B39, wherein at least a portion of at least a first subset of the plurality of body electrical conductors extends, within the ridged dielectric body, in a direction that is parallel, or at least substantially parallel, to the planar lower surface.

B41. The space transformer of any of paragraphs B1-B40, wherein at least a portion of at least a second subset of the plurality of body electrical conductors extends, within the rigid dielectric body, in direction that is perpendicular, or at least substantially perpendicular, to the planar lower surface.

B42. A probe head assembly for electrically testing a device under test (DUT), the probe head assembly comprising:
  a contacting structure including a plurality of electrically conductive probes, wherein each of the plurality of electrically conductive probes is configured to electrically contact a corresponding contact pad of the DUT, and further wherein the plurality of electrically conductive probes defines an average probe compliance;
  the space transformer of any of paragraphs B1-B41, wherein the contacting structure is operatively attached to the planar lower surface of the space transformer such that each of the plurality of electrically conductive probes is in electrical communication with a corresponding electrically conductive contact pad of the plurality of electrically conductive contact pads;
  a suspension system, wherein the space transformer assembly is operatively attached to the suspension system, and further wherein the suspension system has a suspension system compliance that is greater than the average probe compliance; and
  a flex cable interface electrically connected to the body-distal conductor end of each of the plurality of ribbon electrical conductors, wherein the suspension system is configured to permit motion of the planar lower surface of the space transformer relative to the flex cable interface, and further wherein the flex cable assembly has a flex cable compliance that is at least as large as the suspension system compliance.

B43. The probe head assembly of paragraph B42 when dependent from any of paragraphs B21-B28, wherein the flex cable interface is electrically connected to the body-distal conductor end of each of the plurality of ribbon electrical conductors via the rigid interface structure.

B44. The probe head assembly of any of paragraphs B42-B43, wherein the suspension system compliance is at least one of:
  (i) at least 125%, at least 150%, at least 200%, at least 300%, at least 400%, or at least 500% of the average probe compliance; and
  (ii) at most 5000%, at most 4000%, at most 3000%, at most 2000%, at most 1000%, at most 800%, at most 600%, at most 400%, or at most 200% of the average probe compliance.

B45. The probe head assembly of any of paragraphs B42-B44, wherein the suspension system includes at least one of a spring, a flexure, a resilient material, and a compound flexure spring.

B46. The probe head assembly of any of paragraphs B42-B45, wherein the flex cable compliance is at least one of:
  (i) at least 25%, at least 50%, at least 75%, at least 100%, at least 25%, at least 50%, at least 75%, at least 100%, at least 125%, at least 150%, at least 200%, at least 300%, at least 400%, or at least 500% of the suspension system compliance; and
  (ii) at most 1000%, at most 800%, at most 600%, at most 400%, or at most 200% of the suspension system compliance.

B47. The probe head assembly of any of paragraphs B42-B46, wherein the flex cable compliance permits relative motion between the contacting structure and the flex cable interface.

B48. The probe head assembly of any of paragraphs B42-B47, wherein the probe head assembly further includes a platen, wherein the suspension system is operatively attached to the platen, and further wherein the suspension system is configured to permit motion of the contacting structure and the space transformer body, relative to the platen and via the suspension system compliance, in a direction that is perpendicular, or at least substantially perpendicular, to the planar lower surface of the space transformer.

B49. The probe head assembly of paragraph B48, wherein the suspension system further is configured to resist motion of the contacting structure and the space transformer, relative to the platen and via the suspension system compliance, in a direction that is parallel, or at least substantially parallel, to the planar lower surface of the space transformer.

B50. The probe head assembly of any of paragraphs B48-B49, wherein the flex cable interface is operatively attached to the platen.

C1. A planarization layer for a space transformer, the planarization layer comprising:
  (i) optionally an interposer including an upper interposer surface, an opposed lower interposer surface, a plurality of upper interposer contact pads on the upper interposer surface, a plurality of lower interposer contact pads on the lower interposer surface, and a plurality of interposer electrical conductors extending between the plurality of upper interposer contact pads and the plurality of lower interposer contact pads;
  (ii) a resilient dielectric layer conformally extending across one of (a) a surface and a plurality of contact pads, (b) the lower interposer surface and the plurality of lower interposer contact pads, and (c) a lower surface of a space transformer body of the space transformer and a plurality of space transformer contact pads of the space transformer;
  (iii) a planarized rigid dielectric layer including a planarized lower surface and an upper surface that extends across, and is conformal with, the resilient dielectric layer;
  (iv) a plurality of holes extending from the planarized lower surface, through the planarized rigid dielectric layer and the resilient dielectric layer, to one of (a) respective ones of the contact pads, (b) respective ones of the plurality of lower interposer contact pads, and (c) respective ones of the plurality of space transformer contact pads; and (v) an electrically conductive paste extending within each of the plurality of holes from the planarized lower surface to one of (a) the respective ones of the contact pads, (b) the respective ones of the plurality of lower interposer contact pads, and (c) the respective ones of the plurality of space transformer contact pads, optionally to define a plurality of planarization layer conductors that extends within the plurality of holes.

C2. The planarization layer of paragraph C1, wherein the interposer includes a printed circuit board.

C3. The planarization layer of paragraph C2, wherein the printed circuit board includes a polymeric substrate that defines at least one, and optionally both, the upper interposer surface and the opposed lower interposer surface.

C4. The planarization layer of any of paragraphs C1-C2, wherein the interposer includes a silicon substrate that defines at least one, and optionally both, the upper interposer surface and the opposed lower interposer surface.

C5. The planarization layer of paragraph C4, wherein the silicon substrate includes a plurality of through silicon vias, wherein the plurality of through silicon vias defines the plurality of interposer electrical conductors, optionally wherein the plurality of through silicon vias further defines the plurality of upper interposer contact pads, and further optionally wherein the plurality of through silicon vias further defines the plurality of lower interposer contact pads.

C6. The planarization layer of any of paragraphs C1-05, wherein the interposer includes a ceramic substrate that defines at least one, and optionally both, the upper interposer surface and the opposed lower interposer surface.

C7. The planarization layer of any of paragraphs C1-C6, wherein each of the plurality of upper interposer contact pads is directly opposed to a corresponding one of the plurality of lower interposer contact pads.

C8. The planarization layer of any of paragraphs C1-C7, wherein each of the plurality of interposer electrical conductors extends perpendicular, or at least substantially perpendicular, to the upper interposer surface and to the lower interposer surface.

C9. The planarization layer of any of paragraphs C1-C8, wherein the upper interposer surface is parallel, or at least substantially parallel, to the lower interposer surface.

C10. The planarization layer of any of paragraphs C1-C9, wherein the plurality of upper interposer contact pads projects from the upper interposer surface.

C11. The planarization layer of any of paragraphs C1-C10, wherein the plurality of lower interposer contact pads projects from the lower interposer surface.

C12. The planarization layer of any of paragraphs C1-C11, wherein the upper interposer surface is a planar, or at least substantially planar, upper interposer surface.

C13. The planarization layer of any of paragraphs C1-C12, wherein the lower interposer surface is a planar, or at least substantially planar, lower interposer surface.

C14. The planarization layer of any of paragraphs C1-C13, wherein the resilient dielectric layer includes a resilient dielectric adhesive.

C15. The planarization layer of any of paragraphs C1-C14, wherein a stiffness of the resilient dielectric layer is less than a threshold fraction of a stiffness of the planarized rigid dielectric layer, optionally during fabrication of the planarization layer, and further optionally wherein the stiffness of the resilient dielectric layer is comparable to the stiffness of the planarized rigid dielectric layer subsequent to fabrication of the planarization layer.

C16. The planarization layer of paragraph C15, wherein the threshold fraction is less than 80%, less than 70%, less than 60%, less than 50%, less than 40%, less than 30%, less than 20%, or less than 10% of the stiffness of the planarized rigid dielectric layer.

C17. The planarization layer of any of paragraphs C1-C16, wherein the planarized lower surface of the planarized rigid dielectric layer is planar, or at least substantially planar.

C18. The planarization layer of any of paragraphs C1-C17, wherein the planarized lower surface of the rigid dielectric layer deviates from being planar by a threshold height variation, wherein the threshold height variation is at most 40 micrometers, at most 30 micrometers, at most 20 micrometers, at most 15 micrometers, at most 10 micrometers, at most 8 micrometers, at most 6 micrometers, or at most 4 micrometers.

C19. The planarization layer of any of paragraphs C1-C18, wherein the upper surface of the planarized rigid dielectric layer is nonplanar.

C20. The planarization layer of any of paragraphs C1-C19, wherein the electrically conductive paste includes, or is, at least one of an electrically conductive metal paste, an electrically conductive metal alloy paste, an electrically conductive copper paste, and an electrically conductive copper alloy paste.

C21. A planarized space transforming structure, comprising:

a/the space transformer including an upper space transformer surface, an opposed planar lower space transformer surface, and a/the plurality of space transformer contact pads on the planar lower space transformer surface; and the planarization layer of any of paragraphs C1-C20, wherein at least one of:
(i) the interposer is operatively attached to the lower space transformer surface such that each of the plurality of upper interposer contact pads is in electrical communication with a corresponding one of the plurality of space transformer contact pads; and
(ii) the resilient dielectric layer is operatively attached to the planar lower space transformer surface.

C22. The planarized space transforming structure of paragraph C21, wherein the space transformer includes, and optionally is, the space transformer assembly of any of paragraphs A1-A57 or the space transformer of any of paragraphs B1-B41.

C23. The planarized space transforming structure of any of paragraphs C21-C22, wherein the plurality of space transformer contact pads projects from the planar lower space transformer surface.

C24. The planarized space transforming structure of any of paragraphs C21-C23, wherein the plurality of space transformer contact pads is a plurality of lower space transformer contact pads, and further wherein the space transformer includes a plurality of upper space transformer contact pads on the upper space transformer surface.

C25. The planarized space transforming structure of paragraph C24, wherein an average pitch, or spacing, of the plurality of lower space transformer contact pads is less than a threshold fraction of an average pitch, or spacing, of the plurality of upper space transformer contact pads.

C26. The planarized space transforming structure of any of paragraphs C24-C25, wherein an average distance between each of the plurality of lower space transformer contact pads and a closest other of the plurality of lower space transformer contact pads is less than a threshold fraction of an average distance between each of the plurality of upper space transformer contact pads and a closest other of the plurality of upper space transformer contact pads.

C27. The planarized space transforming structure of any of paragraphs C25-C26, wherein the threshold fraction is at least one of:
(i) at least 1%, at least 5%, at least 10%, at least 20%, or at least 25% of the average pitch, or spacing, of the plurality of upper space transformer contact pads; and
(ii) at most 400%, at most 300%, at most 200%, at most 100%, at most 50%, at most 40%, at most 30%, at most 20%, at most 10%, at most 5%, at most 1%, or at most 0.1% of the average pitch, or spacing, of the plurality of upper space transformer contact pads.

C28. The planarized space transforming structure of any of paragraphs C24-C27, wherein the space transformer further includes a plurality of space transformer electrical conductors extending between the plurality of upper space transformer contact pads and the plurality of lower space transformer contact pads.

C29. The planarized space transforming structure of any of paragraphs C21-C28, wherein the planarization layer further includes an adhesive layer extending across the planarized lower surface of the planarized rigid dielectric layer.

C30. The planarized space transforming structure of paragraph C29, wherein the plurality of holes extends through the adhesive layer.

C31. The planarized space transforming structure of paragraph C30, wherein the adhesive layer includes a lower adhesive layer surface and an opposed upper adhesive layer surface, which is in contact with the planarized lower surface of the planarized rigid dielectric layer, wherein the electrically conductive paste extends, within each of the plurality of holes, from the lower adhesive layer surface to the respective ones of the plurality of lower interposer contact pads.

C32. The planarized space transforming structure of any of paragraphs C30-C31, wherein the electrically conductive paste further projects from each of the plurality of holes and past the lower adhesive layer surface.

C33. The planarized space transforming structure of any of paragraphs C29-C32, wherein the adhesive layer is at least one of a dielectric adhesive layer, an electrically insulating adhesive layer, and a polymeric adhesive layer.

C34. A probe head assembly for electrically testing a device under test (DUT), the probe head assembly comprising:
a contacting structure including a plurality of electrically conductive probes, wherein each of the plurality of electrically conductive probes is configured to electrically contact a corresponding contact pad of the DUT; and
the planarized space transforming structure of any of paragraphs C21-C33, wherein the contacting structure is operatively attached to the planarized lower surface of the planarized rigid dielectric layer such that each electrically conductive probe in at least a subset of the plurality of electrically conductive probes is in electrical communication with a corresponding one of the plurality of planarization layer conductors.

C35. The probe head assembly of paragraph C34, wherein the probe head assembly further includes a suspension system, wherein the planarized space transforming structure is operatively attached to the suspension system, wherein the plurality of electrically conductive probes defines an average probe compliance, and further wherein the suspension system has a suspension system compliance that is greater than the average probe compliance.

C36. The probe head assembly of paragraph C35, wherein the suspension system compliance is at least one of:
(iii) at least 125%, at least 150%, at least 200%, at least 300%, at least 400%, or at least 500% of the average probe compliance; and
(iv) at most 5000%, at most 4000%, at most 3000%, at most 2000%, at most 1000%, at most 800%, at most 600%, at most 400%, or at most 200% of the average probe compliance.

C37. The probe head assembly of any of paragraphs C35-C36, wherein the suspension system includes at least one of a spring, a flexure, a resilient material, and a compound flexure spring.

C38. The probe head assembly of any of paragraphs C35-C37, wherein the probe head assembly further includes a platen, wherein the suspension system is operatively attached to the platen, and further wherein the suspension system is configured to permit motion of the contacting structure and the planarized space transforming structure, relative to the platen and via the suspension system compliance, in a direction that is perpendicular, or at least substantially perpendicular, to the planarized lower surface of the planarized space transforming structure.

C39. The probe head assembly of paragraph C38, wherein the suspension system further is configured to resist motion of the contacting structure and the space transformer assembly, relative to the platen and via the suspension system compliance, in a direction that is parallel, or at least substantially parallel, to the planarized lower surface of the planarized space transforming structure.

C40. The probe head assembly of any of paragraphs C34-C39, wherein the probe head assembly further includes a signal-conveying membrane including a dielectric membrane and a plurality of signal-conveying traces, wherein the subset of the plurality of electrically conductive probes is a first subset of the plurality of electrically conductive probes, and further wherein each of the plurality of signal-conveying traces is in electrical communication with a corresponding one of a second subset of the plurality of electrically conductive probes.

C41. The probe head assembly of paragraph C40, wherein the signal-conveying membrane separates at least a portion of the planarized space transforming structure from at least a portion of the contacting structure.

C42. The probe head assembly of paragraph C41, wherein the signal-conveying membrane further includes a plurality of pass-through conductors configured to electrically interconnect each electrically conductive probe in the first subset of the plurality of electrically conductive probes with the corresponding one of the plurality of planarization layer conductors.

C43. The probe head assembly of any of paragraphs C40-C42, wherein the signal-conveying membrane is adhered to the planarized lower surface of the planarized rigid dielectric layer by an/the adhesive layer.

C44. The probe head assembly of any of paragraphs C40-C43, wherein the electrically conductive paste is, includes, or is instead, at least one of a sintered electrically conductive paste, a sintered metal, and a sintered metal alloy.

C45. The probe head assembly of any of paragraphs C40-C44, wherein the interposer is a first interposer, and further wherein the probe head assembly includes a second interposer that spatially separates, and electrically interconnects, the signal-conveying membrane and the contacting structure.

D1. A probe head assembly for electrically testing a device under test (DUT), the probe head assembly comprising:
a contacting structure including a plurality of electrically conductive probes, wherein each of the plurality of electrically conductive probes is configured to electrically contact a corresponding contact pad of the DUT, and further wherein the plurality of electrically conductive probes defines an average probe compliance;
a space transformer including an upper surface and an opposed lower surface, wherein the contacting structure is operatively attached to the lower surface of the space transformer;
a suspension system, wherein the space transformer is operatively attached to the suspension system, and further wherein the suspension system has a suspension system compliance that is greater than the average probe compliance;
a platen, wherein the suspension system is operatively attached to the platen such that the suspension system compliance permits relative motion between the space transformer and the platen;
a printed circuit board that is operatively attached to the platen such that the suspension system compliance permits relative motion between the space transformer and the printed circuit board;
a first plurality of signal conductors configured to convey a first plurality of signals, external to the space transformer, between a first subset of the plurality of electrically conductive probes and the printed circuit board; and
a second plurality of signal conductors configured to convey a second plurality of signals, via the space transformer, between a second subset of the plurality of electrically conductive probes and the printed circuit board.

D2. The probe head assembly of paragraph D1, wherein the space transformer includes a plurality of upper contact pads on the upper surface, a plurality of lower contact pads on the lower surface, and a plurality of space transformer electrical conductors extending between and electrically interconnecting the plurality of upper contact pads and the plurality of lower contact pads.

D3. The probe head assembly of paragraph D2, wherein each of the second plurality of signal conductors is operatively attached to, and in electrical communication with, a corresponding one of the plurality of upper contact pads.

D4. The probe head assembly of any of paragraphs D2-D3, wherein each of the second subset of the plurality of electrically conductive probes is in electrical communication with a corresponding one of the plurality of lower contact pads.

D5. The probe head assembly of any of paragraphs D1-D4, wherein an average pitch, or spacing, of the plurality of lower contact pads is less than a threshold fraction of an average pitch, or spacing, of the plurality of upper contact pads.

D6. The probe head assembly of any of paragraphs D1-D5, wherein an average distance between each of the plurality of lower contact pads and a closest other of the plurality of lower contact pads is less than a/the threshold fraction of an average distance between each of the plurality of upper contact pads and a closest other of the plurality of upper contact pads.

D7. The probe head assembly of any of paragraphs D1-D6, wherein an average pitch, or spacing, of the plurality of upper contact pads is less than a/the threshold fraction of an average pitch, or spacing, of the plurality of lower contact pads.

D8. The probe head assembly of any of paragraphs D1-D7, wherein an average distance between each of the plurality of upper contact pads and a closest other of the plurality of upper contact pads is less than a/the threshold fraction of an average distance between each of the plurality of lower contact pads and a closest other of the plurality of lower contact pads.

D9. The probe head assembly of any of paragraphs D5-D8, wherein the threshold fraction is at least one of:
(i) at least 0.001%, at least 0.01%, at least 0.1%, at least 1%, at least 5%, at least 10%, at least 20%, or at least 25% of the average pitch, or spacing, of the plurality of upper contact pads; and
(ii) at most 50%, at most 40%, at most 30%, at most 20%, at most 10%, at most 5%, at most 1%, or at most 0.1% of the average pitch, or spacing, of the plurality of upper contact pads.

D10. The probe head assembly of any of paragraphs D1-D9, wherein the suspension system compliance is at least one of:
(iii) at least 125%, at least 150%, at least 200%, at least 300%, at least 400%, or at least 500% of the average probe compliance; and
(iv) at most 5000%, at most 4000%, at most 3000%, at most 2000%, at most 1000%, at most 800%, at most 600%, at most 400%, or at most 200% of the average probe compliance.

D11. The probe head assembly of any of paragraphs D1-D10, wherein the suspension system includes at least one of a spring, a flexure, a resilient material, and a compound flexure spring.

D12. The probe head assembly of any of paragraphs D1-D11, wherein the suspension system further is configured to resist motion of the contacting structure and the space transformer, relative to the platen and via the suspension system compliance, in a direction that is parallel, or at least substantially parallel, to the lower surface of the space transformer.

D13. The probe head assembly of any of paragraphs D1-D12, wherein the platen is a rigid, or at least substantially rigid, platen.

D14. The probe head assembly of any of paragraphs D1-D13, wherein the printed circuit board is electrically isolated from the platen.

D15. The probe head assembly of any of paragraphs D1-D14, wherein the printed circuit board includes a first electrical interface that is operatively attached to, and in electrical communication with, the first plurality of signal conductors.

D16. The probe head assembly of any of paragraphs D1-D15, wherein the printed circuit board includes a second electrical interface that is operatively attached to, and in electrical communication with, the second plurality of signal conductors.

D17. The probe head assembly of any of paragraphs D1-D16, wherein the first subset of the plurality of electrically conductive probes is in electrical communication with the first plurality of signal conductors.

D18. The probe head assembly of any of paragraphs D1-D17, wherein the probe head assembly further includes a first dielectric membrane, wherein the first plurality of signal conductors extends within the first dielectric membrane, and further wherein the first plurality of signal conductors and the first dielectric membrane together define a first signal-conveying membrane.

D19. The probe head assembly of paragraph D18, wherein the first signal-conveying membrane extends between and spatially separates at least a portion of the space transformer from at least a portion of the contacting structure.

D20. The probe head assembly of any of paragraphs D18-D19, wherein the first signal-conveying membrane further includes a plurality of pass-through conductors, wherein the plurality of pass-through conductors extends between, and electrically interconnects, a/the plurality of lower contact pads of the space transformer and the second subset of the plurality of electrically conductive probes.

D21. The probe head assembly of any of paragraphs D1-D20, wherein the probe head assembly further includes a first ribbon insulator, wherein at least a subset of the first plurality of signal conductors extends within the first ribbon insulator, and further wherein the first plurality of signal conductors and the first ribbon insulator together define a first cable ribbon.

D22. The probe head assembly of paragraph D21, wherein the first ribbon cable extends between and spatially separates at least a portion of the space transformer from at least a portion of the contacting structure.

D23. The probe head assembly of any of paragraphs D21-D22, wherein the first ribbon cable further includes a plurality of pass-through conductors, wherein the plurality of pass-through conductors extends between, and electrically interconnects, a/the plurality of lower contact pads of the space transformer and the second subset of the plurality of electrically conductive probes.

D24. The probe head assembly of any of paragraphs D21-D23, wherein the probe head assembly includes a plurality of first ribbon insulators, and further wherein a corresponding subset of each of the first plurality of signal conductors extends within each of the plurality of first ribbon insulators to define a plurality of first cable ribbons.

D25. The probe head assembly of paragraph D24, wherein the plurality of first cable ribbons defines a first layered stack of cable ribbons.

D26. The probe head assembly of any of paragraphs D1-D25, wherein the second subset of the plurality of electrically conductive probes is in electrical communication with the second plurality of signal conductors via the space transformer.

D27. The probe head assembly of any of paragraphs D1-D26, wherein the probe head assembly further includes a second dielectric membrane, wherein the second plurality of signal conductors extends within the second dielectric membrane, and further wherein the second plurality of signal conductors and the second dielectric membrane together define a second signal-conveying membrane.

D28. The probe head assembly of paragraph D27, wherein each of the second subset of the plurality of electrically conductive probes is operatively attached to, and in electrical communication with, a corresponding one of a/the plurality of upper contact pads of the space transformer.

D29. The probe head assembly of any of paragraphs D1-D28, wherein the probe head assembly further includes a second ribbon insulator, wherein at least a subset of the second plurality of signal conductors extends within the second ribbon insulator, and further wherein the second plurality of signal conductors and the second ribbon insulator together define a second cable ribbon.

D30. The probe head assembly of paragraph D29, wherein the probe head assembly includes a plurality of second ribbon insulators, and further wherein a corresponding subset of each of the second plurality of signal conductors extends within each of the plurality of second ribbon insulators to define a plurality of second cable ribbons.

D31. The probe head assembly of paragraph D30, wherein the plurality of second cable ribbons defines a second layered stack of cable ribbons.

D32. The probe head assembly of any of paragraphs D1-D31, wherein at least one characteristic of the first plurality of signal conductors is selected based upon at least one characteristic of the first plurality of signals, and further wherein at least one characteristic of the second plurality of signal conductors is selected based upon at least one characteristic of the second plurality of signals.

D33. The probe head assembly of any of paragraphs D1-D32, wherein an average electrical conductivity of the first plurality of signal conductors differs from an average electrical conductivity of the second plurality of signal conductors.

D34. The probe head assembly of any of paragraphs D1-D33, wherein an/the average electrical conductivity of the first plurality of signal conductors is a threshold conductivity fraction of an/the average electrical conductivity of the second plurality of signal conductors.

D35. The probe head assembly of paragraph D34, wherein the threshold conductivity fraction is less than 50%, less than 40%, less than 30%, less than 20%, less than 10%, less than 5%, or less than 1% of the average electrical conductivity of the second plurality of signal conductors.

D36. The probe head assembly of any of paragraphs D1-D35, wherein an average electric magnitude current of the first plurality of signals is a threshold current fraction of an average electric current magnitude of the second plurality of signals.

D37. The probe head assembly of paragraph D36, wherein the threshold current fraction is less than 50%, less than 40%, less than 30%, less than 20%, less than 10%, less than 5%, or less than 1% of the average electric current magnitude of the second plurality of signals.

D38. The probe head assembly of any of paragraphs D1-D37, wherein the first plurality of signals includes at least one of a plurality of data signals, a plurality of low current signals, a plurality of high frequency signals, a plurality of radio frequency (RF) signals, a plurality of digital signals, and a plurality of alternating current signals.

D39. The probe head assembly of any of paragraphs D1-D38, wherein the second plurality of signals includes at least one of a plurality of high current signals, a plurality of power signals, and a plurality of direct current signals.

D40. The probe head assembly of any of paragraphs D1-D39, wherein the probe head assembly further includes an interposer that spatially separates the space transformer and the contacting structure, wherein the interposer electrically interconnects the first plurality of signal conductors with the first subset of the plurality of electrically conductive probes, and further wherein the interposer electrically interconnects the second plurality of signal conductors with the second subset of the plurality of electrically conductive probes.

E1. A probe system for testing a device under test (DUT), the probe system comprising:
 a chuck defining a support surface configured to support a substrate that includes the DUT;

a signal generation and analysis system configured to at least one of generate a test signal and receive a resultant signal; and the probe head assembly, wherein the probe head assembly includes any suitable component of any of the probe head assemblies of any of paragraphs A58-A67, B42-B50, C34-C45, or D1-D42, wherein the probe head assembly is configured to at least one of:
- (i) receive the test signal from the signal generation and analysis system;
- (ii) provide the test signal to the DUT;
- (iii) receive the resultant signal from the DUT; and
- (iv) provide the resultant signal to the signal generation and analysis system.

E2. The probe system of paragraph E1, wherein the probe system further includes an enclosure that defines an enclosed volume, wherein the support surface extends within the enclosed volume.

E3. The probe system of any of paragraphs E1-E2, wherein the substrate includes a semiconductor wafer, and further wherein the support surface is configured to support the semiconductor wafer, optionally wherein the probe system includes the substrate.

E4. The probe system of paragraph E3, wherein the substrate includes a plurality of distinct DUTs.

E5. The probe system of any of paragraphs E1-E4, wherein the probe system further includes a translation stage configured to operatively translate the support surface relative to the probe head assembly in at least one, optionally at least two, and further optionally all three of:
- (i) a first direction that is parallel, or at least substantially parallel, to the support surface;
- (ii) a second direction that is parallel, or at least substantially parallel, to the support surface and perpendicular, or at least substantially perpendicular, to the first direction; and
- (iii) a third direction that is perpendicular, or at least substantially perpendicular, to the support surface.

E6. The probe system of any of paragraphs E1-E5, wherein the chuck includes a temperature-controlled chuck.

E7. The probe system of any of paragraphs E1-E6, wherein the test signal includes at least one of an electric test signal, an electric current test signal, an electric voltage test signal, an analog test signal, a digital test signal, a direct current test signal, an alternating current test signal, a high frequency test signal, and a radio frequency (RF) test signal.

E8. The probe system of any of any of paragraphs E1-E7, wherein the contacting structure includes:
- (i) a dielectric support defining an upper support surface and an opposed lower support surface; and
- (ii) the plurality of electrically conductive probes extending between the upper support surface and the lower support surface, wherein each of the plurality of electrically conductive probes includes a probe contact on the upper support surface and a probe tip that projects from the lower support surface.

E9. The probe system of paragraph E8, wherein the plurality of electrically conductive probes includes a plurality of rocking beam probes.

INDUSTRIAL APPLICABILITY

The probe systems disclosed herein are applicable to the semiconductor manufacturing and test industries.

It is believed that the disclosure set forth above encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions and/or properties disclosed herein. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower, or equal in scope to the original claims, are also regarded as included within the subject matter of the inventions of the present disclosure.

The invention claimed is:

1. A probe head assembly for electrically testing a device under test (DUT), the probe head assembly comprising:
- a contacting structure including a plurality of electrically conductive probes, wherein each of the plurality of electrically conductive probes is configured to electrically contact a corresponding contact pad of the DUT; and
- a space transformer assembly, including:
  - (i) a first rigid space transformer layer including:
    - a. a planar first layer upper surface;
    - b. a planar first layer lower surface that is opposed to the first layer upper surface;
    - c. a plurality of first upper contact pads on the first layer upper surface;
    - d. a plurality of first lower contact pads on the first layer lower surface; and
    - e. a plurality of first electrical conductors oriented to conduct a plurality of electric currents between the plurality of first upper contact pads and the plurality of first lower contact pads;
  - (ii) a second rigid space transformer layer including:
    - a. a planar second layer upper surface that faces toward the first layer lower surface;
    - b. a planar second layer lower surface that is opposed to the second layer upper surface;
    - c. a plurality of second upper contact pads on the second layer upper surface, wherein each of the plurality of first lower contact pads is opposed to a corresponding one of the plurality of second upper contact pads;
    - d. a plurality of second lower contact pads on the second layer lower surface; and
    - e. a plurality of second electrical conductors oriented to conduct the plurality of electric currents between the plurality of second upper contact pads and a plurality of second lower contact pads; and
  - (i) an attachment layer that extends between the first rigid space transformer layer and the second rigid space transformer layer, operatively attaches the first rigid space transformer layer to the second rigid space transformer layer, and electrically interconnects the first rigid space transformer layer and the second rigid space transformer layer;

wherein the contacting structure is operatively attached to the planar second layer lower surface of the space transformer assembly such that each electrically conductive probe in at least a subset of the plurality of electrically conductive probes is in electrical communication with a corresponding one of the plurality of second lower contact pads.

2. The probe head assembly of claim 1, wherein the probe head assembly further includes a suspension system, wherein the space transformer assembly is operatively attached to the suspension system, wherein the plurality of electrically conductive probes defines an average probe compliance, and further wherein the suspension system has a suspension system compliance that is greater than the average probe compliance.

3. The probe head assembly of claim 2, wherein the suspension system compliance is at least 200% of the average probe compliance.

4. The probe head assembly of claim 2, wherein the probe head assembly further includes a platen, wherein the suspension system is operatively attached to the platen, and further wherein the suspension system is configured to permit motion of the contacting structure and the space transformer assembly, relative to the platen and via the suspension system compliance, in a direction that is at least substantially perpendicular to the planar second layer lower surface of the space transformer assembly and to resist motion of the contacting structure and the space transformer assembly, relative to the platen and via the suspension system compliance, in a direction that is at least substantially parallel to the planar second layer lower surface of the space transformer assembly.

5. The probe head assembly of claim 1, wherein the probe head assembly further includes a signal-conveying membrane including a dielectric membrane and a plurality of signal-conveying traces, wherein the subset of the plurality of electrically conductive probes is a first subset of the plurality of electrically conductive probes, and further wherein each of the plurality of signal-conveying traces is in electrical communication with a corresponding one of a second subset of the plurality of electrically conductive probes.

6. The probe head assembly of claim 5, wherein the signal-conveying membrane separates at least a portion of the space transformer assembly from at least a portion of the contacting structure.

7. The probe head assembly of claim 5, wherein the signal-conveying membrane further includes a plurality of pass-through conductors configured to electrically interconnect each electrically conductive probe in the first subset of the plurality of electrically conductive probes with the corresponding one of the plurality of second lower contact pads.

8. The probe head assembly of claim 1, wherein the first rigid space transformer layer is a first subassembly of the space transformer assembly, and further wherein the second rigid space transformer layer is a second subassembly of the space transformer assembly.

9. The probe head assembly of claim 1, wherein at least one of the first rigid space transformer layer and the second rigid space transformer layer is configured to convey a direct current power signal therethrough, and further wherein the other of the first rigid space transformer layer and the second rigid space transformer layer is configured to convey an alternating current data signal therethrough.

10. A probe system for testing a device under test (DUT), the probe system comprising:
  a chuck defining a support surface configured to support a substrate that includes the DUT;
  a signal generation and analysis system configured to at least one of generate a test signal and receive a resultant signal; and
  the probe head assembly of claim 1, wherein the probe head assembly is configured to at least one of:
    (i) receive the test signal from the signal generation and analysis system;
    (ii) provide the test signal to the DUT;
    (iii) receive the resultant signal from the DUT; and
    (iv) provide the resultant signal to the signal generation and analysis system.

11. A probe head assembly for electrically testing a device under test (DUT), the probe head assembly comprising:
  a contacting structure including a plurality of electrically conductive probes, wherein each of the plurality of electrically conductive probes is configured to electrically contact a corresponding contact pad of the DUT;
  a space transformer, including:
    (i) a space transformer body, including a rigid dielectric body including an upper surface and an opposed planar lower surface, a plurality of electrically conductive contact pads on the planar lower surface, a plurality of electrically conductive attachment points supported by the rigid dielectric body, and a plurality of body electrical conductors supported by the rigid dielectric body, wherein each of the plurality of body electrical conductors extends between a selected one of the plurality of electrically conductive attachment points and a corresponding one of the plurality of electrically conductive contact pads; and
    (ii) a flex cable assembly including a plurality of ribbon electrical conductors defining a plurality of cable ribbons, wherein each of the plurality of cable ribbons includes a corresponding subset of the plurality of ribbon electrical conductors, wherein the plurality of cable ribbons defines a layered stack of cable ribbons, and further wherein each of the plurality of ribbon electrical conductors includes a body-proximal conductor end, which is operatively attached to a corresponding one of the plurality of electrically conductive attachment points, and a body-distal conductor end;
  wherein the contacting structure is operatively attached to the planar lower surface of the space transformer such that each of the plurality of electrically conductive probes is in electrical communication with a corresponding electrically conductive contact pad of the plurality of electrically conductive contact pads;
  a suspension system, wherein the space transformer assembly is operatively attached to the suspension system, and further wherein the suspension system has a suspension system compliance; and
  a flex cable interface electrically connected to the body-distal conductor end of each of the plurality of ribbon electrical conductors, wherein the suspension system is configured to permit motion of the planar lower surface of the space transformer relative to the flex cable interface, and further wherein the flex cable assembly has a flex cable compliance that is at least as large as the suspension system compliance.

12. The probe head assembly of claim 11, wherein the probe head assembly further includes a platen, wherein the suspension system is operatively attached to the platen, and further wherein the suspension system is configured to permit motion of the contacting structure and the space transformer body, relative to the platen and via the suspension system compliance, in a direction that is at least substantially perpendicular to the planar lower surface of the space transformer and to resist motion of the contacting structure and the space transformer, relative to the platen and via the suspension system compliance, in a direction that is at least substantially parallel to the planar lower surface of the space transformer.

13. The probe head assembly of claim 12, wherein the flex cable interface is operatively attached to the platen.

14. The probe head assembly of claim 11, wherein the plurality of ribbon electrical conductors of the flex cable assembly together are configured to convey at least a threshold electric current magnitude of at least 100 amps between a body-proximal cable end and a body-distal cable end.

15. The probe head assembly of claim 11, wherein a respective air gap extends between each of the plurality of cable ribbons and an adjacent cable ribbon of the plurality of cable ribbons.

16. The probe head assembly of claim 11, wherein each of the plurality of cable ribbons further includes a respective ribbon insulator that surrounds the corresponding subset of the plurality of ribbon electrical conductors.

17. The probe head assembly of claim 11, wherein the flex cable assembly further includes a rigid interface structure that is operatively attached to the plurality of body electrical conductors and electrically interconnects the plurality of body electrical conductors and the flex cable interface.

18. A probe system for testing a device under test (DUT), the probe system comprising:
 a chuck defining a support surface configured to support a substrate that includes the DUT;
 a signal generation and analysis system configured to at least one of generate a test signal and receive a resultant signal; and
 the probe head assembly of claim 11, wherein the probe head assembly is configured to at least one of:
  (i) receive the test signal from the signal generation and analysis system;
  (ii) provide the test signal to the DUT;
  (iii) receive the resultant signal from the DUT; and
  (iv) provide the resultant signal to the signal generation and analysis system.

19. A probe head assembly for electrically testing a device under test (DUT), the probe head assembly comprising:
 a contacting structure including a plurality of electrically conductive probes, wherein each of the plurality of electrically conductive probes is configured to electrically contact a corresponding contact pad of the DUT;
 a space transformer including an upper space transformer surface, an opposed planar lower space transformer surface, and a plurality of space transformer contact pads on the planar lower space transformer surface; and
 a planarization layer including:
  (i) an interposer including an upper interposer surface, an opposed lower interposer surface, a plurality of upper interposer contact pads on the upper interposer surface, a plurality of lower interposer contact pads on the lower interposer surface, and a plurality of interposer electrical conductors extending between the plurality of upper interposer contact pads and the plurality of lower interposer contact pads;
  (ii) a resilient dielectric layer conformally extending across the lower interposer surface and the plurality of lower interposer contact pads;
  (iii) a planarized rigid dielectric layer including a planarized lower surface and an upper surface that extends across, and is conformal with, the resilient dielectric layer;
  (iv) a plurality of holes extending from the planarized lower surface, through the planarized rigid dielectric layer and the resilient dielectric layer, to respective ones of the plurality of lower interposer contact pads; and
  (v) a sintered metal extending within each of the plurality of holes from the planarized lower surface to the respective ones of the plurality of lower interposer contact pads to define a plurality of planarization layer conductors that extends within the plurality of holes;
 wherein the interposer is operatively attached to the lower space transformer surface such that each of the plurality of upper interposer contact pads is in electrical communication with a corresponding one of the plurality of space transformer contact pads; and
 wherein the contacting structure is operatively attached to the planarized lower surface of the planarized rigid dielectric layer such that each electrically conductive probe in at least a subset of the plurality of electrically conductive probes is in electrical communication with a corresponding one of the plurality of planarization layer conductors.

20. A probe head assembly for electrically testing a device under test (DUT), the probe head assembly comprising:
 a contacting structure including a plurality of electrically conductive probes, wherein each of the plurality of electrically conductive probes is configured to electrically contact a corresponding contact pad of the DUT, and further wherein the plurality of electrically conductive probes defines an average probe compliance;
 a space transformer including an upper surface and an opposed lower surface, wherein the contacting structure is operatively attached to the lower surface of the space transformer;
 a suspension system, wherein the space transformer is operatively attached to the suspension system, and further wherein the suspension system has a suspension system compliance that is greater than the average probe compliance;
 a platen, wherein the suspension system is operatively attached to the platen such that the suspension system compliance permits relative motion between the space transformer and the platen;
 a printed circuit board that is operatively attached to the platen such that the suspension system compliance permits relative motion between the space transformer and the printed circuit board;
 a first plurality of signal conductors configured to convey a first plurality of signals, external to the space transformer, between a first subset of the plurality of electrically conductive probes and the printed circuit board; and
 a second plurality of signal conductors configured to convey a second plurality of signals, via the space transformer, between a second subset of the plurality of electrically conductive probes and the printed circuit board.

* * * * *